US011107929B2

(12) United States Patent
Yamazaki et al.

(10) Patent No.: US 11,107,929 B2
(45) Date of Patent: Aug. 31, 2021

(54) SEMICONDUCTOR DEVICE

(71) Applicant: Semiconductor Energy Laboratory Co., Ltd., Atsugi (JP)

(72) Inventors: Shunpei Yamazaki, Setagaya (JP); Tsutomu Murakawa, Isehara (JP); Hideomi Suzawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/690,891

(22) Filed: Nov. 21, 2019

(65) Prior Publication Data

US 2020/0203533 A1   Jun. 25, 2020

(30) Foreign Application Priority Data

Dec. 21, 2018   (JP) .............................. JP2018-239693

(51) Int. Cl.
*H01L 27/00*  (2006.01)
*H01L 29/00*  (2006.01)
(Continued)

(52) U.S. Cl.
CPC .... *H01L 29/7869* (2013.01); *H01L 29/41733* (2013.01)

(58) Field of Classification Search
CPC ............. H01L 27/1225; H01L 27/1248; H01L 27/3262; H01L 27/1222; H01L 27/124;
(Continued)

(56) References Cited

U.S. PATENT DOCUMENTS 7,791,072 B2   9/2010   Kumomi et al.
8,547,771 B2   10/2013  Koyama
(Continued)

FOREIGN PATENT DOCUMENTS

| JP | 2007-096055 A | 4/2007 |
| JP | 2011-151383 A | 8/2011 |
| JP | 2012-257187 A | 12/2012 |

OTHER PUBLICATIONS

Chatterjee.A et al., "Sub-100nm Gate Length Metal Gate NMOS Transistors Fabricated by a Replacement Gate Process", IEDM 97: Technical Digest of International Electron Devices Meeting, Dec. 7, 1997, pp. 821-824.

(Continued)

*Primary Examiner* — Nikolay K Yushin
(74) *Attorney, Agent, or Firm* — Robinson Intellectual Property Law Office; Eric J. Robinson

(57) ABSTRACT

A semiconductor device having favorable electrical characteristics is provided. The semiconductor device includes a first insulator, a second insulator over the first insulator, a third insulator over the second insulator, a fourth insulator and a first conductor over the third insulator, a fifth insulator over the fourth insulator and the first conductor, a first oxide over the fifth insulator, a second conductor and a third conductor over the first oxide, a second oxide over the first oxide and between the second conductor and the third conductor, a sixth insulator over the second oxide, and a fourth conductor over the sixth insulator. The hydrogen concentration of the second insulator is lower than that of the first insulator. The hydrogen concentration of the third insulator is lower than that of the second insulator.

9 Claims, 40 Drawing Sheets

(51) Int. Cl.
*H01L 29/786* (2006.01)
*H01L 29/417* (2006.01)

(58) Field of Classification Search
CPC .......... H01L 29/7869; H01L 29/78648; H01L 29/41733
See application file for complete search history.

(56) References Cited

U.S. PATENT DOCUMENTS

| | | | |
|---|---|---|---|
| 8,878,288 B2 | 11/2014 | Isobe et al. | |
| 8,932,913 B2 | 1/2015 | Sasagawa et al. | |
| 8,946,812 B2 | 2/2015 | Ishizuka et al. | |
| 9,059,219 B2* | 6/2015 | Sasagawa | H01L 29/78696 |
| 10,050,152 B2* | 8/2018 | Yamazaki | H01L 29/78648 |
| 2006/0113536 A1 | 6/2006 | Kumomi et al. | |
| 2007/0072439 A1 | 3/2007 | Akimoto et al. | |
| 2007/0108446 A1 | 5/2007 | Akimoto | |
| 2007/0187760 A1 | 8/2007 | Furuta et al. | |
| 2012/0187475 A1 | 7/2012 | Yamazaki et al. | |
| 2012/0199842 A1 | 8/2012 | Takemura | |
| 2012/0223310 A1 | 9/2012 | Noda et al. | |
| 2013/0009146 A1 | 1/2013 | Nomura et al. | |
| 2014/0004656 A1* | 1/2014 | Sasagawa | H01L 29/66742 438/104 |
| 2014/0034946 A1 | 2/2014 | Yamazaki et al. | |
| 2014/0138674 A1 | 5/2014 | Sato et al. | |
| 2014/0291674 A1 | 10/2014 | Kurata et al. | |
| 2014/0339544 A1 | 11/2014 | Hanaoka et al. | |
| 2014/0339548 A1 | 11/2014 | Yamazaki et al. | |
| 2014/0339549 A1 | 11/2014 | Yamazaki et al. | |
| 2015/0270402 A1 | 9/2015 | Endo et al. | |
| 2015/0280013 A1 | 10/2015 | Yamazaki et al. | |
| 2015/0372009 A1 | 12/2015 | Yamazaki | |
| 2016/0218219 A1 | 7/2016 | Asami et al. | |
| 2016/0293766 A1 | 10/2016 | Kurata et al. | |
| 2017/0179293 A1* | 6/2017 | Yamazaki | H01L 29/78696 |
| 2017/0236848 A1 | 8/2017 | Yamazaki | |
| 2018/0019343 A1 | 1/2018 | Asami | |

OTHER PUBLICATIONS

Yagishita.A et al., "High Performance Damascene Metal Gate MOSFET's for 0.1 $\mu$m Regime", IEEE Transactions on Electron Devices, May 1, 2000, vol. 47, No. 5, pp. 1028-1034.

Hisamoto.D et al., "FinFET.A Self-Aligned Double-Gate MOSFET Scalable to 20 nm", IEEE Transactions on Electron Devices, Dec. 1, 2000, vol. 47, No. 12, pp. 2320-2325.

Kunitake.H et al., "High thermal tolerance of 25-nm c-axis aligned crystalline In—Ga—Zn oxide FET", IEDM 18: Technical Digest of International Electron Devices Meeting, Dec. 1, 2018, pp. 312-315.

* cited by examiner

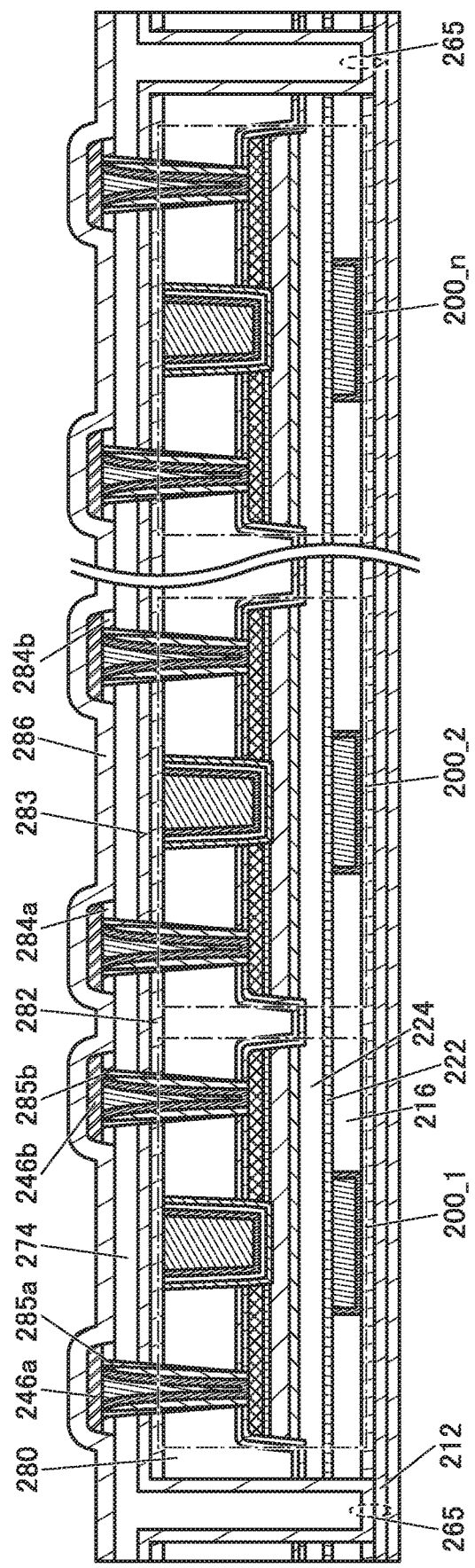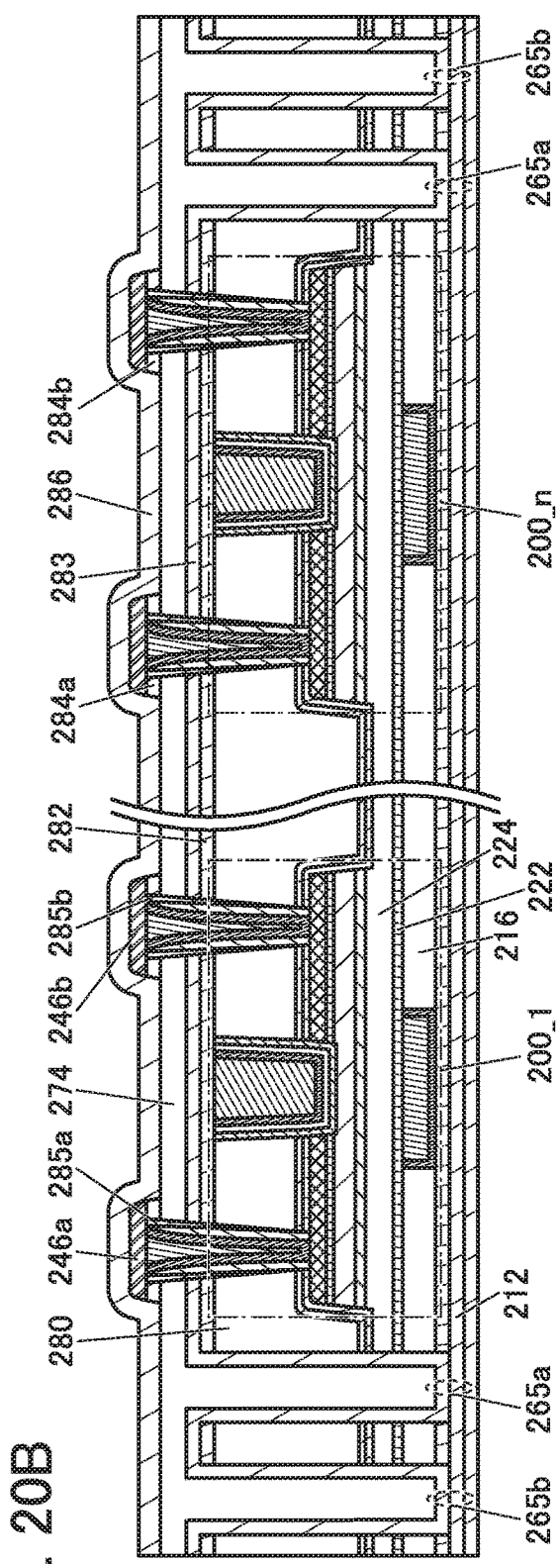

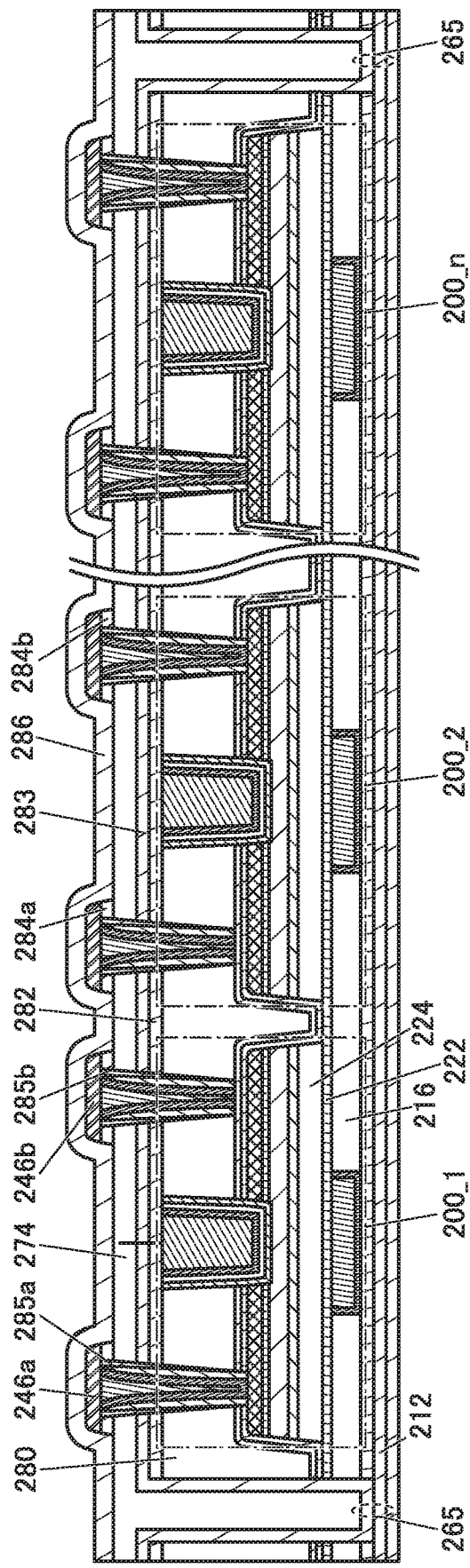
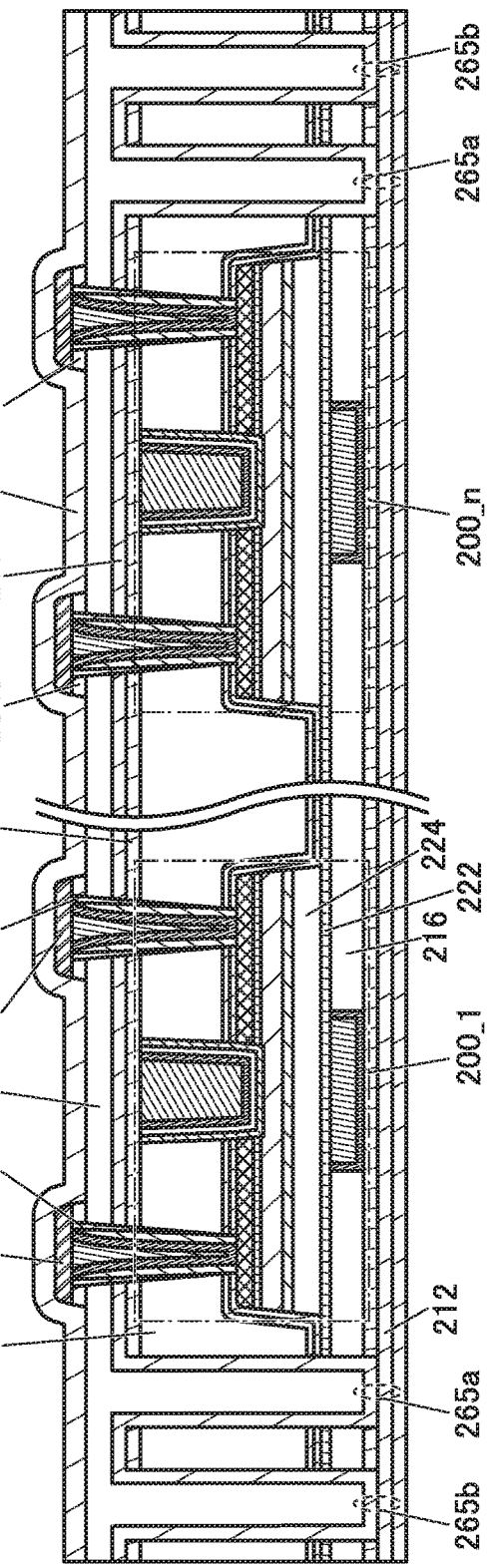
FIG. 21A
FIG. 21B

FIG. 37A
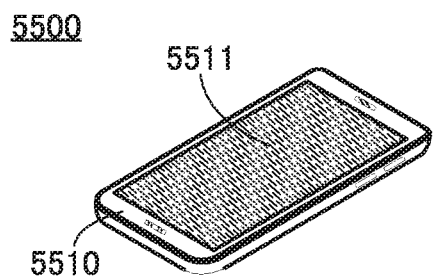
FIG. 37B
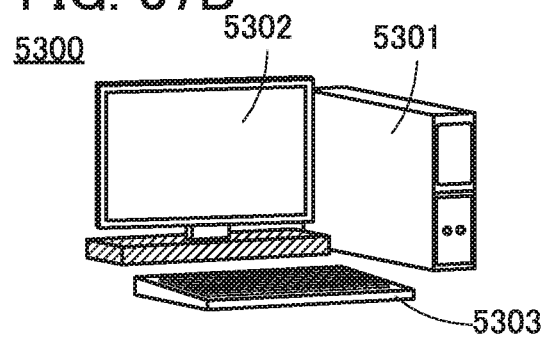
FIG. 37C
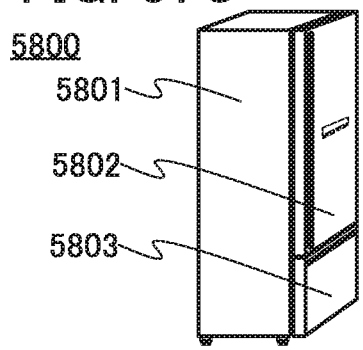
FIG. 37D
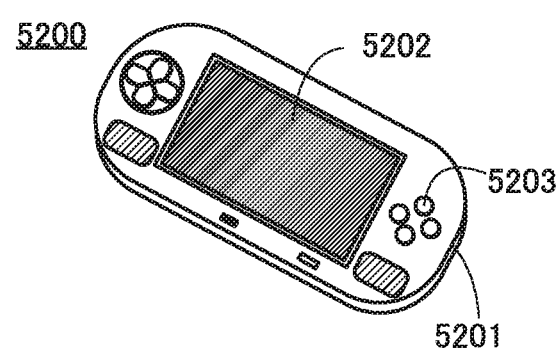
FIG. 37E1
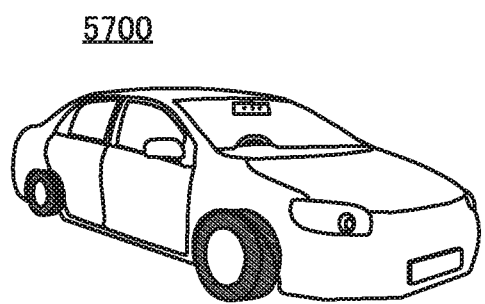
FIG. 37E2
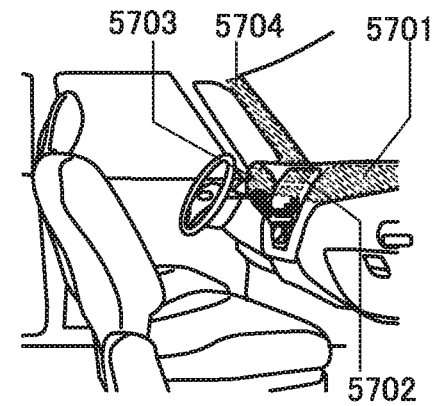
FIG. 37F
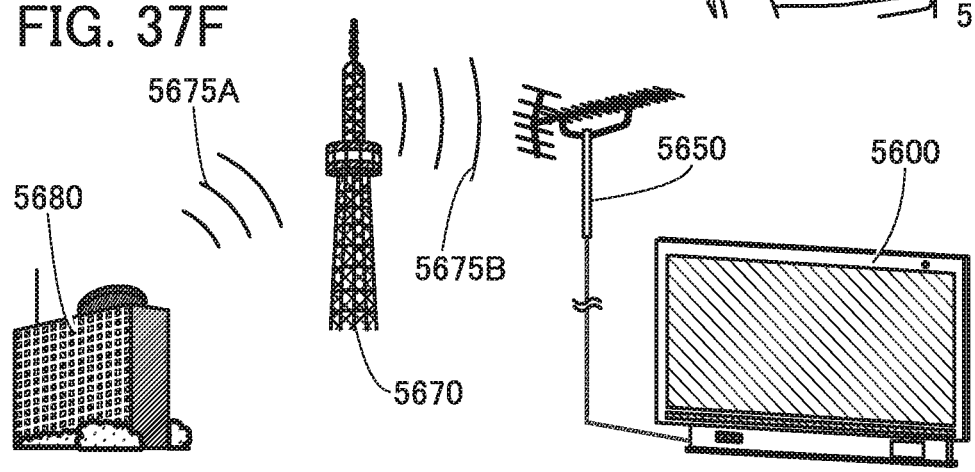

SEMICONDUCTOR DEVICE

BACKGROUND OF THE INVENTION

1. Field of the Invention

One embodiment of the present invention relates to a semiconductor device and a manufacturing method thereof. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of the semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

2. Description of the Related Art

In recent years, semiconductor devices have been developed to be used mainly for an LSI, a CPU, or a memory. A CPU is an aggregation of semiconductor elements each provided with an electrode that is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has attracted attention. The transistor is used in a wide range of electronic devices such as an integrated circuit (IC) and an image display device (also simply referred to as a display device). A silicon-based semiconductor material is widely known as a material for a semiconductor thin film that can be used in a transistor. As another material, an oxide semiconductor has been attracting attention.

It is known that a transistor including an oxide semiconductor has an extremely low leakage current in an off state. For example, a low-power CPU utilizing a characteristic of a low leakage current of the transistor including an oxide semiconductor has been disclosed (see Patent Document 1). Furthermore, a memory device that can retain stored data for a long time by utilizing a characteristic of a low leakage current of the transistor including an oxide semiconductor has been disclosed, for example (see Patent Document 2).

In recent years, demand for an integrated circuit with higher density has risen with reductions in size and weight of electronic devices. In addition, the productivity of a semiconductor device including an integrated circuit is required to be improved.

REFERENCES

Patent Documents

[Patent Document 1] Japanese Published Patent Application No. 2012-257187 [Patent Document 2] Japanese Published Patent Application No. 2011-151383

SUMMARY OF THE INVENTION

An object of one embodiment of the present invention is to provide a semiconductor device having favorable electrical characteristics. Another object of one embodiment of the present invention is to provide a semiconductor device with normally-off electrical characteristics. Another object of one embodiment of the present invention is to provide a highly reliable semiconductor device. Another object of one embodiment of the present invention is to provide a semiconductor device with a high on-state current. Another object of one embodiment of the present invention is to provide a semiconductor device with excellent frequency characteristics. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a low-power semiconductor device. Another object of one embodiment of the present invention is to provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first insulator, a second insulator over the first insulator, a third insulator over the second insulator, a fourth insulator and a first conductor over the third insulator, a fifth insulator over the fourth insulator and the first conductor, a first oxide over the fifth insulator, a second conductor and a third conductor over the first oxide, a second oxide over the first oxide and between the second conductor and the third conductor, a sixth insulator over the second oxide, and a fourth conductor over the sixth insulator. The hydrogen concentration of the second insulator is lower than that of the first insulator, and the hydrogen concentration of the third insulator is lower than that of the second insulator.

One embodiment of the present invention is a semiconductor device including a first insulator, a second insulator over the first insulator, a third insulator over the second insulator, a fourth insulator and a first conductor over the third insulator, a fifth insulator over the fourth insulator and the first conductor, a first oxide over the fifth insulator, a second conductor and a third conductor over the first oxide, a second oxide over the first oxide and between the second conductor and the third conductor, a sixth insulator over the second oxide, a fourth conductor over the sixth insulator, a seventh insulator including a region in contact with a top surface of the fifth insulator, a side surface of the first oxide, a side surface of the second conductor, a top surface of the second conductor, a side surface of the third conductor, and a top surface of the third conductor, an eighth insulator over the seventh insulator, a ninth insulator over the eighth insulator, a tenth insulator in contact with a top surface of the ninth insulator, a top surface of the second oxide, a top surface of the sixth insulator, and a top surface of the fourth conductor, an eleventh insulator over the tenth insulator, and a twelfth insulator over the eleventh insulator. The eleventh insulator is in contact with a top surface of the second insulator, side surfaces of the third to fifth insulators, side surfaces of the seventh to tenth insulators, and a top surface of the tenth insulator.

One embodiment of the present invention is a semiconductor device including a first insulator, a second insulator over the first insulator, a third insulator over the second insulator, a fourth insulator and a first conductor over the third insulator, a fifth insulator over the fourth insulator and the first conductor, a first oxide over the fifth insulator, a second conductor and a third conductor over the first oxide, a second oxide over the first oxide and between the second conductor and the third conductor, a sixth insulator over the second oxide, a fourth conductor over the sixth insulator, a seventh insulator including a region in contact with a top surface of the fifth insulator, a side surface of the first oxide, a side surface of the second conductor, a top surface of the second conductor, a side surface of the third conductor, and a top surface of the third conductor, an eighth insulator over the seventh insulator, a ninth insulator over the eighth insulator, a tenth insulator in contact with a top surface of the ninth insulator, a top surface of the second oxide, a top surface of the sixth insulator, and a top surface of the fourth conductor, an eleventh insulator over the tenth insulator, a twelfth insulator over the eleventh insulator, a thirteenth insulator and a fourteenth insulator over the twelfth insulator, a fifth conductor over the thirteenth insulator, a sixth conductor over the fourteenth insulator, and a fifteenth insulator over the fifth conductor, the sixth conductor, and the twelfth insulator. The fifteenth insulator is in contact with a side surface of the fifth conductor, a top surface of the fifth conductor, a side surface of the sixth conductor, and a top surface of the sixth conductor.

One embodiment of the present invention is a semiconductor device including a first insulator, a second insulator over the first insulator, a third insulator over the second insulator, a fourth insulator and a first conductor over the third insulator, a fifth insulator over the fourth insulator and the first conductor, a first oxide over the fifth insulator, a second conductor and a third conductor over the first oxide, a second oxide over the first oxide and between the second conductor and the third conductor, a sixth insulator over the second oxide, a fourth conductor over the sixth insulator, a seventh insulator including a region in contact with a top surface of the fifth insulator, a side surface of the first oxide, a side surface of the second conductor, a top surface of the second conductor, a side surface of the third conductor, and a top surface of the third conductor, an eighth insulator over the seventh insulator, a ninth insulator over the eighth insulator, a tenth insulator in contact with a top surface of the ninth insulator, a top surface of the second oxide, a top surface of the sixth insulator, and a top surface of the fourth conductor, an eleventh insulator over the tenth insulator, a twelfth insulator over the eleventh insulator, a thirteenth insulator and a fourteenth insulator over the twelfth insulator, an opening formed in the seventh to fourteenth insulators, a sixteenth insulator in contact with at least side surfaces of the tenth to twelfth insulators at a side surface of the opening, a seventeenth insulator in contact with a side surface of the sixteenth insulator, and a seventh conductor in contact with a side surface of the seventeenth insulator.

In the above, the first insulator, the second insulator, the eighth insulator, the eleventh insulator, and the thirteenth to sixteenth insulators each preferably contain silicon and nitrogen.

In the above, the third insulator, the seventh insulator, the tenth insulator, and the seventeenth insulator each preferably contain any one of aluminum, magnesium, and tantalum.

One embodiment of the present invention can provide a semiconductor device having favorable electrical characteristics. One embodiment of the present invention can provide a semiconductor device with normally-off electrical characteristics. One embodiment of the present invention can provide a highly reliable semiconductor device. One embodiment of the present invention can provide a semiconductor device with a high on-state current. One embodiment of the present invention can provide a semiconductor device with excellent frequency characteristics. One embodiment of the present invention can provide a semiconductor device that can be miniaturized or highly integrated. One embodiment of the present invention can provide a semiconductor device that can be manufactured with high productivity.

One embodiment of the present invention can provide a semiconductor device capable of retaining data for a long time. One embodiment of the present invention can provide a semiconductor device capable of high-speed data writing. One embodiment of the present invention can provide a semiconductor device with high design flexibility. One embodiment of the present invention can provide a low-power semiconductor device. One embodiment of the present invention can provide a novel semiconductor device.

Note that the description of these effects does not disturb the existence of other effects. In one embodiment of the present invention, there is no need to achieve all the effects. Other effects will be apparent from and can be derived from the description of the specification, the drawings, the claims, and the like.

BRIEF DESCRIPTION OF THE DRAWINGS

In the accompanying drawings:

FIGS. 20A and 20B are cross-sectional views of a semiconductor device;

FIGS. 21A and 21B are cross-sectional views a semiconductor device;

FIGS. 37A, 37B, 37C, 37D, 37E1, 37E2, and 37F illustrate electronic devices;

DETAILED DESCRIPTION OF THE INVENTION

Figure 1A:
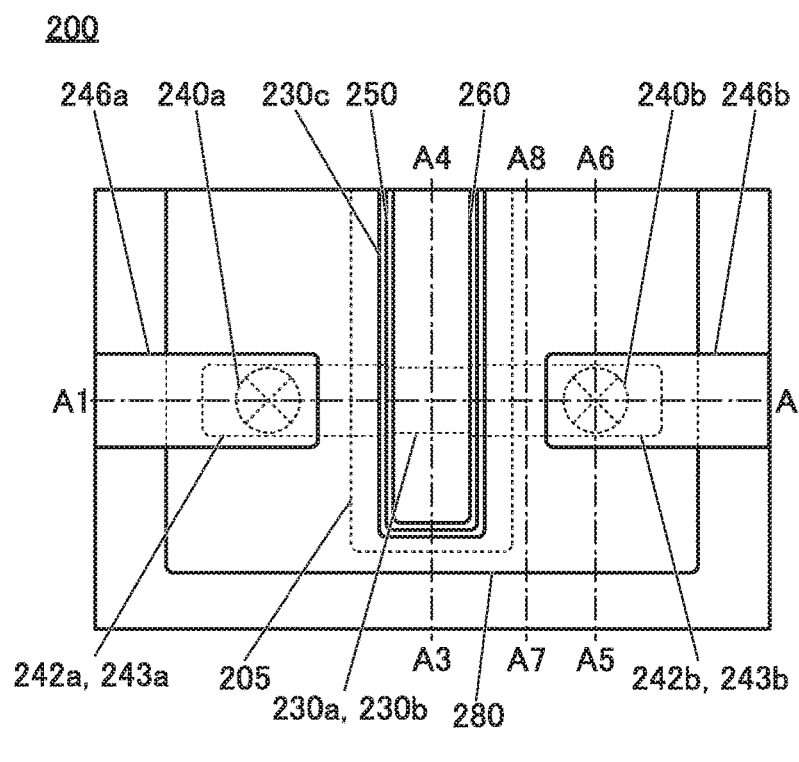
FIG. 1A is a top view of a semiconductor device.

Embodiments will be hereinafter described with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is sometimes exaggerated for clarity. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. The same hatching pattern is applied to portions having similar functions, and the portions are not denoted by specific reference numerals in some cases.

Furthermore, especially in a top view (also referred to as a plan view), a perspective view, or the like, some components might not be illustrated for easy understanding of the invention. In addition, some hidden lines and the like might not be shown.

The ordinal numbers such as "first" and "second" in this specification and the like are used for convenience and do not denote the order of steps or the stacking order of layers. Therefore, for example, description can be made even when "first" is replaced with "second", "third", or the like as appropriate. In addition, the ordinal numbers in this specification and the like are not necessarily the same as those used to specify one embodiment of the present invention.

In this specification and the like, terms for describing arrangement, such as "over", "above", "under", and "below", are used for convenience to describe a positional relation between components with reference to drawings. Furthermore, the positional relation between components is changed as appropriate in accordance with the direction in which each component is described. Thus, the positional relation is not limited to that described with a term used in this specification and can be explained with other terms as appropriate depending on the situation.

For example, when this specification and the like explicitly state that X and Y are connected, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, another connection relation is regarded as being disclosed in the drawings or the text.

Here, X and Y each denote an object (e.g., a device, an element, a circuit, a wiring, an electrode, a terminal, a conductive film, and a layer).

Furthermore, functions of a source and a drain might be switched when a transistor of opposite polarity is employed or when a direction of current flow is changed in circuit operation, for example. Therefore, the terms "source" and "drain" can sometimes be interchanged in this specification and the like.

Note that in this specification and the like, depending on the transistor structure, a channel width in a region where a channel is actually formed, i.e., in a channel formation region, (hereinafter, also referred to as an effective channel width) is different from a channel width shown in a top view of a transistor (hereinafter, also referred to as an apparent channel width) in some cases. For example, in a transistor having a gate covering a side surface of a semiconductor, an effective channel width is greater than an apparent channel width and has a non-negligible influence in some cases. For example, in a miniaturized transistor having a gate covering a side surface of a semiconductor, the proportion of a channel formation region formed in a side surface of a semiconductor is sometimes increased. In that case, an effective channel width is greater than an apparent channel width.

In such a case, an effective channel width is difficult to estimate by measuring in some cases. For example, to estimate an effective channel width from a design value, it is necessary to assume that the shape of a semiconductor is a known one. Accordingly, in the case where the shape of a semiconductor is not known exactly, it is difficult to measure an effective channel width accurately.

In this specification, the simple term "channel width" denotes an apparent channel width in some cases. In other cases, the simple term "channel width" denotes an effective channel width in this specification. Note that the values of a channel length, a channel width, an effective channel width, an apparent channel width, and the like can be determined by analyzing a cross-sectional TEM image and the like.

Note that an impurity in a semiconductor refers to, for example, elements other than the main components of the semiconductor. For example, an element with a concentration lower than 0.1 atomic % can be regarded as an impurity. When an impurity is contained, for example, the density of states (DOS) in a semiconductor may be increased, or the crystallinity may be decreased. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. For an oxide semiconductor, water also serves as an impurity in some cases. For an oxide semiconductor, entry of impurities may lead to formation of oxygen vacancies, for example. When the semiconductor is silicon, examples of an impurity which changes the characteristics of the semiconductor include oxygen, Group 1 elements except hydrogen, Group 2 elements, Group 13 elements, and Group 15 elements.

In this specification and the like, silicon oxynitride refers to a substance that contains more oxygen than nitrogen, and silicon nitride oxide refers to a substance that contains more nitrogen than oxygen.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, the term "parallel" indicates that the angle formed between two straight lines is greater than or equal to $-10°$ and less than or equal to $10°$. Thus, the case where the angle is greater than or equal to $-5°$ and less than or equal to $5°$ is also included. In addition, the term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$. Thus, the case where the angle is greater than or equal to $85°$ and less than or equal to $95°$ is also included. In addition, the term "substantially perpendicular" indicates that the angle formed between two straight lines is greater than or equal to $60°$ and less than or equal to $120°$.

Note that in this specification, a barrier film refers to a film having a function of inhibiting the penetration of oxygen and impurities such as water and hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET or an OS transistor is a transistor including an oxide or an oxide semiconductor.

In this specification and the like, the term "normally off" means that current per micrometer of channel width that flows through a transistor when no potential or a ground potential is supplied to its gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

An example of a semiconductor device including a transistor 200 of one embodiment of the present invention and a method for manufacturing the semiconductor device are described below.

<Structure Example of Semiconductor Device>

FIGS. 1A to 1D are a top view and cross-sectional views of the transistor 200 of one embodiment of the present invention and the periphery of the transistor 200.

Figure 1C:
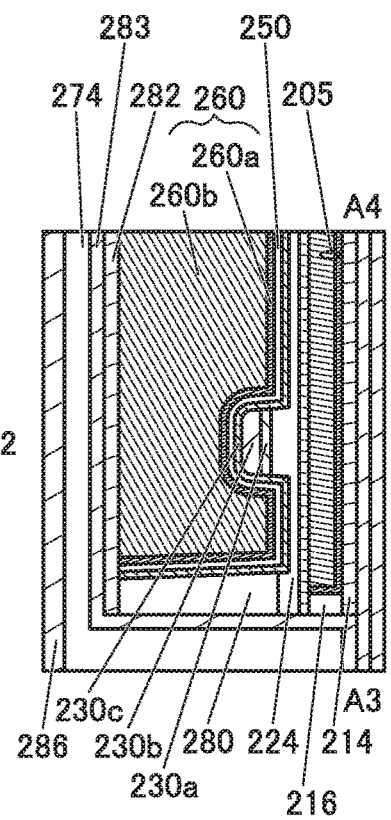
FIGS. 1B to 1D are cross-sectional views of the semiconductor device.
Figure 1B:
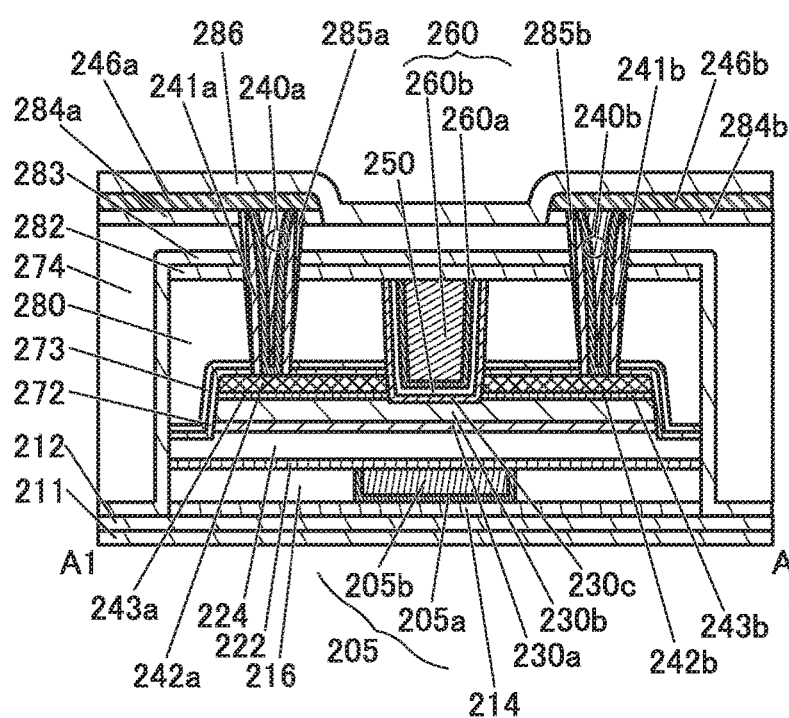
Figure 1D:
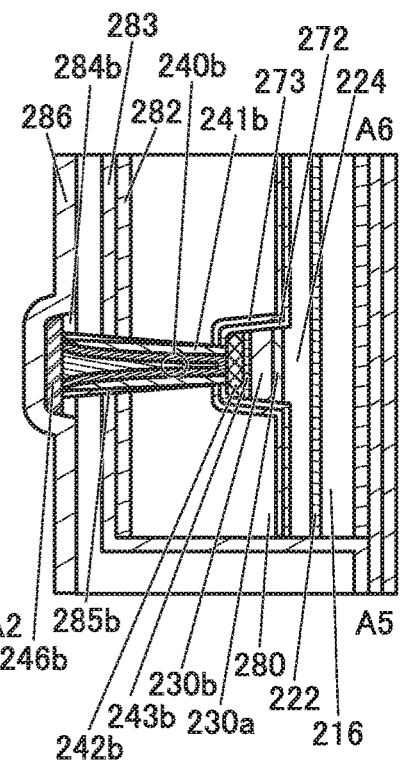

FIG. 1A is a top view of the semiconductor device including the transistor 200. FIGS. 1B and 1C are cross-sectional views of the semiconductor device. FIG. 1B is a cross-sectional view taken along the dashed-dotted line A1-A2 in FIG. 1A, which corresponds to a cross-sectional view in the channel length direction of the transistor 200. FIG. 1C is a cross-sectional view taken along the dashed-dotted line A3-A4 in FIG. 1A, which corresponds to a cross-sectional view in the channel width direction of the transistor 200. FIG. 1D is a cross-sectional view taken along the dashed-dotted line A5-A6 in FIG. 1A. Note that for simplification of the drawing, some components are not illustrated in the top view in FIG. 1A.

The semiconductor device of one embodiment of the present invention includes an insulator 211 over a substrate (not illustrated), an insulator 212 over the insulator 211, an insulator 214 over the insulator 212, the transistor 200 over the insulator 214, an insulator 280 over the transistor 200, an insulator 282 over the insulator 280, an insulator 283 over the insulator 282, an insulator 274 over the insulator 283, an insulator 284 (an insulator 284a and an insulator 284b) over the insulator 274, and an insulator 286. The insulators 214, 280, 282, 283, 274, and 284 function as interlayer films. The semiconductor device also includes a conductor 240 (a conductor 240a and a conductor 240b) that is electrically connected to the transistor 200 and functions as a plug. An insulator 241 (an insulator 241a and an insulator 241b) is provided in contact with a side surface of the conductor 240 functioning as a plug. An insulator 285 (an insulator 285a and an insulator 285b) is provided in contact with a side surface of the insulator 241. A conductor 246 (a conductor 246a and a conductor 246b) that is electrically connected to the conductor 240 and functions as a wiring is provided over the insulator 284 and the conductor 240. An insulator 286 is provided over the conductor 246 and the insulator 274.

The insulator 285a is provided on an inner wall of an opening in an insulator 272, an insulator 273, the insulator 280, the insulator 282, the insulator 283, the insulator 274, and the insulator 284a such that the insulator 285a is in contact with at least the insulators 282, 283, and 274. The insulator 241a is provided in contact with a side surface of the insulator 285a. A first conductor of the conductor 240a is provided in contact with a side surface of the insulator 241a, and a second conductor of the conductor 240a is provided more inward than the first conductor. The insulator 285b is provided on an inner wall of an opening in the insulators 272, 273, 280, 282, 283, 274, and 284b such that the insulator 285b is in contact with at least the insulators 282, 283, and 274. The insulator 241b is provided in contact with a side surface of the insulator 285b. A first conductor of the conductor 240b is provided in contact with a side surface of the insulator 241b, and a second conductor of the conductor 240b is provided more inward than the first conductor. Here, the top surface of the conductor 240 can be substantially level with the top surface of the insulator 284. Although the first conductor and the second conductor of the conductor 240 are stacked in the transistor 200, the present invention is not limited thereto. For example, the conductor 240 may have a single-layer structure or a stacked-layer structure of three or more layers. In the case where a stacked-layer structure is employed, the layers may be distinguished by numbers corresponding to the formation order.

As illustrated in FIGS. 1B to 1D, it is preferable that the transistor 200 in this embodiment be formed over the insulator 214, and the top and side surfaces of the transistor 200 be covered with the insulator 283. Furthermore, in the cross-sectional views, the insulators 283 and 214 are preferably in contact with each other outside the transistor 200 to seal the transistor 200.

[Transistor 200]

As illustrated in FIGS. 1A to 1D, the transistor 200 includes an insulator 216 over the insulator 214, a conductor 205 (a conductor 205a and a conductor 205b) embedded in the insulator 216, an insulator 222 over the insulator 216 and the conductor 205, an insulator 224 over the insulator 222, an oxide 230a over the insulator 224, an oxide 230b over the oxide 230a, an oxide 243a and an oxide 243b over the oxide 230b, a conductor 242a over the oxide 243a, a conductor 242b over the oxide 243b, the insulator 272 that is in contact with part of the insulator 224, side surfaces of the oxide 230a, the oxide 230b, the oxide 243a, the conductor 242a, the oxide 243b, and the conductor 242b, and top surfaces of the conductors 242a and 242b, the insulator 273 over the insulator 272, an oxide 230c over the oxide 230b, an insulator 250 over the oxide 230c, and a conductor 260 (a conductor 260a and a conductor 260b) that is over the insulator 250 and overlaps with the oxide 230c. The oxide 230c is in contact with the side surfaces of the oxides 243a and 243b and the conductors 242a and 242b. The conductor 260 includes the conductors 260a and 260b. The conductor 260a is positioned to cover the bottom and side surfaces of the conductor 260b. Note that as illustrated in FIG. 1B, the top surface of the conductor 260 is substantially aligned with the top surfaces of the insulator 250 and the oxide 230c. The insulator 282 is in contact with the top surfaces of the conductor 260, the insulator 250, the oxide 230c, and the insulator 280.

Hereinafter, the oxides 243a and 243b are sometimes collectively referred to as an oxide 243. Furthermore, the conductors 242a and 242b are sometimes collectively referred to as a conductor 242.

In the transistor 200, the conductor 260 functions as a gate, and the conductors 242a and 242b function as a source electrode and a drain electrode. The conductor 260 functioning as the gate is formed in a self-aligned manner to fill an opening formed in the insulator 280 and the like in the transistor 200. In this manner, the conductor 260 can be surely provided in a region between the conductors 242a and 242b without alignment.

At least one of the insulators 214, 222, 272, 273, 282, and 283 preferably has a function of inhibiting diffusion of hydrogen (e.g., at least one of hydrogen atoms, hydrogen molecules, and the like) or water molecules. In particular, the insulators 214, 273, and 283 preferably have high capability of inhibiting diffusion of hydrogen (e.g., at least one of hydrogen atoms, hydrogen molecules, and the like) or water molecules. At least one of the insulators 214, 222, 272, 273, 282, and 283 preferably has a function of inhibiting diffusion of oxygen (e.g., at least one of oxygen atoms, oxygen molecules, and the like). For example, at least one of the insulators 214, 222, 272, 273, 282, and 283 preferably has lower permeability of oxygen and/or hydrogen than the insulator 224. At least one of the insulators 214, 222, 272, 273, 282, and 283 preferably has lower permeability of oxygen and/or hydrogen than the insulator 250. At least one of the insulators 214, 222, 272, 273, 282, and 283 preferably has lower permeability of oxygen and/or hydrogen than the insulator 280.

The insulators 214, 222, 272, 273, 282, and 283 can be formed using aluminum oxide, hafnium oxide, gallium oxide, indium gallium zinc oxide, silicon nitride, silicon nitride oxide, or the like. In particular, the insulators 214, 273, and 283 are preferably formed using silicon nitride or silicon nitride oxide having a higher hydrogen barrier property.

As illustrated in FIGS. 1A to 1D, in one embodiment of the semiconductor device in this embodiment, part of the top surface of the insulator 224 is in contact with the insulator 272, and the insulator 273 is provided over the insulator 272. Such a structure sometimes makes it possible to supply oxygen to the insulator 224 at the time of forming the insulator 272. In addition, the insulator 224 is sealed with the insulators 272 and 273; thus, oxygen supplied to the insulator 224 is inhibited from diffusing to the outside and can be efficiently supplied to the oxide 230. Moreover, the above structure is preferable because the insulator 273 may absorb hydrogen in the insulator 224.

As illustrated in FIGS. 1A to 1D, in one embodiment of the semiconductor device in this embodiment, the insulators 214, 216, 222, 224, 280, and 282 are patterned and covered with the insulator 283. That is, the insulator 283 is in contact with the top surface of the insulator 282 and the side surfaces of the insulators 282, 280, 224, 222, 216, and 214. Accordingly, the oxides 230 and 243 and the insulators 214, 216, 222, 224, 280, and 282 are sealed with the insulators 283 and 212. Such sealing is preferable because entry of hydrogen (e.g., at least one of hydrogen atoms, hydrogen molecules, and the like) or water molecules from the outside into the oxides 230 and 243 and the insulators 216, 222, 224, 280, and 282 can be inhibited.

The oxide 230 preferably includes the oxide 230a over the insulator 224, the oxide 230b over the oxide 230a, and the oxide 230c that is over the oxide 230b and at least partly in contact with the top surface of the oxide 230b. Note that the side surface of the oxide 230c is preferably in contact with the oxides 243a and 243b, the conductors 242a and 242b, and the insulators 272, 273, and 280.

The transistor 200 has a structure in which the three oxides 230a, 230b, and 230c are stacked in a channel formation region and its vicinity; however, the present invention is not limited to this structure. For example, the transistor 200 may include a single layer of the oxide 230b, a two-layer stack of the oxide 230b and the oxide 230a or 230c, or a four or more-layer stack. For example, the transistor 200 may include a four-layer stack including the oxide 230c with a two-layer structure.

In the transistor 200, the oxide 230 (the oxides 230a, 230b, and 230c), which includes a channel formation region, is preferably formed using a metal oxide functioning as an oxide semiconductor (hereinafter, also referred to as an oxide semiconductor). For example, the metal oxide functioning as an oxide semiconductor preferably has an energy gap of 2 eV or more, further preferably 2.5 eV or more. With the use of a metal oxide having such a wide energy gap, leakage current in a non-conduction state (off-state current) of the transistor 200 can be extremely low. With the use of such a transistor, a semiconductor device with low power consumption can be provided.

For example, as the oxide 230, a metal oxide such as an In-M-Zn oxide (M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Alternatively, an In-M oxide, an In—Zn oxide, or an M-Zn oxide may be used as the oxide 230.

The oxide 230 includes the oxide 230a, the oxide 230b over the oxide 230a, and the oxide 230c over the oxide 230b. When the oxide 230a is provided below the oxide 230b, impurities can be inhibited from diffusing into the oxide 230b from the components formed below the oxide 230a. When the oxide 230c is provided over the oxide 230b, impurities can be inhibited from diffusing into the oxide 230b from the components formed above the oxide 230c.

The oxide 230 preferably has a stacked-layer structure of oxides which differ in the atomic ratio of metal elements. Specifically, the atomic ratio of the element M to constituent elements in the metal oxide used as the oxide 230a is preferably greater than that in the metal oxide used as the oxide 230b. Moreover, the atomic ratio of the element M to In in the metal oxide used as the oxide 230a is preferably greater than that in the metal oxide used as the oxide 230b. Moreover, the atomic ratio of In to the element M in the metal oxide used as the oxide 230b is preferably greater than that in the metal oxide used as the oxide 230a. The oxide 230c can be formed using a metal oxide that can be used as the oxide 230a or the oxide 230b.

Specifically, as the oxide 230a, a metal oxide having an atomic ratio of In:Ga:Zn=1:3:4 or In:Ga:Zn=1:1:0.5 is used. As the oxide 230b, a metal oxide having an atomic ratio of In:Ga:Zn=4:2:3 or In:Ga:Zn=1:1:1 is used. As the oxide 230c, a metal oxide having an atomic ratio of In:Ga:Zn=1:3:4, Ga:Zn=2:1, or Ga:Zn=2:5 is used. Specific examples of the oxide 230c having a stacked-layer structure include a stacked-layer structure of a metal oxide having an atomic ratio of In:Ga:Zn=4:2:3 and a metal oxide having an atomic ratio of In:Ga:Zn=1:3:4, a stacked-layer structure of a metal oxide having an atomic ratio of Ga:Zn=2:1 and a metal oxide having an atomic ratio of In:Ga:Zn=4:2:3, a stacked-layer structure of a metal oxide having an atomic ratio of Ga:Zn=2:5 and a metal oxide having an atomic ratio of In:Ga:Zn=4:2:3, and a stacked-layer structure of gallium oxide and a metal oxide having an atomic ratio of In:Ga:Zn=4:2:3.

The oxide 230b preferably has crystallinity. For example, it is preferable to use a c-axis aligned crystalline oxide semiconductor (CAAC-OS) described later. An oxide having crystallinity, such as a CAAC-OS, has a dense structure with small amounts of impurities and defects (e.g., oxygen vacancies) and high crystallinity. Accordingly, extraction of oxygen from the oxide 230b by the source electrode or the drain electrode can be inhibited. This inhibits extraction of oxygen from the oxide 230b even when heat treatment is performed; hence, the transistor 200 is stable with respect to high temperatures in the manufacturing process (i.e., thermal budget).

The energy of the conduction band minimum of each of the oxides 230a and 230c is preferably higher than that of the conduction band minimum of the oxide 230b. In other words, the electron affinity of each of the oxides 230a and 230c is preferably smaller than that of the oxide 230b.

Note that the electron affinity or the energy level Ec of the conduction band minimum can be obtained from an energy gap Eg and an ionization potential Ip, which is a difference between the vacuum level and the energy Ev of the valence band maximum. The ionization potential Ip can be measured with, for example, an ultraviolet photoelectron spectroscopy (UPS) apparatus. The energy gap Eg can be measured with, for example, a spectroscopic ellipsometer.

The energy level of the conduction band minimum gradually changes at a junction portion of each of the oxides 230a, 230b, and 230c. In other words, the energy level of the conduction band minimum at a junction portion of each of the oxides 230a, 230b, and 230c continuously changes or is continuously connected. To change the energy level gradually, the density of defect states in a mixed layer formed at the interface between the oxides 230a and 230b and the interface between the oxides 230b and 230c is decreased.

The oxide 230b serves as a main carrier path. When the oxides 230a and 230c have the above structure, the density of defect states at the interface between the oxides 230a and 230b and the interface between the oxides 230b and 230c can be made low. Thus, the influence of interface scattering on carrier conduction is small, and the transistor 200 can have a high on-state current and high frequency characteristics.

An oxide semiconductor with a low carrier concentration is preferably used as the oxide 230 (e.g., the oxide 230b). In order to reduce the carrier concentration of the oxide semiconductor, the concentration of impurities in the oxide semiconductor is reduced so that the density of defect states can be reduced. In this specification and the like, a state with a low impurity concentration and a low density of defect states is referred to as a highly purified intrinsic or substantially highly purified intrinsic state. Examples of the impurities in the oxide semiconductor include hydrogen, nitrogen, an alkali metal, an alkaline earth metal, iron, nickel, and silicon.

In particular, hydrogen contained in the oxide semiconductor reacts with oxygen bonded to a metal atom to be water, and thus sometimes causes oxygen vacancies (also referred to as Vo) in the oxide semiconductor. In some cases, defects that are oxygen vacancies into which hydrogen enters (hereinafter, sometimes referred to as VoH) serve as donors and generate electrons serving as carriers. In other cases, bonding of part of hydrogen to oxygen bonded to a metal atom generates electrons serving as carriers. Thus, a transistor including an oxide semiconductor with a high hydrogen content is likely to be normally on. Hydrogen in the oxide semiconductor is easily transferred by a stress such as heat or an electric field; thus, a high hydrogen content in the oxide semiconductor might reduce the reliability of the transistor.

Note that VoH can serve as donors of the oxide semiconductor; however, it is difficult to quantitatively evaluate the defects. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Accordingly, in the case where an oxide semiconductor is used as the oxide 230, the amount of VoH in the oxide 230 is preferably reduced as much as possible so that the oxide 230 becomes a highly purified intrinsic or substantially highly purified intrinsic oxide. In order to obtain such an oxide semiconductor with a sufficiently small amount of VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently small amounts of VoH and impurities is used for a channel formation region of a transistor, the transistor can have stable electrical characteristics.

In the case where an oxide semiconductor is used as the oxide 230, the carrier concentration of the oxide semiconductor in a region functioning as a channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, and yet still further preferably lower than $1 \times 10^{12}$ cm$^{-3}$. Note that the lower limit of the carrier concentration of the oxide semiconductor in the region functioning as the channel formation region is not particularly limited and can be, for example, $1 \times 10^{-9}$ cm$^{-3}$.

The interlayer insulating films (e.g., the insulators 216, 274, and 280) and the gate insulating films (e.g., the insulators 224 and 250) may be formed using a source gas containing no hydrogen atom or with a small number of hydrogen atoms so that the hydrogen concentration of these insulating films is reduced and thus entry of hydrogen into the channel formation region of the oxide semiconductor is inhibited.

The insulating films are formed mainly using a gas that contains a molecule containing a silicon atom as a deposition gas. In order to reduce the hydrogen concentration of the insulating films, the molecule containing a silicon atom preferably contains as few hydrogen atoms as possible; further preferably, the molecule containing a silicon atom contains no hydrogen atom. Needless to say, a deposition gas other than the gas that contains a molecule containing a silicon atom also preferably contains as few hydrogen atoms as possible; further preferably, the deposition gas contains no hydrogen atom.

In the case where the molecule containing a silicon atom is expressed as $Si_x$—$R_y$, a functional group R can be at least one of an isocyanate group (—N=C=O), a cyanate group (—O—C≡N), a cyano group (—C≡N), a diazo group (=N$_2$), an azide group (—N$_3$), a nitroso group (—NO), and a nitro group (—NO$_2$). For example, $1 \leq x \leq 3$ and $1 \leq y \leq 8$ are satisfied. Examples of such a molecule containing a silicon atom include tetraisocyanatosilane, tetracyanatosilane, tetracyanosilane, hexaisocyanatosilane, and octaisocyanatosilane. The examples here each show the molecule in which functional groups of the same kind are bonded to the silicon atom; however, this embodiment is not limited to these examples. Different kinds of functional groups may be bonded to the silicon atom.

Alternatively, the functional group R may be, for example, halogen (Cl, Br, I, or F). For example, $1 \leq x \leq 2$ and $1 \leq y \leq 6$ are satisfied. Examples of such a molecule containing a silicon atom include tetrachlorosilane (SiCl$_4$) and hexachlorodisilane (Si$_2$Cl$_6$). Although an example of using chlorine as the functional group is described here, halogen other than chlorine, such as bromine, iodine, or fluorine, may be used as the functional group. In addition, different kinds of halogen may be bonded to the silicon atom.

The insulators 216, 274, 280, 224, and 250 are formed by a chemical vapor deposition (CVD) method using a gas that contains the molecule containing a silicon atom. A CVD method, with a relatively high deposition rate, is suitable for forming the insulators 280, 274, and 216 each having a large thickness.

As the CVD method, a plasma enhanced CVD (PECVD) method using plasma or a thermal CVD (TCVD) method using heat is preferably used. In the case of a thermal CVD method, an atmospheric pressure CVD (APCVD) method, in which deposition is performed under the atmospheric pressure, or a low pressure CVD (LPCVD) method, in which deposition is performed under pressure lower than the atmospheric pressure, may be used.

When the insulators 216, 274, 280, 224, and 250 are formed by a CVD method, an oxidizer is preferably used. As an oxidizer, it is preferable to use a gas that does not contain a hydrogen atom, such as $O_2$, $O_3$, NO, $NO_2$, $N_2O$, $N_2O_3$, $N_2O_4$, $N_2O_5$, CO, and $CO_2$.

The insulators 216, 274, 280, 224, and 250 may be formed by an atomic layer deposition (ALD) method. In an ALD method, a first source gas for reaction (hereinafter, referred to as a precursor or a metal precursor) and a second source gas for reaction (hereinafter, referred to as a reactant or a non-metal precursor) are alternately introduced into a chamber, and then the source gas introduction is repeated.

In an ALD method, deposition is performed while the source gases are switched, so that one atomic layer can be deposited at a time using self-controllability of atoms. Thus, an ALD method enables deposition of an extremely thin film, deposition on a component with a high aspect ratio, deposition of a film with few defects such as pinholes, deposition with excellent coverage, and the like. Accordingly, an ALD method is suitable for forming the insulators 250 and 224.

As an ALD method, a thermal ALD method, in which reaction between a precursor and a reactant is performed using only thermal energy, or a plasma-enhanced ALD (PEALD) method, in which a plasma-enhanced reactant is used, may be employed.

In the case of an ALD method, the gas that contains the molecule containing a silicon atom is used as a precursor, and the oxidizer is used as a reactant. Thus, the amount of hydrogen that enters the insulators 216, 274, 280, 224, and 250 can be significantly reduced.

Note that examples of the molecule containing a silicon atom and not containing a hydrogen atom are described above; however, this embodiment is not limited to these examples. In the molecule containing a silicon atom, some of the functional groups bonded to a silicon atom may be replaced with hydrogen atoms. Note that the number of hydrogen atoms in the molecule containing a silicon atom is preferably smaller than that of hydrogen atoms in silane ($SiH_4$). That is, the molecule containing a silicon atom preferably contains three or less hydrogen atoms per silicon atom. It is further preferable that the gas that contains the molecule containing a silicon atom contain three or less hydrogen atoms per silicon atom.

As described above, at least one of the insulators 216, 274, 280, 224, and 250 is formed by a deposition method using a gas in which the number of hydrogen atoms is reduced or hydrogen atoms are removed, whereby the amount of hydrogen in the insulating films can be reduced. In particular, the insulators 216, 224, 280, and 250 positioned together with the oxide 230 in a region sealed with the insulators 283 and 212 are preferably formed by the above-described deposition method, in which case the hydrogen concentration of the sealed region can be reduced and the insulators 283 and 212 can inhibit entry of hydrogen from the outside.

As illustrated in FIGS. 1B to 1D, the insulator 282 is directly in contact with the insulator 250 in the transistor 200. With such a structure, oxygen contained in the insulator 280 is hardly absorbed by the conductor 260. Thus, oxygen contained in the insulator 280 can be efficiently supplied to the oxides 230a and 230b through the oxide 230c, reducing the amount of oxygen vacancies in the oxides 230a and 230b and improving the electrical characteristics and reliability of the transistor 200. Moreover, entry of impurities such as hydrogen contained in the insulator 280 into the insulator 250 can be inhibited, further reducing the hydrogen concentration of the insulator 250 and the oxide 230. Accordingly, adverse effects on the electrical characteristics and reliability of the transistor 200 can be reduced. The insulator 282 can be formed using silicon nitride, silicon nitride oxide, aluminum oxide, or hafnium oxide.

As described above, a semiconductor device that has small variation in electrical characteristics, i.e., stable electrical characteristics, and has high reliability can be provided. A semiconductor device with normally-off electrical characteristics can be provided. A semiconductor device including a transistor with a high on-state current can be provided. A semiconductor device including a transistor with high frequency characteristics can be provided. A semiconductor device including a transistor with a low off-state current can be provided.

The structure of the semiconductor device including the transistor 200 of one embodiment of the present invention is described in detail below.

The conductor 205 is positioned to overlap with the oxide 230 and the conductor 260. The conductor 205 is preferably embedded in the insulator 216.

Here, the conductor 260 functions as a first gate (also referred to as a top gate) in some cases. The conductor 205 functions as a second gate (also referred to as a bottom gate) in some cases. In that case, the $V_{th}$ of the transistor 200 can be controlled by changing a potential applied to the conductor 205 independently of a potential applied to the conductor 260. In particular, when a negative potential is applied to the conductor 205, the $V_{th}$ of the transistor 200 can be higher than 0 V, and the off-state current can be reduced. Thus, a drain current when a potential applied to the conductor 260 is 0 V can be smaller in the case where a negative potential is applied to the conductor 205 than in the case where the negative potential is not applied to the conductor 205.

As illustrated in FIG. 1A, the size of the conductor 205 is preferably larger than the sizes of regions of the oxides 230a and 230b that do not overlap with the conductors 242a and 242b. As illustrated in FIG. 1C, it is particularly preferable that the conductor 205 extend beyond the end portions of the oxides 230a and 230b that intersect with the channel width direction. That is, the conductor 205 and the conductor 260 preferably overlap with each other with the insulators positioned therebetween outside side surfaces of the oxides 230a and 230b in the channel width direction. The large-sized conductor 205 can sometimes relieve local charging (also referred to as charge buildup) in treatment using plasma after the formation of the conductor 205 in the manufacturing process. However, one embodiment of the present invention is not limited thereto. The conductor 205 overlaps with at least the oxides 230a and 230b positioned between the conductors 242a and 242b.

When the bottom surface of the insulator 224 is used as a reference, the bottom surface of the conductor 260 in a region not overlapping with the oxides 230a and 230b is preferably positioned below the bottom surface of the oxide 230b. A distance between the bottom surface of the conductor 260 and the bottom surface of the oxide 230b in a region where the conductor 260 does not overlap with the oxide 230b is greater than or equal to 0 nm and less than or equal to 100 nm, preferably greater than or equal to 3 nm and less than or equal to 50 nm, and further preferably greater than or equal to 5 nm and less than or equal to 20 nm.

In this manner, the conductor 260 functioning as the gate covers the top and side surfaces of the oxide 230b in the channel formation region with the oxide 230c and the insulator 250 positioned therebetween; thus, an electric field of the conductor 260 is easily applied to the entire oxide 230b in the channel formation region. Accordingly, the transistor 200 can have higher on-state current and improved frequency characteristics. In this specification, such a transistor structure in which the channel formation region is electrically surrounded by the electric fields of the first gate and the second gate is referred to as a surrounded channel (s-channel) structure.

The conductor 205a preferably inhibits penetration of oxygen and impurities such as water and hydrogen. For example, the conductor 205a can be formed using titanium, titanium nitride, tantalum, or tantalum nitride. The conductor 205b is preferably formed using a conductive material containing tungsten, copper, or aluminum as its main component. The conductor 205 has a two-layer structure in the drawing but may have a multilayer structure of three or more layers.

Note that the oxide semiconductor, the insulator or conductor positioned below the oxide semiconductor, and the insulator or conductor positioned over the oxide semiconductor are preferably successively formed without exposure to the air, in which case a substantially highly purified intrinsic oxide semiconductor film with a reduced concentration of impurities (in particular, hydrogen and water) can be formed.

At least one of the insulators 211, 212, 214, 222, 272, 273, 282, 283, 284, 285, and 286 preferably functions as a barrier insulating film that inhibits entry of impurities such as water and hydrogen into the transistor 200 from the substrate side or from above the transistor 200. Therefore, at least one of the insulators 211, 212, 214, 222, 272, 273, 282, 283, 284, 285, and 286 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material through which the above impurities are less likely to pass. Alternatively, it is preferable to use an insulating material having a function of inhibiting diffusion of oxygen (e.g., at least one of oxygen atoms, oxygen molecules, and the like), that is, an insulating material through which the above oxygen is less likely to pass.

For example, it is preferable that the insulators 211, 212, 273, 283, 284, and 285 be formed using silicon nitride, silicon nitride oxide, or the like, and the insulators 214, 222, 272, and 282 be formed using aluminum oxide, hafnium oxide, or the like. Accordingly, impurities such as water and hydrogen can be inhibited from diffusing to the transistor 200 side from the substrate side through the insulators 211, 212, and 214. In addition, oxygen contained in the insulator 224 and the like can be inhibited from diffusing to the substrate side through the insulators 211, 212, and 214. Furthermore, impurities such as water and hydrogen can be inhibited from diffusing to the transistor 200 side from the insulator 274 and the like positioned above the insulators 272, 273, 282, and 283. In this manner, the transistor 200 is preferably surrounded by the insulators 211, 212, 214, 222, 272, 273, 282, and 283 having a function of inhibiting diffusion of oxygen and impurities such as water and hydrogen.

The hydrogen concentration of the insulator 212 is preferably lower than that of the insulator 211. Furthermore, the hydrogen concentration of the insulator 214 is preferably lower than that of the insulator 212. Such a structure can inhibit entry of hydrogen into the oxide 230 through the insulators 216, 222, and 224 and the conductor 205.

The resistivity of the insulators 211, 284, and 286 is preferably low in some cases. For example, the insulators 211, 284, and 286 with a resistivity of approximately $1 \times 10^{13}$ Ωcm can sometimes relieve charge buildup of the conductor 205, 242, 260, or 246 in the treatment using plasma or the like in the manufacturing process of a semiconductor device. The resistivity of the insulators 211, 284, and 286 is preferably higher than or equal to $1 \times 10^{10}$ Ωcm and lower than or equal to $1 \times 10^{15}$ Ωcm.

The dielectric constant of each of the insulators 216, 280, and 274 is preferably lower than that of the insulator 214. The use of a material having a low dielectric constant for an interlayer film can reduce the parasitic capacitance between wirings. For example, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used for the insulators 216, 280, and 274 as appropriate.

The insulators 222 and 224 function as a gate insulator.

Here, it is preferable that the insulator 224 in contact with the oxide 230 release oxygen by heating. In this specification, oxygen that is released by heating is referred to as excess oxygen in some cases. For example, silicon oxide or silicon oxynitride can be used for the insulator 224 as appropriate. When an insulator containing oxygen is provided in contact with the oxide 230, the amount of oxygen vacancies in the oxide 230 can be reduced, leading to an improvement in reliability of the transistor 200.

Specifically, the insulator 224 is preferably formed using an oxide material that releases part of oxygen by heating. An oxide that releases oxygen by heating is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 400° C.

The insulator 222 preferably functions as a barrier insulating film that inhibits entry of impurities such as water and hydrogen into the transistor 200 from the substrate side. For example, the insulator 222 preferably has a lower hydrogen permeability than the insulator 224. When the insulator 224, the oxide 230, and the like are surrounded by the insulators 222 and 283, entry of impurities such as water and hydrogen into the transistor 200 from the outside can be inhibited.

Furthermore, the insulator 222 preferably has a function of inhibiting diffusion of oxygen (e.g., at least one of oxygen atoms, oxygen molecules, and the like). That is, it is preferable that the above oxygen be less likely to pass through the insulator 222. For example, the insulator 222 preferably has a lower oxygen permeability than the insulator 224. The insulator 222 preferably has a function of inhibiting diffusion of oxygen or impurities, in which case diffusion of oxygen contained in the oxide 230 into a layer under the insulator 222 can be reduced. Furthermore, the conductor 205 can be inhibited from reacting with oxygen in the insulator 224 or the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. The insulator 222 formed of such a material functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

The insulator 222 may have a single-layer structure or a stacked-layer structure using an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST). With miniaturization and high integration of a transistor, a problem such as generation of leakage current may arise because of a thin gate insulator. When a high-k material is used for an insulator functioning as the gate insulator, a gate potential at the time of operating the transistor can be reduced while the physical thickness of the gate insulator is kept.

Note that the insulators 222 and 224 may each have a stacked-layer structure of two or more layers. In that case, the stacked layers are not necessarily formed of the same material and may be formed of different materials.

The oxide 243 (the oxides 243a and 243b) may be provided between the oxide 230b and the conductor 242 (the conductors 242a and 242b) functioning as a source electrode and a drain electrode. The conductor 242 and the oxide 230 are not in contact with each other, so that the conductor 242 can be inhibited from absorbing oxygen from the oxide 230. That is, preventing the oxidation of the conductor 242 can inhibit a decrease in the conductivity of the conductor 242. Accordingly, the oxide 243 preferably has a function of inhibiting the oxidation of the conductor 242.

Thus, the oxide 243 preferably has a function of inhibiting penetration of oxygen. The oxide 243 having a function of inhibiting penetration of oxygen is preferably provided between the oxide 230b and the conductor 242 functioning as the source electrode and the drain electrode, in which case the electrical resistance between the conductor 242 and the oxide 230b can be reduced. Such a structure can improve the electrical characteristics and reliability of the transistor 200.

A metal oxide containing an element M may be used as the oxide 243. In particular, aluminum, gallium, yttrium, or tin is preferably used as the element M The concentration of the element M in the oxide 243 is preferably higher than that in the oxide 230b. Alternatively, gallium oxide may be used as the oxide 243. Further alternatively, a metal oxide such as an In-M-Zn oxide may be used as the oxide 243. Specifically, the atomic ratio of the element M to In in the metal oxide used as the oxide 243 is preferably greater than that in the metal oxide used as the oxide 230b. The thickness of the oxide 243 is preferably greater than or equal to 0.5 nm and less than or equal to 5 nm, further preferably greater than or equal to 1 nm and less than or equal to 3 nm. The oxide 243 preferably has crystallinity. With the oxide 243 having crystallinity, release of oxygen from the oxide 230 can be effectively inhibited. When the oxide 243 has a hexagonal crystal structure, for example, release of oxygen from the oxide 230 can sometimes be inhibited.

Note that the oxide 243 is not necessarily provided. In that case, the conductor 242 (the conductors 242a and 242b) is in contact with the oxide 230, so that oxygen in the oxide 230 is diffused into the conductor 242 and thus the conductor 242 is oxidized, in some cases. The oxidation of the conductor 242 highly probably reduces the conductivity of the conductor 242. Note that diffusion of oxygen in the oxide 230 into the conductor 242 can be rephrased as absorption of oxygen in the oxide 230 by the conductor 242.

When oxygen in the oxide 230 is diffused into the conductor 242 (the conductors 242a and 242b), a layer might be formed between the oxide 230b and each of the conductors 242a and 242b. The layer contains a larger amount of oxygen than the conductor 242 and thus presumably has an insulating property. In that case, a three-layer structure of the conductor 242, the layer, and the oxide 230b can be regarded as a three-layer structure of a metal, an insulator, and a semiconductor and is sometimes referred to as a metal-insulator-semiconductor (MIS) structure or a diode-connected structure mainly with an MIS structure.

The layer is not necessarily formed between the conductor 242 and the oxide 230b; for example, the layer may be formed between the conductor 242 and the oxide 230c or between the conductor 242 and each of the oxides 230b and 230c.

The conductor 242 (the conductors 242a and 242b) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

It is preferable that the insulator 272 be provided in contact with the top surface of the conductor 242 and function as a barrier layer. Such a structure can inhibit the conductor 242 from absorbing excess oxygen in the insulator 280. Furthermore, inhibiting the oxidation of the conductor 242 can suppress an increase in the contact resistance between the transistor 200 and the wiring. Accordingly, the transistor 200 can have excellent electrical characteristics and reliability.

Thus, the insulator 272 preferably has a function of inhibiting oxygen diffusion. For example, the insulator 272 preferably has a function of inhibiting diffusion of much oxygen compared to the insulator 280. For example, an insulator containing an oxide of one or both of aluminum and hafnium is preferably formed as the insulator 272. For another example, an insulator containing aluminum nitride may be used as the insulator 272.

As illustrated in FIGS. 1B and 1D, the insulator 272 is in contact with the side surface and part of the top surface of the conductor 242b. In addition, the insulator 272 is in contact with the side surface and part of the top surface of the conductor 242a. The insulator 273 is provided over the insulator 272. Such a structure can inhibit the conductor 242 from absorbing oxygen added to the insulator 280, for example.

As illustrated in FIG. 1D, the insulator 241b is provided in contact with the side surface of the conductor 240b, and the insulator 285b is provided in contact with the side surface of the insulator 241b. The insulator 285b is preferably in contact with at least the insulators 274, 283, and 282. With such a structure, oxygen added to the insulator 280 can be inhibited from being absorbed by the conductor 240b through the insulators 285b and 241b, for example. In addition, impurities such as water and hydrogen contained in the insulators 274 and 280 can be inhibited from entering the oxide 230 through the conductors 240b and 242b. Although not illustrated, the insulator 241a is provided in contact with the side surface of the conductor 240a, and the insulator 285a is provided in contact with the side surface of the insulator 241a. The insulator 285a is preferably in contact with at least the insulators 274, 283, and 282. With such a structure, oxygen added to the insulator 280 can be inhibited from being absorbed by the conductor 240a through the insulators 285a and 241a, for example. In addition, impurities such as water and hydrogen contained in the insulators 274 and 280 can be inhibited from entering the oxide 230 through the conductors 240a and 242a.

As illustrated in FIG. 1D, the top and side surfaces of the conductor 246b are in contact with the insulator 286, and the bottom surface of the conductor 246b is in contact with the insulator 284b. That is, the conductor 246b is surrounded by the insulators 286 and 284b. With such a structure, entry of impurities such as water and hydrogen into the oxide 230 from the insulator 274 or from above the insulator 286 through the conductors 246b, 240b, and 242b can be inhibited. Although not illustrated, the top and side surfaces of the conductor 246a are in contact with the insulator 286, and the bottom surface of the conductor 246a is in contact with the insulator 284a. That is, the conductor 246a is surrounded by the insulators 286 and 284a. With such a structure, entry of impurities such as water and hydrogen into the oxide 230 from the insulator 274 or from above the insulator 286 through the conductors 246a, 240a, and 242a can be inhibited.

The insulator 250 functions as a gate insulator. The insulator 250 is preferably provided in contact with the top surface of the oxide 230c. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. Silicon oxide and silicon oxynitride, which have thermal stability, are particularly preferable.

Like the insulator 224, the insulator 250 is preferably formed using an insulator from which oxygen is released by heating. When the insulator from which oxygen is released by heating is provided, as the insulator 250, in contact with the top surface of the oxide 230c, oxygen can be effectively supplied to the channel formation region of the oxide 230b. Furthermore, as in the insulator 224, the concentration of impurities such as water and hydrogen in the insulator 250 is preferably lowered. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Providing the metal oxide that inhibits oxygen diffusion inhibits oxygen diffusion from the insulator 250 into the conductor 260. That is, a reduction in the amount of oxygen supplied to the oxide 230 can be inhibited. Moreover, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, the metal oxide is preferably a high-k material with a high dielectric constant. The gate insulator having a stacked-layer structure of the insulator 250 and the metal oxide can be thermally stable and can have a high dielectric constant. Accordingly, a gate potential applied during operation of the transistor can be reduced while the physical thickness of the gate insulator is kept. In addition, the equivalent oxide thickness (EOT) of an insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, for example, aluminum oxide, hafnium oxide, or an oxide containing aluminum and hafnium (hafnium aluminate).

The metal oxide functions as part of the gate in other cases. In this case, a conductive material containing oxygen is preferably formed on the channel formation region side. When the conductive material containing oxygen is formed on the channel formation region side, oxygen released from the conductive material is easily supplied to the channel formation region.

It is particularly preferable to use, for the conductor functioning as the gate, a conductive material containing oxygen and a metal element contained in a metal oxide in which a channel is formed. A conductive material containing any of the above metal elements and nitrogen may also be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may also be used. With the use of such a material, hydrogen contained in the metal oxide in which the channel is formed can be captured in some cases. Alternatively, hydrogen entering from a surrounding insulator or the like can be captured in some cases.

Although the conductor 260 has a two-layer structure in FIGS. 1A to 1D, the conductor 260 may have a single-layer structure or a stacked-layer structure of three or more layers.

The conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom. Alternatively, the conductor 260a is preferably formed using a conductive material having a function of inhibiting diffusion of oxygen (e.g., at least one of oxygen atoms, oxygen molecules, and the like).

When the conductor 260a has a function of inhibiting diffusion of oxygen, the conductivity of the conductor 260b can be prevented from being lowered because of oxidization of the conductor 260b due to oxygen in the insulator 250. As a conductive material having a function of inhibiting oxygen diffusion, tantalum, tantalum nitride, ruthenium, ruthenium oxide, or the like is preferably used, for example.

Furthermore, the conductor 260b is preferably formed using a conductive material containing tungsten, copper, or aluminum as its main component. The conductor 260 also functions as a wiring and thus is preferably a conductor having high conductivity. For example, a conductive material containing tungsten, copper, or aluminum as its main component can be used. The conductor 260b may have a stacked-layer structure, for example, a stacked-layer structure of any of the above conductive materials and titanium or titanium nitride.

For example, the insulator 280 preferably contains silicon oxide, silicon oxynitride, silicon nitride oxide, silicon oxide to which fluorine is added, silicon oxide to which carbon is added, silicon oxide to which carbon and nitrogen are added, porous silicon oxide, or the like. Silicon oxide and silicon oxynitride, which have thermal stability, are particularly preferable. Silicon oxide, silicon oxynitride, porous silicon oxide, and the like are particularly preferable because a region containing oxygen that is released by heating can be easily formed. The insulator 280 may have a stacked-layer structure of the above materials, for example, a stacked-layer structure of silicon oxide deposited by a sputtering method and silicon oxynitride deposited thereover by a CVD method. Silicon nitride may be stacked over the silicon oxynitride.

The concentration of impurities such as water and hydrogen in the insulator 280 is preferably lowered. The top surface of the insulator 280 may be planarized.

Each of the insulators 282 and 283 preferably functions as a barrier insulating film that inhibits entry of impurities such as water and hydrogen into the insulator 280 from above the insulators 282 and 283. Each of the insulators 282 and 283 preferably functions as a barrier insulating film that inhibits penetration of oxygen. For example, an insulator such as aluminum oxide, silicon nitride, or silicon nitride oxide may be used as the insulators 282 and 283. For example, aluminum oxide with a high oxygen barrier property may be used as the insulator 282, and silicon nitride or silicon nitride oxide with a high hydrogen barrier property may be used as the insulator 283.

The insulator 274 functioning as an interlayer film is preferably provided over the insulator 283. As in the insulator 224 or the like, the concentration of impurities such as water and hydrogen in the insulator 274 is preferably lowered.

The conductors 240a and 240b are preferably formed using a conductive material containing tungsten, copper, or aluminum as its main component. The conductors 240a and 240b may have a stacked-layer structure. Note that the conductors 240a and 240b each have a circular shape in the top view in FIG. 1A; however, the shapes of the conductors are not limited thereto. For example, in the top view, the conductors 240a and 240b may each have an almost circular shape such as an elliptical shape, a polygonal shape such as a quadrangular shape, or a polygonal shape such as a quadrangular shape with rounded corners.

The conductor 240 having a stacked-layer structure is preferably formed using a conductive material having a function of inhibiting penetration of oxygen and impurities such as water and hydrogen. For example, tantalum, tantalum nitride, titanium, titanium nitride, ruthenium, or ruthenium oxide is preferably used. The conductive material having a function of inhibiting penetration of oxygen and impurities such as water and hydrogen may have a single-layer structure or a stacked structure. With the use of the conductive material, entry of impurities such as water and hydrogen diffused from the insulator 280 or the like into the oxide 230 through the conductors 240a and 240b can be further suppressed. Furthermore, oxygen added to the insulator 280 can be prevented from being absorbed by the conductors 240a and 240b.

An insulator such as silicon nitride, aluminum oxide, or silicon nitride oxide may be used as the insulators 241a and 241b, for example. The insulators 241a and 241b are provided in contact with the insulators 274, 283, 282, 280, 273, and 272 and thus can inhibit entry of impurities such as water and hydrogen from the insulator 280 or the like into the oxide 230 through the conductors 240a and 240b. In particular, silicon nitride is suitable because of its high hydrogen blocking property. Furthermore, oxygen contained in the insulator 280 can be prevented from being absorbed by the conductors 240a and 240b.

The conductor 246 (the conductors 246a and 246b) functioning as a wiring may be provided in contact with the top surfaces of the conductors 240a and 240b. The conductor 246 is preferably formed using a conductive material containing tungsten, copper, or aluminum as its main component. The conductor may have a stacked-layer structure, for example, a stacked layer of any of the above conductive materials and titanium or titanium nitride. Note that the conductor may be embedded in an opening provided in an insulator.

<Materials for Semiconductor Device>

Materials that can be used for a semiconductor device are described below.

<Substrate>

As a substrate where the transistor 200 is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. Other examples include a semiconductor substrate in which an insulator region is provided in the above semiconductor substrate, e.g., a silicon on insulator (SOI) substrate. Examples of the conductor substrate include a graphite substrate, a metal substrate, an alloy substrate, and a conductive resin substrate. A substrate containing a nitride of a metal, a substrate including an oxide of a metal, or the like can also be used. An insulator substrate provided with a conductor or a semiconductor, a semiconductor substrate provided with a conductor or an insulator, a conductor substrate provided with a semiconductor or an insulator, or the like may be used. Alternatively, any of these substrates provided with an element may be used. Examples of the element provided over the substrate include a capacitor, a resistor, a switching element, a light-emitting element, and a memory element.

<Insulator>

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of a transistor, for example, a problem such as generation of leakage current may arise because of a thin gate insulator. When a high-k material is used for an insulator functioning as a gate insulator, the driving voltage of the transistor can be reduced while the physical thickness of the gate insulator is kept. By contrast, when a material having a low dielectric constant is used for an insulator functioning as an interlayer film, the parasitic capacitance between wirings can be reduced. Accordingly, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon oxide to which fluorine is added, silicon oxide to which carbon is added, silicon oxide to which carbon and nitrogen are added, porous silicon oxide, and a resin.

When a transistor including an oxide semiconductor is surrounded by an insulator having a function of inhibiting penetration of oxygen and impurities such as hydrogen, the electrical characteristics of the transistor can be stabilized. The insulator having a function of inhibiting penetration of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting penetration of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

The insulator functioning as a gate insulator preferably includes a region containing oxygen that is released by heating. For example, when silicon oxide or silicon oxynitride that includes a region containing oxygen released by heating is in contact with the oxide 230, oxygen vacancies in the oxide 230 can be compensated for.

<Conductor>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, or an oxide containing lanthanum and nickel is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electric conductivity typified by polycrystalline silicon containing an impurity element such as phosphorus, or silicide such as nickel silicide may be used.

Conductive layers formed using any of the above materials may be stacked. For example, a stacked-layer structure combining a material containing any of the above metal elements and a conductive material containing oxygen may be used. Alternatively, a stacked-layer structure combining a material containing any of the above metal elements and a conductive material containing nitrogen may be used. Further alternatively, a stacked-layer structure combining a material containing any of the above metal elements, a conductive material containing oxygen, and a conductive material containing nitrogen may be used.

When an oxide is used for the channel formation region of the transistor, the conductor functioning as the gate preferably employs a stacked-layer structure combining a material containing any of the above metal elements and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide in which the channel is formed. A conductive material containing any of the above metal elements and nitrogen may also be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide in which the channel is formed can be captured in some cases. Alternatively, hydrogen entering from a surrounding insulator or the like can be captured in some cases.

<Metal Oxide>

As the oxide 230, a metal oxide functioning as an oxide semiconductor is preferably used. A metal oxide that can be used as the oxide 230 of the present invention is described below.

The metal oxide preferably contains at least indium or zinc. In particular, indium and zinc are preferably contained. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide that contains indium, an element M, and zinc is considered. The element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also referred to as a metal oxide in some cases. Moreover, a metal oxide containing nitrogen may be referred to as a metal oxynitride.

[Structure of Metal Oxide]

An oxide semiconductor (metal oxide) is classified into a single crystal oxide semiconductor and a non-single-crystal oxide semiconductor. Examples of a non-single-crystal oxide semiconductor include a CAAC-OS, a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear grain boundary even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, an In layer) and a layer containing the element M, zinc, and oxygen (hereinafter, an (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, M) layer.

The CAAC-OS is a metal oxide with high crystallinity. By contrast, in the CAAC-OS, a reduction in electron mobility due to a grain boundary is less likely to occur because it is difficult to observe a clear grain boundary. Entry of impurities, formation of defects, or the like might decrease the crystallinity of a metal oxide. This means that the CAAC-OS is a metal oxide having small amounts of impurities and defects (e.g., oxygen vacancies (Vo)). Thus, a metal oxide including the CAAC-OS is physically stable. Accordingly, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that an indium-gallium-zinc oxide (hereinafter, IGZO) that is a metal oxide containing indium, gallium, and zinc has a stable structure in some cases by being formed of the above-described nanocrystals. In particular, IGZO crystals tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is a metal oxide having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor (metal oxide) can have any of various structures that show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

Note that a structure of an oxide semiconductor (metal oxide) in the semiconductor device of one embodiment of the present invention is not particularly limited; however, the oxide semiconductor (metal oxide) preferably has crystallinity. For example, the oxide 230 can have a CAAC-OS structure, and the oxide 243 can have a hexagonal crystal structure. When the oxides 230 and 243 have the above-described crystal structures, a highly reliable semiconductor device can be provided. The oxides 230*a*, 230*c*, and 243 can have substantially the same compositions.

[Impurity]

Here, the influence of impurities in the metal oxide is described.

When the metal oxide contains an alkali metal or an alkaline earth metal, defect states are formed and carriers are generated, in some cases. Thus, a transistor including, in a channel formation region, a metal oxide that contains an alkali metal or an alkaline earth metal is likely to be normally on. Therefore, it is preferable to reduce the concentration of an alkali metal or an alkaline earth metal in the metal oxide. Specifically, the concentration of an alkali metal or an alkaline earth metal in the metal oxide, which is measured by SIMS, is lower than or equal to $1 \times 10^{18}$ atoms/cm$^3$, preferably lower than or equal to $2 \times 10^{16}$ atoms/cm$^3$.

Hydrogen contained in a metal oxide reacts with oxygen bonded to a metal atom to be water, and thus sometimes causes oxygen vacancies. Entry of hydrogen into the oxygen vacancies generates electrons serving as carriers in some cases. Furthermore, in some cases, bonding of part of hydrogen to oxygen bonded to a metal atom generates electrons serving as carriers. Thus, a transistor including a metal oxide that contains hydrogen is likely to be normally on. For this reason, hydrogen in the metal oxide is preferably reduced as much as possible.

As a metal oxide used for a semiconductor of a transistor, a thin film having high crystallinity is preferably used. With the thin film, the stability or reliability of the transistor can be improved. As the thin film, for example, a thin film of a single crystal metal oxide or a thin film of a polycrystalline metal oxide can be used. However, for forming the thin film of a single crystal metal oxide or the thin film of a polycrystalline metal oxide over a substrate, a high-temperature process or a laser heating process is needed. Thus, the manufacturing cost is increased, and moreover, the throughput is decreased.

<Other Semiconductor Materials>

A semiconductor material that can be used for the oxide 230 is not limited to the above metal oxides. A semiconductor material having a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material, a two-dimensional material, or the like) is preferably used as the semiconductor material. The layered material functioning as a semiconductor is particularly suitable as the semiconductor material.

Note that in this specification and the like, the layered material generally refers to a group of materials having a layered crystal structure. The layered crystal structure refers to a structure in which layers formed by a covalent bond or an ionic bond are stacked with a bond that is weaker than the covalent bond or the ionic bond, such as a van der Waals force. The layered material has high electrical conductivity in a monolayer, that is, high two-dimensional electrical conductivity. With the use of a material functioning as a semiconductor and having high two-dimensional electrical conductivity in a channel formation region, a transistor with a high on-state current can be provided.

Examples of the layered material include graphene, silicene, and chalcogenide. Chalcogenide is a compound containing chalcogen. Chalcogen is a general term of Group 16 elements such as oxygen, sulfur, selenium, tellurium, polonium, and livermorium. Examples of chalcogenide include chalcogenide of transition metals and chalcogenide of Group 13 elements.

Chalcogenide of transition metals that functions as a semiconductor is preferably used as the oxide 230, for example. Specific examples of chalcogenide of transition metals that can be used as the oxide 230 include molybdenum sulfide (typically, $MoS_2$), molybdenum selenide (typically, $MoSe_2$), molybdenum telluride (typically, $MoTe_2$), tungsten sulfide (typically, $WS_2$), tungsten selenide (typically, $WSe_2$), tungsten telluride (typically, $WTe_2$), hafnium sulfide (typically, $HfS_2$), hafnium selenide (typically, $HfSe_2$), zirconium sulfide (typically, $ZrS_2$), and zirconium selenide (typically, $ZrSe_2$).

<Method for Manufacturing Semiconductor Device>

Next, a method for manufacturing a semiconductor device including the transistor 200 of the present invention that is illustrated in FIGS. 1A to 1D is described with reference to FIGS. 4A to 4D to FIGS. 19A to 19D. FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG. 19A are top views. FIG. 4B, FIG. 5B, FIG. 6B, FIG. 7B, FIG. 8B, FIG. 9B, FIG. 10B, FIG. 11B, FIG. 12B, FIG. 13B, FIG. 14B, FIG. 15B, FIG. 16B, FIG. 17B, FIG. 18B, and FIG. 19B are cross-sectional views taken along the dashed-dotted lines A1-A2 in FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG. 19A, which correspond to cross-sectional views in the channel length direction of the transistor 200. FIG. 4C, FIG. 5C, FIG. 6C, FIG. 7C, FIG. 8C, FIG. 9C, FIG. 10C, FIG. 11C, FIG. 12C, FIG. 13C, FIG. 14C, FIG. 15C, FIG. 16C, FIG. 17C, FIG. 18C, and FIG. 19C are cross-sectional views taken along the dashed-dotted lines A3-A4 in FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG. 19A, which correspond to cross-sectional views in the channel width direction of the transistor 200. FIG. 4D, FIG. 5D, FIG. 6D, FIG. 7D, FIG. 8D, FIG. 9D, FIG. 10D, FIG. 11D, FIG. 12D, FIG. 13D, FIG. 14D, FIG. 15D, FIG. 16D, FIG. 17D, FIG. 18D, and FIG. 19D are cross-sectional views taken along the dashed-dotted lines A5-A6 in FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG. 19A. Note that in the top views of FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG. 19A, some components are not illustrated for simplification of the drawings.

First, a substrate (not illustrated) is prepared, and the insulator 211 is formed over the substrate. The insulator 211 can be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, CVD methods can be classified into a metal CVD (MCVD) method and a metal organic CVD (MOCVD) method according to a source gas. In addition, according to the pressure in deposition, CVD methods can be classified into an atmospheric pressure CVD (APCVD) method, in which deposition is performed under the atmospheric pressure, and a low pressure CVD (LPCVD) method, in which deposition is performed under pressure lower than the atmospheric pressure.

A PECVD method enables a high-quality film to be obtained at a relatively low temperature. A thermal CVD method does not use plasma and thus causes less plasma damage to an object. For example, a wiring, an electrode, an element (e.g., a transistor or a capacitor), or the like included in a semiconductor device might be charged up by receiving charge from plasma. In that case, accumulated charge might break the wiring, electrode, element, or the like included in the semiconductor device. By contrast, when a thermal CVD method not using plasma is employed, such plasma damage is not caused and the yield of the semiconductor device can be increased. Furthermore, a film with few defects can be obtained by a thermal CVD method because plasma damage during deposition is not caused.

As an ALD method, a thermal ALD method, in which reaction between a precursor and a reactant is performed using only thermal energy, a plasma-enhanced ALD (PEALD) method, in which a plasma-enhanced reactant is used, or the like can be used.

In an ALD method, one atomic layer can be deposited at a time using self-controllability of atoms. Thus, an ALD method has various advantages such as deposition of an extremely thin film, deposition on a component with a high aspect ratio, deposition of a film with few defects such as pinholes, deposition with excellent coverage, and low-temperature deposition. The use of plasma in a PEALD method is sometimes preferable because deposition at a lower temperature is possible. Note that a precursor used in an ALD method sometimes contains impurities such as carbon. Thus, a film formed by an ALD method may contain impurities such as carbon in a larger amount than a film formed by another deposition method. Note that impurities can be quantified by X-ray photoelectron spectroscopy (XPS).

Unlike in a deposition method in which particles ejected from a target or the like are deposited, a film is formed by reaction at a surface of an object in a CVD method and an ALD method. Thus, a CVD method and an ALD method can provide good step coverage, almost regardless of the shape of an object. In particular, an ALD method enables excellent step coverage and excellent thickness uniformity and can be suitably used to cover a surface of an opening portion with a high aspect ratio, for example. Note that an ALD method has a relatively low deposition rate; hence, in some cases, an ALD method is preferably combined with another deposition method with a high deposition rate, such as a CVD method.

When a CVD method or an ALD method is employed, the composition of a film to be formed can be controlled with the flow rate ratio of the source gases. For example, in a CVD method or an ALD method, a film with a certain composition can be formed by adjusting the flow rate ratio of the source gases. Moreover, in a CVD method or an ALD method, by changing the flow rate ratio of the source gases during the deposition, a film whose composition is continuously changed can be formed. In the case where a film is formed while the flow rate ratio of the source gases is changed, as compared to the case where a film is formed using a plurality of deposition chambers, the time taken for the deposition can be shortened because the time taken for transfer and pressure adjustment is omitted. Consequently, semiconductor devices can be manufactured with high productivity in some cases.

In this embodiment, as the insulator 211, silicon nitride is deposited by a CVD method. Then, the insulator 212 is formed over the insulator 211. The insulator 212 can be formed by a sputtering method, a CVD method, an MBE method, a PLD method, an ALD method, or the like. In this embodiment, as the insulator 212, silicon nitride is deposited by a sputtering method.

Next, the insulator 214 is formed over the insulator 212. The insulator 214 can be formed by a sputtering method, a CVD method, an MBE method, a PLD method, an ALD method, or the like. In this embodiment, aluminum oxide is used as the insulator 214.

Even when a metal that is easily diffused, such as copper, is used for a conductor (not illustrated) under the insulator 211, the use of an insulator through which copper is less likely to pass, such as silicon nitride, as the insulators 211 and 212 and the provision of the insulator 214 over the insulator 212 can inhibit diffusion of the metal into a layer over the insulator 212 through the insulators 211 and 212. The use of an insulator through which impurities such as water and hydrogen are less likely to pass, such as silicon nitride, can inhibit diffusion of impurities such as water and hydrogen from a layer under the insulator 211.

It is preferable that the hydrogen concentration of the insulator 212 be lower than that of the insulator 211, and the hydrogen concentration of the insulator 214 be lower than that of the insulator 212. The insulator 212 formed using silicon nitride by a sputtering method can have lower hydrogen concentration than the insulator 211 formed using silicon nitride by a CVD method. The insulator 214 formed using aluminum oxide can have lower hydrogen concentration than the insulator 212.

The transistor 200 is formed over the insulator 214 in a later step. It is preferable that a film near the transistor 200 have a relatively low hydrogen concentration and a film with a relatively high hydrogen concentration be away from the transistor 200.

Next, the insulator 216 is formed over the insulator 214. The insulator 216 can be formed by a sputtering method, a CVD method, an MBE method, a PLD method, an ALD method, or the like. In this embodiment, silicon oxide or silicon oxynitride is used as the insulator 216. The insulator 216 is preferably formed by a deposition method using the gas in which the number of hydrogen atoms is reduced or hydrogen atoms are removed. Thus, the hydrogen concentration of the insulator 216 can be reduced.

Then, an opening reaching the insulator 214 is formed in the insulator 216. Examples of the opening include a groove and a slit. A region where an opening is formed may be referred to as an opening portion. The opening may be formed by wet etching; however, dry etching is preferable for microfabrication. The insulator 214 is preferably an insulator that functions as an etching stopper film when a groove is formed by etching of the insulator 216. For example, in the case where a silicon oxide film or a silicon oxynitride film is used as the insulator 216 in which the groove is to be formed, the insulator 214 is preferably a silicon nitride film, an aluminum oxide film, or a hafnium oxide film.

After the formation of the opening, a conductive film to be the conductor 205a is formed. The conductive film desirably contains a conductor that has a function of inhibiting the penetration of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 205a can be formed by a sputtering method, a CVD method, an MBE method, a PLD method, an ALD method, or the like.

In this embodiment, the conductive film to be the conductor 205a has a multilayer structure. First, tantalum nitride is deposited by a sputtering method, and titanium nitride is stacked over the tantalum nitride. Even when a metal that is easily diffused, such as copper, is used for a conductive film to be the conductor 205b described later, the use of such metal nitride for a layer under the conductor 205b can inhibit diffusion of the metal to the outside from the conductor 205a.

Next, the conductive film to be the conductor 205b is formed. This conductive film can be formed by a plating method, a sputtering method, a CVD method, an MBE method, a PLD method, an ALD method, or the like. In this embodiment, as the conductive film to be the conductor 205b, a low-resistant conductive material such as copper is deposited.

Next, by chemical mechanical polishing (CMP) treatment, the conductive film to be the conductor 205a and the conductive film to be the conductor 205b are partly removed so that the insulator 216 is exposed. As a result, the conductors 205a and 205b remain only in the opening portion. In this way, the conductor 205 with a flat top surface can be formed. Note that the insulator 216 is partly removed by the CMP treatment in some cases (see FIGS. 4A to 4D).

Although the conductor 205 is embedded in the opening of the insulator 216 in the above description, this embodiment is not limited to this structure. For example, the surface of the conductor 205 may be exposed in the following manner: the conductor 205 is formed over the insulator 214, the insulator 216 is formed over the conductor 205, and the insulator 216 is subjected to the CMP treatment so that the insulator 216 is partly removed.

Then, the insulator 222 is formed over the insulator 216 and the conductor 205. An insulator containing an oxide of one or both of aluminum and hafnium is preferably formed as the insulator 222. As the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, diffusion of hydrogen and water contained in components provided around the transistor 200 into the transistor 200 through the insulator 222 is inhibited, and generation of oxygen vacancies in the oxide 230 can be inhibited.

The insulator 222 can be formed by a sputtering method, a CVD method, an MBE method, a PLD method, an ALD method, or the like.

Then, the insulator 224 is formed over the insulator 222. The insulator 224 can be formed by a sputtering method, a CVD method, an MBE method, a PLD method, an ALD method, or the like. In this embodiment, silicon oxide or silicon oxynitride is used as the insulator 224. The insulator 224 is preferably formed by a deposition method using the gas in which the number of hydrogen atoms is reduced or hydrogen atoms removed. Thus, the hydrogen concentration of the insulator 224 can be reduced. The hydrogen concentration of the insulator 224 is preferably reduced because the insulator 224 is in contact with the oxide 230a in a later step.

Subsequently, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere, an inert gas atmosphere, or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, treatment is performed at 400° C. in a nitrogen atmosphere for one hour, and another treatment is successively performed at 400° C. in an oxygen atmosphere for one hour. By the heat treatment, impurities such as water and hydrogen in the insulator 224 can be removed.

The heat treatment may be performed after the insulator 222 is formed. For the heat treatment, the above-described heat treatment conditions can be employed.

Here, in order to form an excess-oxygen region in the insulator 224, plasma treatment using oxygen may be performed under a reduced pressure. The plasma treatment using oxygen is preferably performed with an apparatus including a power source for generating high-density plasma using microwaves, for example. Alternatively, the apparatus may include a power source for applying a high-frequency wave such as RF to the substrate side. The use of high-density plasma enables high-density oxygen radicals to be generated, and application of the RF to the substrate side allows oxygen radicals generated by the high-density plasma to be efficiently introduced into the insulator 224. Alternatively, after plasma treatment using an inert gas with the apparatus, plasma treatment using oxygen may be performed in order to compensate for released oxygen. Note that impurities such as water and hydrogen contained in the insulator 224 can be removed by selecting the conditions of the plasma treatment appropriately. In that case, the heat treatment is not necessarily performed.

Here, aluminum oxide may be deposited over the insulator 224 by a sputtering method, for example, and then subjected to CMP treatment until the insulator 224 is exposed. The CMP treatment can planarize and smooth the surface of the insulator 224. When the CMP treatment is performed while the aluminum oxide is placed over the insulator 224, it is easy to detect the endpoint of the CMP treatment. Part of the insulator 224 may be polished by the CMP treatment so that the thickness of the insulator 224 may be reduced; the thickness of the insulator 224 is adjusted at the time of the formation of the insulator 224. Planarizing and smoothing the surface of the insulator 224 can sometimes prevent deterioration of the coverage with an oxide deposited later and a decrease in yield of the semiconductor device. Moreover, it is preferable to deposit aluminum oxide over the insulator 224 by a sputtering method, in which case oxygen can be added to the insulator 224.

Next, an oxide film 230A and an oxide film 230B are formed in this order over the insulator 224 (see FIGS. 4A to 4D). It is preferable to form the oxide films successively without exposure to the air. When the oxide films 230A and 230B are formed without exposure to the air, impurities or moisture from the air can be prevented from being attached to the oxide films 230A and 230B, so that the interface between the oxide films 230A and 230B and the vicinity of the interface can be kept clean.

The oxide films 230A and 230B can be formed by a sputtering method, a CVD method, an MBE method, a PLD method, an ALD method, or the like.

When the oxide films 230A and 230B are formed by a sputtering method, for example, oxygen or a mixed gas of oxygen and a rare gas is used as a sputtering gas. An increase in the proportion of oxygen in the sputtering gas can increase the amount of excess oxygen contained in the oxide film to be formed. Moreover, when the oxide films are formed by a sputtering method, a target of the In-M-Zn oxide can be used, for example.

In particular, in the formation of the oxide film 230A, part of oxygen contained in the sputtering gas is supplied to the insulator 224 in some cases. Therefore, the proportion of oxygen in the sputtering gas for the formation of the oxide film 230A is preferably 70% or higher, further preferably 80% or higher, still further preferably 100%.

When the oxide film 230B is formed by a sputtering method and the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor in a channel formation region can have relatively high field-effect mobility. In addition, when the oxide film is formed while the substrate is being heated, the crystallinity of the oxide film can be improved. However, one embodiment of the present invention is not limited thereto. When the oxide film 230B is formed by a sputtering method and the proportion of oxygen in the sputtering gas is higher than 30% and lower than or equal to 100%, preferably higher than or equal to 70% and lower than or equal to 100%, an oxygen-excess oxide semiconductor is formed. A transistor including an oxygen-excess oxide semiconductor in a channel formation region can have relatively high reliability.

In this embodiment, the oxide film 230A is formed by a sputtering method using a target with an atomic ratio of In:Ga:Zn=1:1:0.5 (2:2:1) or In:Ga:Zn=1:3:4. The oxide film 230B is formed by a sputtering method using a target with an atomic ratio of In:Ga:Zn=4:2:4.1 or In:Ga:Zn=1:1:1.

Note that each of the oxide films is preferably formed by appropriate selection of deposition conditions and the atomic ratio to have characteristics required for the oxide 230.

Next, heat treatment may be performed. For the heat treatment, the above-described heat treatment conditions can be employed. By the heat treatment, impurities such as water and hydrogen in the oxide films 230A and 230B can be removed, for example. In this embodiment, treatment is performed at 400° C. in a nitrogen atmosphere for one hour, and another treatment is successively performed at 400° C. in an oxygen atmosphere for one hour.

Next, an oxide film 243A is formed over the oxide film 230B (see FIGS. 4A to 4D). The oxide film 243A can be formed by a sputtering method, a CVD method, an MBE method, a PLD method, an ALD method, or the like. The atomic ratio of Ga to In in the oxide film 243A is preferably greater than that in the oxide film 230B. In this embodiment, the oxide film 243A is formed by a sputtering method using a target with an atomic ratio of In:Ga:Zn=1:3:4.

Next, a conductive film 242A is formed over the oxide film 243A (see FIGS. 4A to 4D). The conductive film 242A can be formed by a sputtering method, a CVD method, an MBE method, a PLD method, an ALD method, or the like.

Next, the oxide film 230A, the oxide film 230B, the oxide film 243A, and the conductive film 242A are processed into an island shape by a lithography method, so that the oxide 230a, the oxide 230b, an oxide layer 243B, and a conductor layer 242B are formed (see FIGS. 5A to 5D). Here, the oxide 230a, the oxide 230b, the oxide layer 243B, and the conductor layer 242B are formed to at least partly overlap with the conductor 205. The processing can be performed by a dry etching method or a wet etching method. A dry etching method is suitable for microfabrication. Note that in this step, the thickness of the insulator 224 in a region not overlapping with the oxide 230a is reduced in some cases.

In the lithography method, first, a resist is exposed to light through a mask. Next, a region exposed to light is removed or left using a developing solution, so that a resist mask is formed. Then, etching is conducted with the resist mask, whereby a conductor, a semiconductor, an insulator, or the like can be processed into a desired shape. The resist mask is formed, for example, by exposing the resist to KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be used. Alternatively, wet etching treatment can be performed after dry etching treatment, or dry etching treatment can be performed after wet etching treatment.

A hard mask formed of an insulator or a conductor may be used instead of the resist mask. In the case of using a hard mask, a hard mask with a desired shape can be formed in the following manner: an insulating film or a conductive film that is the material of the hard mask is formed over the conductive film 242A, a resist mask is formed thereover, and then the material of the hard mask is etched. The etching of the conductive film 242A or the like may be performed after or without removal of the resist mask. In the latter case, the resist mask is sometimes removed during the etching. The hard mask may be removed by etching after the etching of the conductive film 242A or the like. The hard mask does not need to be removed when the material of the hard mask does not affect the following process or can be utilized in the following process.

As a dry etching apparatus, a capacitively coupled plasma (CCP) etching apparatus including parallel plate electrodes can be used. The capacitively coupled plasma etching apparatus including parallel plate electrodes may have a structure in which high-frequency power is applied to one of the parallel plate electrodes. Alternatively, different high-frequency powers may be applied to one of the parallel plate electrodes. Further alternatively, high-frequency powers with the same frequency may be applied to the parallel plate electrodes. Still further alternatively, high-frequency powers with different frequencies may be applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

It is preferable that the side surfaces of the oxide 230a, the oxide 230b, the oxide layer 243B, and the conductor layer 242B be substantially perpendicular to the top surface of the insulator 222. When the side surfaces of the oxide 230a, the oxide 230b, the oxide layer 243B, and the conductor layer 242B are substantially perpendicular to the top surface of the insulator 222, a plurality of transistors 200 can be provided in a smaller area and at a higher density. However, without being limited thereto, the angle formed between the side surfaces of the oxide 230a, the oxide 230b, the oxide layer 243B, and the conductor layer 242B and the top surface of the insulator 222 may be an acute angle.

Then, the insulator 272 is formed over the insulator 224, the oxide 230a, the oxide 230b, the oxide layer 243B, and the conductor layer 242B (see FIGS. 6A to 6D). The insulator 272 can be formed by a sputtering method, a CVD method, an MBE method, a PLD method, an ALD method, or the like. In this embodiment, aluminum oxide is deposited as the insulator 272 by a sputtering method. When aluminum oxide is deposited by a sputtering method, oxygen can be supplied to the insulator 224.

Then, the insulator 273 is formed over the insulator 272. The insulator 273 can be formed by a sputtering method, a CVD method, an MBE method, a PLD method, an ALD method, or the like. In this embodiment, silicon nitride is deposited as the insulator 273 by a sputtering method (see FIGS. 6A to 6D).

Next, an insulating film to be the insulator 280 is formed. The insulating film to be the insulator 280 can be formed by a sputtering method, a CVD method, an MBE method, a PLD method, an ALD method, or the like. For example, as the insulator 280, a silicon oxide film is formed by a sputtering method and another silicon oxide film is formed thereover by a PEALD method or a thermal ALD method. The insulating film to be the insulator 280 is preferably formed by a deposition method using the gas in which the number of hydrogen atoms is reduced or hydrogen atoms are removed. Thus, the hydrogen concentration of the insulator 280 can be reduced.

Next, the insulating film to be the insulator 280 is subjected to CMP treatment, so that the insulator 280 having a flat top surface is formed (see FIGS. 7A to 7D). Note that as in the insulator 224, aluminum oxide may be deposited over the insulator 280 by a sputtering method, for example, and then subjected to CMP treatment until the insulator 280 is exposed.

Next, the insulator 280, the insulator 273, the insulator 272, the conductor layer 242B, and the oxide layer 243B are partly processed to form an opening reaching the oxide 230b (see FIGS. 8A to 8D). The opening is preferably formed to overlap with the conductor 205. The conductor 242a, the conductor 242b, the oxide 243a, and the oxide 243b are formed by the formation of the opening.

The insulator 280, the insulator 273, the insulator 272, the oxide layer 243B, and the conductor layer 242B can be partly processed by a dry etching method or a wet etching method. A dry etching method is suitable for microfabrication. The processing may be performed under different conditions. For example, part of the insulator 280 may be processed by a dry etching method, part of the insulator 273 may be processed by a wet etching method, part of the insulator 272 may be processed by a dry etching method, and part of the oxide layer 243B and part of the conductor layer 242B may be processed by a dry etching method.

In some cases, treatment such as dry etching performed in the above process causes the attachment or diffusion of impurities due to an etching gas or the like to a surface or an inside of the oxide 230a, the oxide 230b, or the like. Examples of the impurities include fluorine and chlorine.

In order to remove the impurities or the like, cleaning is performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which oxalic acid, phosphoric acid, ammonia water, hydrofluoric acid, or the like is diluted with carbonated water or pure water. Alternatively, ultrasonic cleaning using pure water or carbonated water may be performed.

Through the processing such as dry etching or the cleaning treatment, a region of the oxide 230b that does not overlap with the oxides 243a and 243b is sometimes thinner than regions of the oxide 230b that overlap with the oxides 243a and 243b (see FIGS. 8A to 8D).

After the etching or the cleaning treatment, heat treatment may be performed. The heat treatment is performed at a temperature higher than or equal to 100° C. and lower than or equal to 450° C., preferably higher than or equal to 350° C. and lower than or equal to 400° C., for example. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxides 230a and 230b to reduce the amount of oxygen vacancies Vo. The heat treatment may be performed under a reduced pressure. Alternatively, the heat treatment may be performed in an oxygen atmosphere, and then another heat treatment may be successively performed in a nitrogen atmosphere without exposure to the air.

Next, an oxide film 230C is formed (see FIGS. 9A to 9D). The heat treatment may be performed before the oxide film 230C is formed. It is preferable that the heat treatment be performed under a reduced pressure and the oxide film 230C be successively formed without exposure to the air. The heat treatment is preferably performed in an oxygen-containing atmosphere. Such treatment can remove moisture and hydrogen adsorbed on the surface of the oxide 230b or the like and can reduce the moisture concentration and the hydrogen concentration of the oxides 230a and 230b. The temperature of the heat treatment is preferably higher than or equal to 100° C. and lower than or equal to 400° C., further preferably higher than or equal to 150° C. and lower than or equal to 350° C. In this embodiment, the heat treatment is performed at 200° C. under a reduced pressure.

Note that the oxide film 230C is preferably provided at least partly in contact with the top surface of the oxide 230b and the side surfaces of the oxide 243, the conductor 242, the insulator 272, the insulator 273, and the insulator 280. When the conductor 242 is surrounded by the oxide 243, the insulator 272, the insulator 273, and the oxide film 230C, a decrease in the conductivity of the conductor 242 due to oxidation in a later step can be inhibited.

The oxide film 230C can be formed by a sputtering method, a CVD method, an MBE method, a PLD method, an ALD method, or the like. The atomic ratio of Ga to In in the oxide film 230C is preferably greater than that in the oxide film 230B. In this embodiment, the oxide film 230C is formed by a sputtering method using a target with an atomic ratio of In:Ga:Zn=1:3:4.

Note that the oxide film 230C may have a stacked-layer structure. For example, the oxide film 230C may be formed by a sputtering method using a target with an atomic ratio of In:Ga:Zn=4:2:4.1 and successively using a target with an atomic ratio of In:Ga:Zn=1:3:4.

Part of oxygen contained in the sputtering gas is sometimes supplied to the oxides 230a and 230b during the formation of the oxide film 230C. Alternatively, part of oxygen contained in the sputtering gas is sometimes supplied to the insulator 280 during the formation of the oxide film 230C. Therefore, the proportion of oxygen in the sputtering gas for the oxide film 230C is preferably 70% or higher, further preferably 80% or higher, still further preferably 100%.

Next, heat treatment may be performed. The heat treatment may be performed under a reduced pressure, and an insulating film 250A may be successively formed without exposure to the air. The heat treatment can remove moisture and hydrogen adsorbed on the surface of the oxide film 230C or the like and can reduce the moisture concentration and the hydrogen concentration of the oxide 230a, the oxide 230b, and the oxide film 230C. The temperature of the heat treatment is preferably higher than or equal to 100° C. and lower than or equal to 400° C. In this embodiment, the heat treatment is performed at 200° C.

Next, the insulating film 250A is formed over the oxide film 230C (see FIGS. 9A to 9D). The insulating film 250A can be formed by a sputtering method, a CVD method, an MBE method, a PLD method, an ALD method, or the like. The insulating film 250A is preferably formed by a deposition method using the gas in which the number of hydrogen atoms is reduced or hydrogen atoms are removed. Thus, the hydrogen concentration of the insulating film 250A can be reduced. The hydrogen concentration of the insulating film 250A is preferably reduced because the insulating film 250A becomes the insulator 250 that is in contact with the oxide 230c in a later step.

Next, irradiation with a high-frequency wave such as a microwave or RF may be performed. The irradiation high-frequency wave such as a microwave or RF enters the insulator 280, the oxide 230b, and the oxide 230a and removes hydrogen therein. In particular, in the oxides 230a and 230b, a reaction in which a bond of VoH is cut, i.e., a reaction of VoH→Vo+H, occurs, and the oxides 230a and 230b are dehydrogenated. Part of hydrogen generated at this time is bonded to oxygen to be $H_2O$ and removed from the oxide 230 and the insulator 280 in some cases. In other cases, part of hydrogen is gettered by the conductor 242. In this manner, irradiation with a high-frequency wave such as a microwave or RF can reduce the hydrogen concentration of the insulator 280, the oxide 230b, and the oxide 230a.

Alternatively, an oxygen gas may be made into plasma with a high-frequency wave such as a microwave or RF to form oxygen radicals. That is, the insulator 280, the oxide 230b, and the oxide 230a may be subjected to plasma treatment in an oxygen-containing atmosphere. Hereinafter, such treatment is sometimes referred to as oxygen plasma treatment. The formed oxygen radicals can supply oxygen to the insulator 280, the oxide 230b, and the oxide 230a. In the case where the insulator 280, the oxide 230b, and the oxide 230a are subjected to plasma treatment in an oxygen-containing atmosphere, the oxide 230 may be less likely to be irradiated with a high-frequency wave such as a microwave or RF.

Note that oxygen plasma treatment is preferably performed with a microwave processing apparatus including a power source for generating high-density plasma using microwaves, for example. The microwave processing apparatus may include a power source for applying RF to the substrate side. The use of high-density plasma enables high-density oxygen radicals to be generated. Furthermore, application of RF to the substrate side allows oxygen ions generated by the high-density plasma to be efficiently introduced into the insulator 280 and the oxide 230. The oxygen plasma treatment is preferably performed under a reduced pressure, and the pressure is set to 60 Pa or higher, preferably 133 Pa or higher, further preferably 200 Pa or higher, still further preferably 400 Pa or higher. The oxygen flow rate ($O_2/O_2+Ar$) is lower than or equal to 50%, preferably higher than or equal to 10% and lower than or equal to 30%. The treatment is performed at approximately 400° C., for example. After the oxygen plasma treatment, heat treatment may be successively performed without exposure to the air.

Next, a conductive film 260Aa and a conductive film 260Ab are formed (see FIGS. 10A to 10D). The conductive films 260Aa and 260Ab can be formed by a sputtering method, a CVD method, an MBE method, a PLD method, an ALD method, or the like. A CVD method is preferably used, for example. In this embodiment, the conductive film 260Aa is formed by an ALD method, and the conductive film 260Ab is formed by a CVD method.

Then, the oxide film 230C, the insulating film 250A, the conductive film 260Aa, and the conductive film 260Ab are polished by CMP treatment until the insulator 280 is exposed, whereby the oxide 230c, the insulator 250, and the conductor 260 (the conductors 260a and 260b) are formed (see FIGS. 11A to 11D).

Next, heat treatment may be performed. In this embodiment, the heat treatment is performed in a nitrogen atmosphere at 400° C. for one hour. The heat treatment can reduce the moisture concentration and the hydrogen concentration of the insulators 250 and 280. After the heat treatment, the insulator 282 may be successively formed without exposure to the air.

Next, the insulator 282 is formed over the conductor 260, the oxide 230c, the insulator 250, and the insulator 280. The insulator 282 can be formed by a sputtering method, a CVD method, an MBE method, a PLD method, an ALD method, or the like (see FIGS. 12A to 12D). Aluminum oxide is preferably deposited as an insulating film to be the insulator 282 by a sputtering method, for example. During the formation of the insulator 282 by a sputtering method in an oxygen-containing atmosphere, oxygen can be added to the insulator 280. At this time, the insulator 282 is preferably formed while the substrate is being heated. The insulator 282 is preferably formed in contact with the top surface of the conductor 260, in which case oxygen contained in the insulator 280 can be inhibited from being absorbed by the conductor 260 in heat treatment performed later.

Next, the insulators 282, 280, 273, 272, 224, 222, 216, and 214 are partly processed to form an opening reaching the insulator 212 (see FIGS. 13A to 13D). The opening is formed to surround the transistor 200 in some cases. In other cases, the opening is formed to surround a plurality of transistors 200. Accordingly, the side surfaces of the insulators 282, 280, 273, 272, 224, 222, 216, and 214 are partly exposed in the opening.

The insulators 282, 280, 273, 272, 224, 222, 216, and 214 can be partly processed by a dry etching method or a wet etching method. A dry etching method is suitable for microfabrication. The processing may be performed under different conditions.

In that case, the insulator 280 or the like may be irradiated with a high-frequency wave such as a microwave or RF. The irradiation high-frequency wave such as a microwave or RF enters the insulator 280, the oxide 230b, the oxide 230a, and the like and can sometimes remove hydrogen therein. For example, in the oxides 230a and 230b, a reaction in which a bond of VoH is cut, i.e., a reaction of VoH→Vo+H, occurs, and the oxides 230a and 230b are dehydrogenated. Part of hydrogen generated at this time is bonded to oxygen to be $H_2O$ and removed from the oxide 230 and the insulator 280 in some cases. In other cases, part of hydrogen is gettered by the conductor 242.

Next, the insulator 283 is formed to cover the insulators 282, 280, 273, 272, 224, 222, 216, and 214 (see FIGS. 14A to 14D). The insulator 283 can be formed by a sputtering method, a CVD method, an MBE method, a PLD method, an ALD method, or the like. The insulator 283 may be a multilayer. For example, silicon nitride may be deposited by a sputtering method, and another silicon nitride may be deposited thereover by a CVD method. As illustrated in FIGS. 14A to 14D, the insulator 283 is in contact with the insulator 212 at the bottom surface of the opening. That is, the top and side surfaces of the transistor 200 are surrounded by the insulator 283 and the bottom surface of the transistor 200 is surrounded by the insulator 212. Surrounding the transistor 200 by the insulators 283 and 212 having high barrier properties inhibits entry of moisture and hydrogen from the outside.

Next, heat treatment may be performed. In this embodiment, the heat treatment is performed in a nitrogen atmosphere at 400° C. for one hour. Through the heat treatment, oxygen added at the time of the formation of the insulator 282 can be diffused into the insulator 280 and then can be supplied to the oxides 230a and 230b through the oxide 230c. The oxygen adding treatment performed in this manner on the oxide 230 can promote a reaction in which oxygen vacancies in the oxide 230 (the oxide 230b) are filled with oxygen, i.e., a reaction of Vo+O→null. Furthermore, hydrogen remaining in the oxide 230 reacts with supplied oxygen, so that the hydrogen can be removed as $H_2O$ (dehydrogenation). This can inhibit recombination of hydrogen remaining in the oxide 230 with oxygen vacancies and formation of VoH. Note that the heat treatment is not necessarily performed after the formation of the insulator 283 and may be performed after the formation of the insulator 282.

Then, an insulating film to be the insulator 274 is formed over the insulator 283. The insulating film to be the insulator 274 can be formed by a sputtering method, a CVD method, an MBE method, a PLD method, an ALD method, or the like. The insulating film to be the insulator 274 is preferably formed by a deposition method using the gas in which the number of hydrogen atoms is reduced or hydrogen atoms are removed. Thus, the hydrogen concentration of the insulating film to be the insulator 274 can be reduced.

Next, the insulating film to be the insulator 274 is subjected to CMP treatment, so that the insulator 274 having a flat top surface is formed. Then, the insulator 284 is formed over the insulator 274 (see FIGS. 15A to 15D). The insulator 284 can be formed by a sputtering method, a CVD method, an MBE method, a PLD method, an ALD method, or the like. The insulator 284 may be a multilayer. For example, silicon nitride may be deposited by a sputtering method, and another silicon nitride may be deposited thereover by a CVD method. In this embodiment, silicon nitride is deposited by a sputtering method.

Next, an opening 255a reaching the conductor 242a is formed in the insulators 272, 273, 280, 282, 283, 274, and 284, and an opening 255b reaching the conductor 242b is formed in the insulators 272, 273, 280, 282, 283, 274, and 284 (see FIGS. 15A to 15D). The openings are formed by a lithography method. Note that the openings 255a and 255b in the top view in FIG. 15A each have a circular shape; however, the shapes of the openings are not limited thereto. For example, the openings 255a and 255b in the top view may each have an almost circular shape such as an elliptical shape, a polygonal shape such as a quadrangular shape, or a polygonal shape such as a quadrangular shape with rounded corners.

Next, the insulator 285 is formed (see FIGS. 16A to 16D). The insulator 285 is preferably formed in contact with at least the side surfaces of the insulators 274, 283, and 282 in the opening 255 (the openings 255a and 255b). The insulator 285 can be formed by a sputtering method, a CVD method, an MBE method, a PLD method, an ALD method, or the like. In this embodiment, silicon nitride is deposited by a CVD method. In the case of employing a CVD method, the insulator 285 is not formed on the bottom surface of the opening 255, i.e., on the conductor 242 in some cases.

Next, an insulating film to be the insulator 241 is formed and subjected to anisotropic etching, so that the insulator 241 is formed. At this time, the insulator 285 over the insulator 284 is also removed, so that the insulators 285a and 285b are formed (see FIGS. 17A to 17D). The insulating film to be the insulator 241 can be formed by a sputtering method, a CVD method, an MBE method, a PLD method, an ALD method, or the like. The insulating film to be the insulator 241 preferably has a function of inhibiting the penetration of oxygen. For example, aluminum oxide is preferably deposited by a PEALD method. Alternatively, as in the insulator 283, silicon nitride is preferably deposited by a PEALD method. Silicon nitride is preferable because of its high hydrogen blocking property.

For the anisotropic etching of the insulating film to be the insulator 241, a dry etching method may be employed, for example. Providing the insulators 285 and 241 on the sidewall portions of the openings can inhibit penetration of oxygen from the outside and oxidation of the conductors 240a and 240b formed in the next step. Furthermore, impurities such as water and hydrogen can be prevented from diffusing from the conductors 240a and 240b to the outside.

Next, a conductive film to be the conductors 240a and 240b is formed. The conductive film to be the conductors 240a and 240b desirably has a stacked-layer structure including a conductor having a function of inhibiting the penetration of impurities such as water and hydrogen. For example, a stacked-layer structure of tantalum nitride, titanium nitride, or the like and tungsten, molybdenum, copper, or the like can be employed. The conductive film to be the conductors 240a and 240b can be formed by a sputtering method, a CVD method, an MBE method, a PLD method, an ALD method, or the like.

Next, the conductive film to be the conductors 240a and 240b is partly removed by CMP treatment to expose the top surface of the insulator 284. As a result, the conductive film remains only in the openings 255a and 255b, so that the conductors 240a and 240b having flat top surfaces can be formed (see FIGS. 18A to 18D). Note that the top surface of the insulator 284 is partly removed by the CMP treatment in some cases.

Next, a conductive film to be the conductor 246 is formed. The conductive film to be the conductor 246 can be formed by a sputtering method, a CVD method, an MBE method, a PLD method, an ALD method, or the like.

Next, the conductive film to be the conductor 246 is processed by a lithography method to form the conductor 246a in contact with the top surface of the conductor 240a and the conductor 246b in contact with the top surface of the conductor 240b. At this time, the insulator 284 in a region not overlapping with the conductors 246a and 246b is sometimes removed. That is, the insulator 284a is formed under the conductor 246a, and the insulator 284b is formed under the conductor 246b (see FIGS. 19A to 19D).

Next, the insulator 286 is formed over the conductor 246 and the insulator 274 (see FIGS. 1A to 1D). The insulator 286 can be formed by a sputtering method, a CVD method, an MBE method, a PLD method, an ALD method, or the like. The insulator 286 may be a multilayer. For example, silicon nitride may be deposited by a sputtering method, and another silicon nitride may be deposited thereover by a CVD method.

When the insulator 286 is formed over the conductor 246 and the insulator 274, the top and side surfaces of the conductor 246 are in contact with the insulator 286, and the bottom surface of the conductor 246 is in contact with the insulator 284. In other words, the conductor 246 can be surrounded by the insulators 284 and 286. Such a structure can inhibit penetration of oxygen from the outside and oxidation of the conductor 246. Furthermore, such a structure is preferable because impurities such as water and hydrogen can be prevented from diffusing from the conductor 246 to the outside.

Through the above process, the semiconductor device including the transistor 200 illustrated in FIGS. 1A to 1D can be manufactured. By the method for manufacturing a semiconductor device which is described in this embodiment and is illustrated in FIGS. 4A to 4D to FIGS. 19A to 19D, the transistor 200 can be formed.

<Modification Example of Semiconductor Device>

An example of a semiconductor device including the transistor 200 of one embodiment of the present invention which is different from the semiconductor device described in <Structure example of semiconductor device> is described below with reference to FIGS. 2A to 2D, FIGS. 3A to 3D, FIGS. 20A and 20B, and FIGS. 21A and 21B. Note that in the semiconductor device illustrated in FIGS. 2A to 2D, FIGS. 3A to 3D, FIGS. 20A and 20B, and FIGS. 21A and 21B, components having the same functions as the components in the semiconductor device described in <Structure example of semiconductor device> (see FIGS. 1A to 1D) are denoted by the same reference numerals. Note that in this section, the materials described in detail in <Structure example of semiconductor device> can be used as materials for the transistor 200.

Modification Example 1 of Semiconductor Device

Figure 2A:
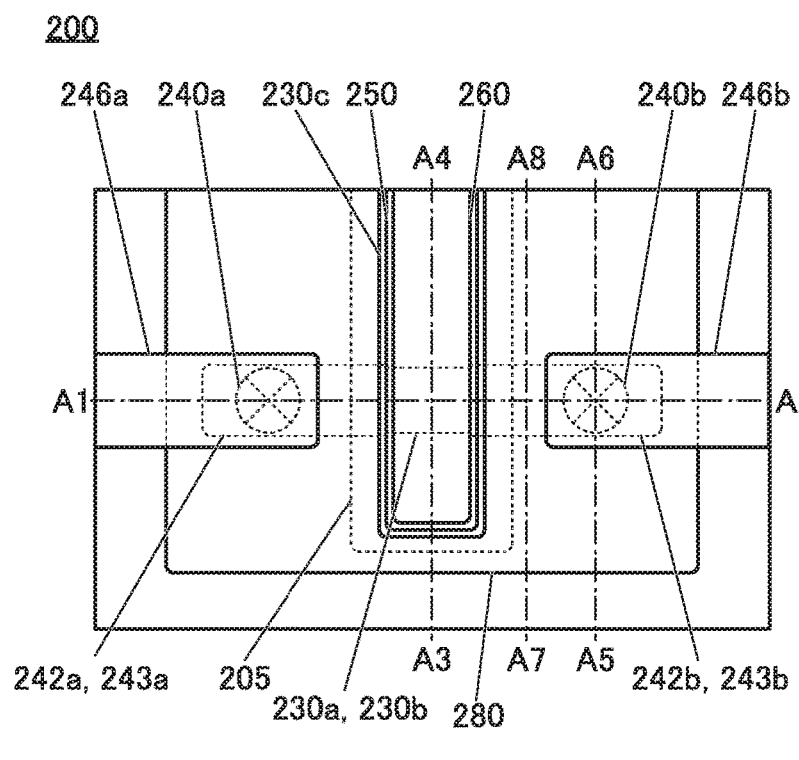
FIG. 2A is a top view of a semiconductor device.
Figure 2C:
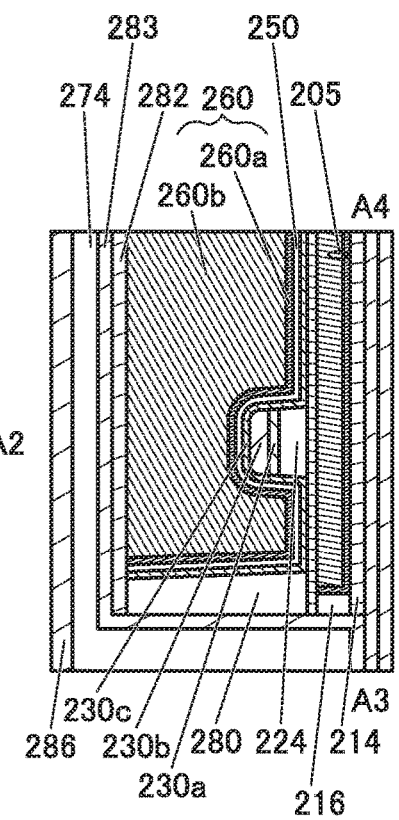
FIGS. 2B to 2D are cross-sectional views of the semiconductor device.
Figure 2B:
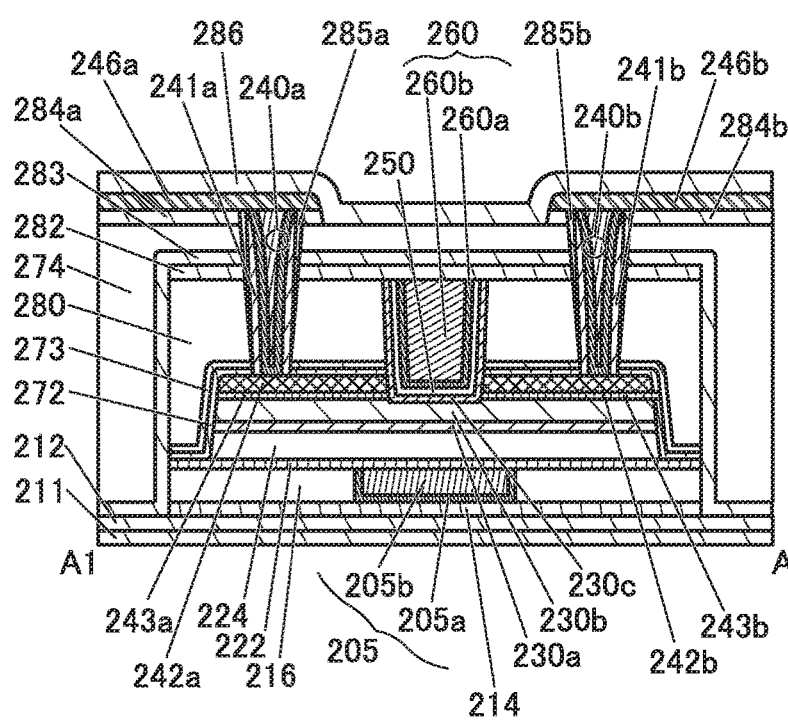
Figure 2D:
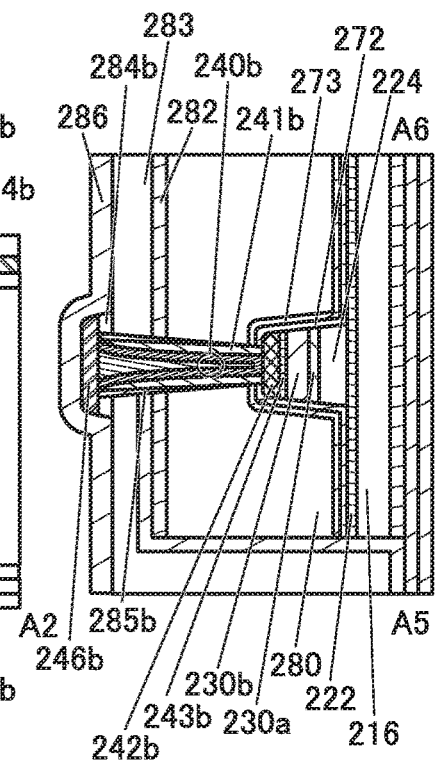

FIG. 2A is a top view of the semiconductor device including the transistor 200. FIG. 2B is a cross-sectional view taken along the dashed-dotted line A1-A2 in FIG. 2A, which corresponds to a cross-sectional view in the channel length direction of the transistor 200. FIG. 2C is a cross-sectional view taken along the dashed-dotted line A3-A4 in FIG. 2A, which corresponds to a cross-sectional view in the channel width direction of the transistor 200. FIG. 2D is a cross-sectional view taken along the dashed-dotted line A5-A6 in FIG. 2A. Note that for simplification of the drawing, some components are not illustrated in the top view in FIG. 2A.

The transistor 200 illustrated in FIGS. 2A to 2D is different from the transistor 200 illustrated in FIGS. 1A to 1D in that the insulator 272 is partly in contact with the insulator 222. This structure is formed in such a manner that a region of the insulator 224 that does not overlap with the oxide 230 is removed in forming the oxides 230a and 230b until the insulator 222 is exposed. The insulator 272 is preferably partly in contact with the insulator 222, in which case oxygen supplied to the insulator 224 is not released to the outside and can be efficiently supplied to the oxide 230, in some cases.

Modification Example 2 of Semiconductor Device

Figure 3A:
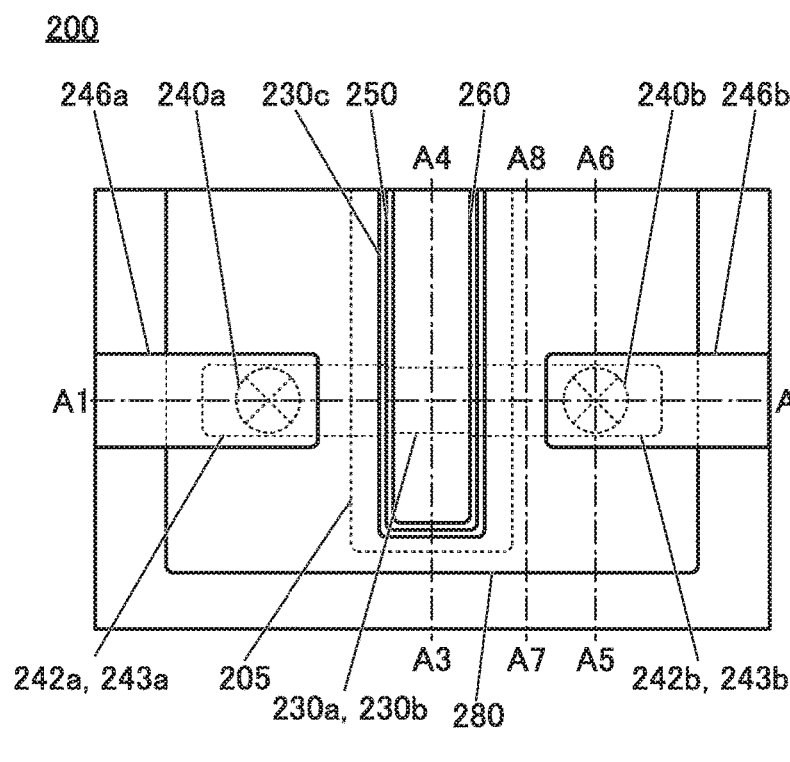
FIG. 3A is a top view of a semiconductor device.
Figure 3C:
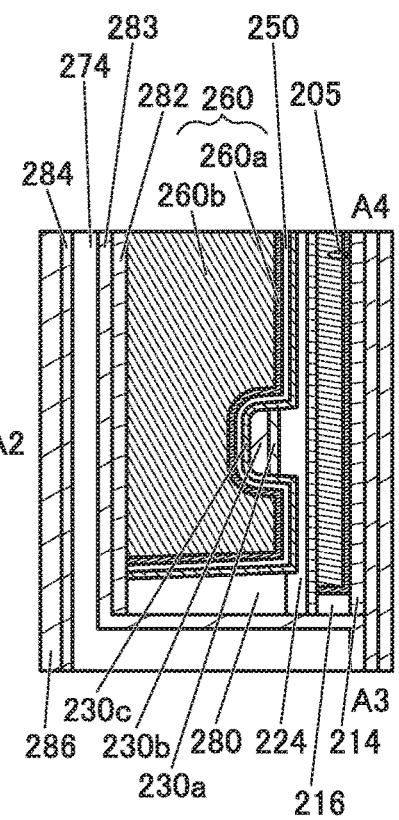
FIGS. 3B to 3D are cross-sectional views of the semiconductor device.
Figure 3B:
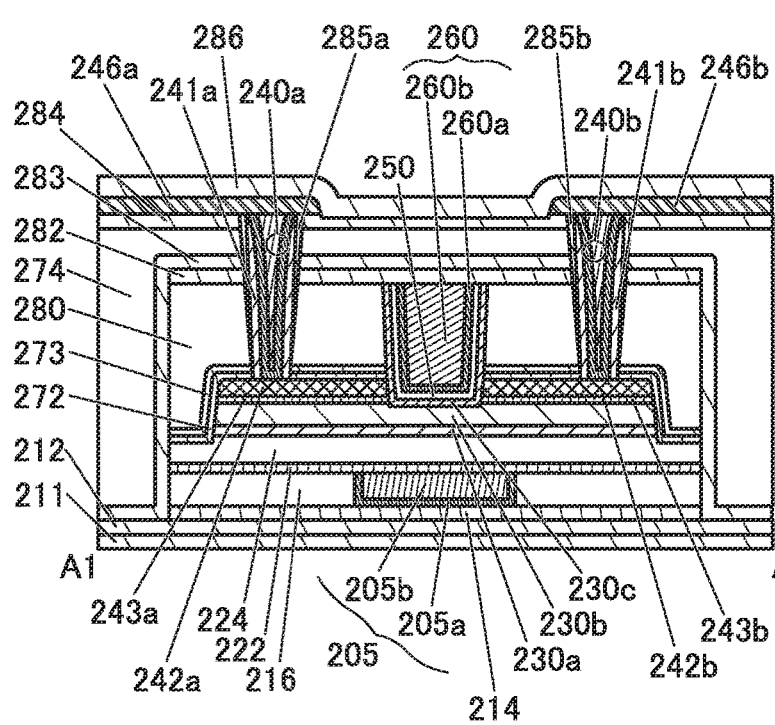
Figure 3D:
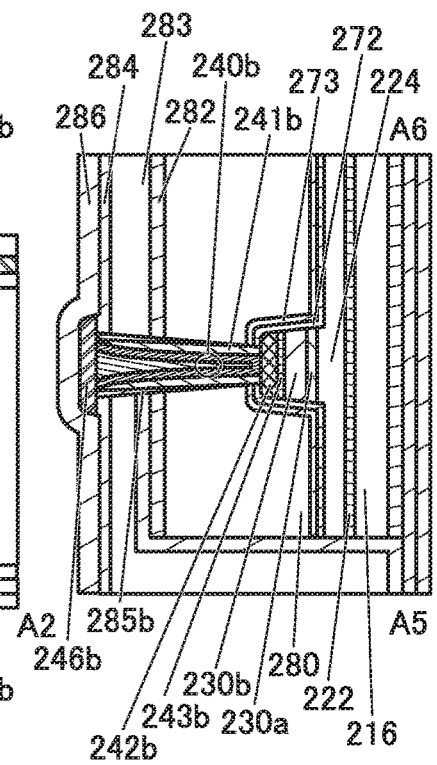
Figure 4A:
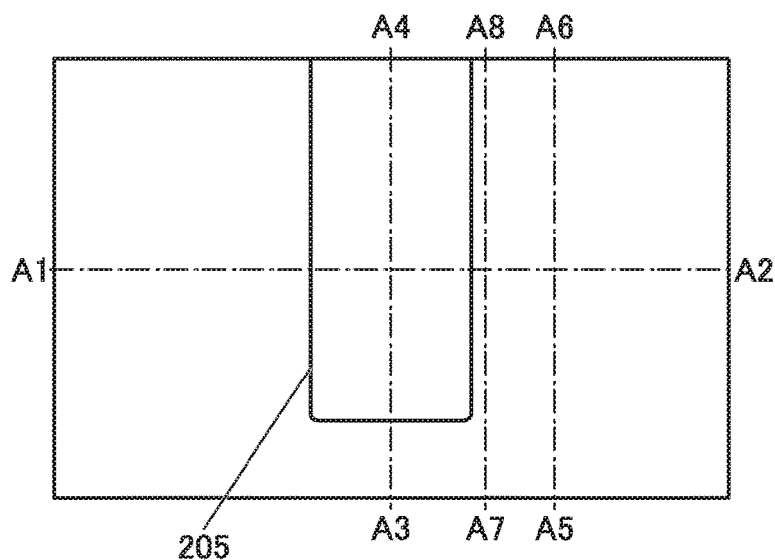
FIG. 4A is a top view illustrating a method for manufacturing a semiconductor device.
Figure 4C:
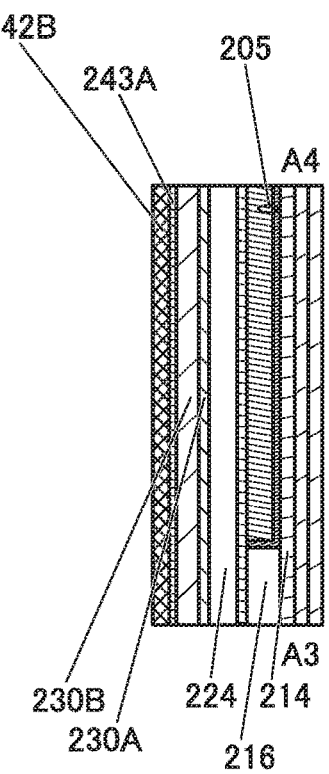
FIGS. 4B to 4D are cross-sectional views illustrating the method for manufacturing a semiconductor device.
Figure 4B:
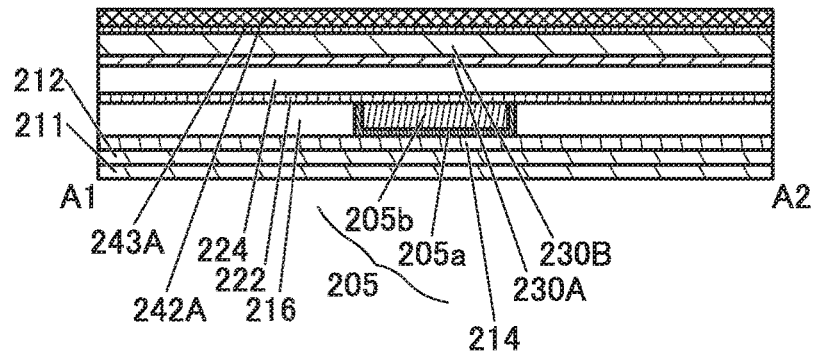
Figure 4D:
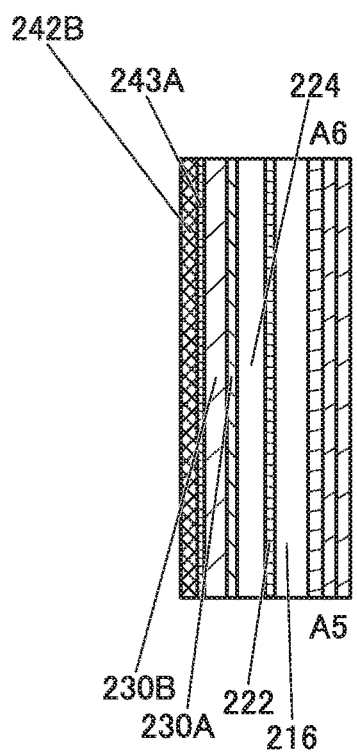
Figure 5A:
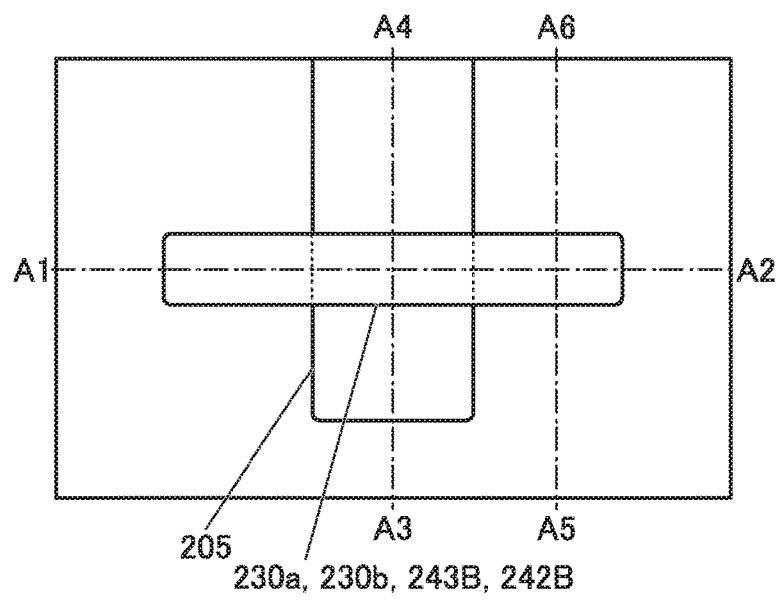
FIG. 5A is a top view illustrating a method for manufacturing a semiconductor device.
Figure 5C:
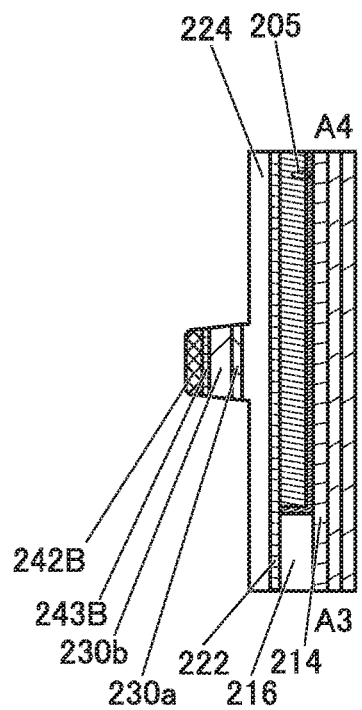
FIGS. 5B to 5D are cross-sectional views illustrating the method for manufacturing a semiconductor device.
Figure 5B:
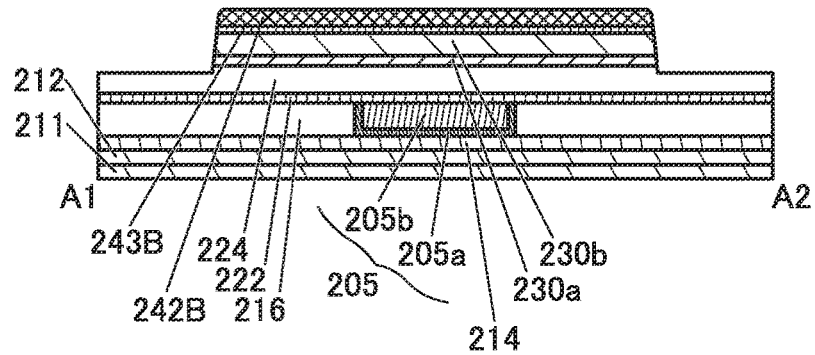
Figure 5D:
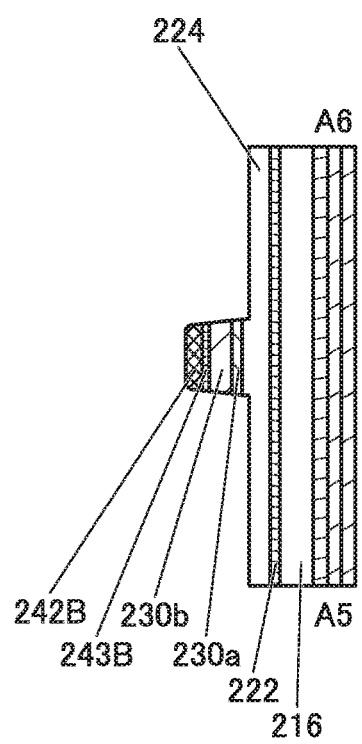
Figure 6A:
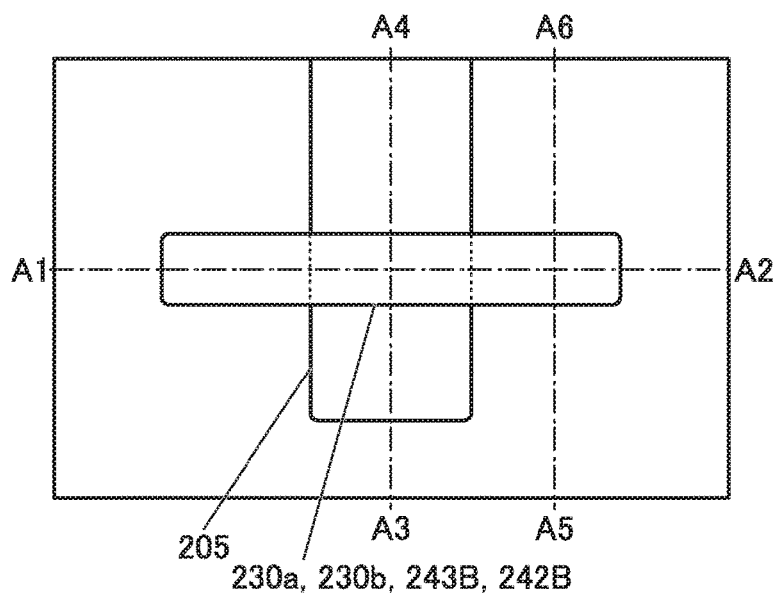
FIG. 6A is a top view illustrating a method for manufacturing a semiconductor device.
Figure 6C:
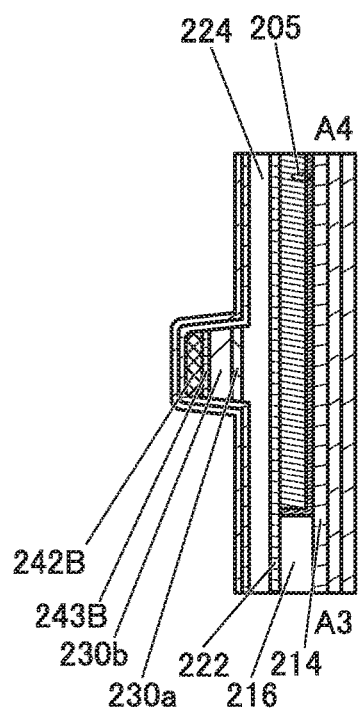
FIGS. 6B to 6D are cross-sectional views illustrating the method for manufacturing a semiconductor device.
Figure 6B:
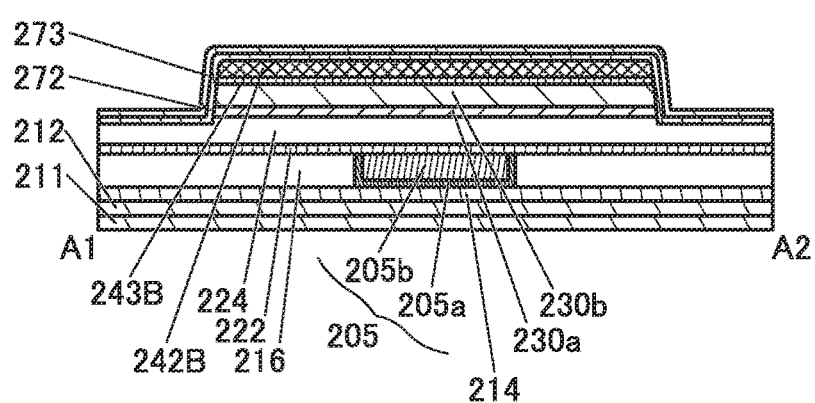
Figure 6D:
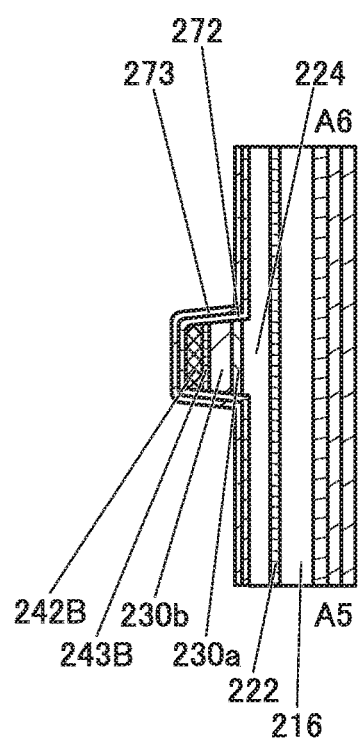
Figure 7A:
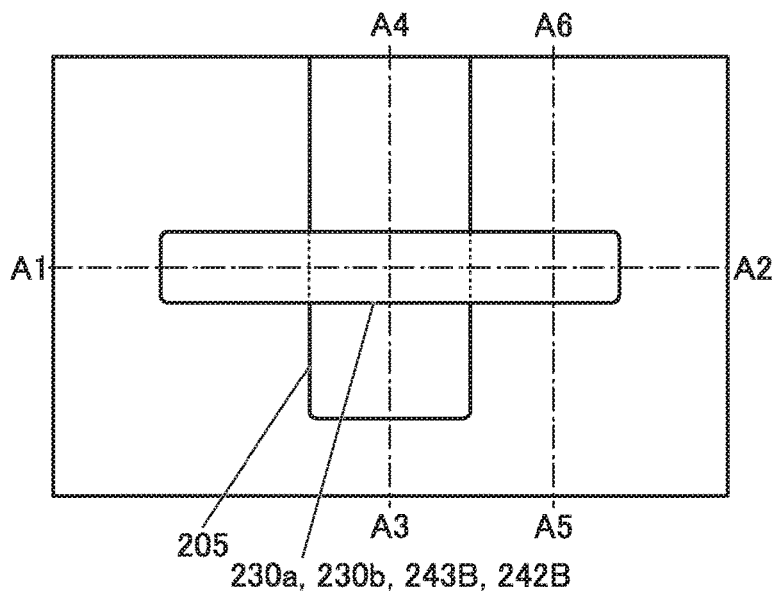
FIG. 7A is a top view illustrating a method for manufacturing a semiconductor device.
Figure 7C:
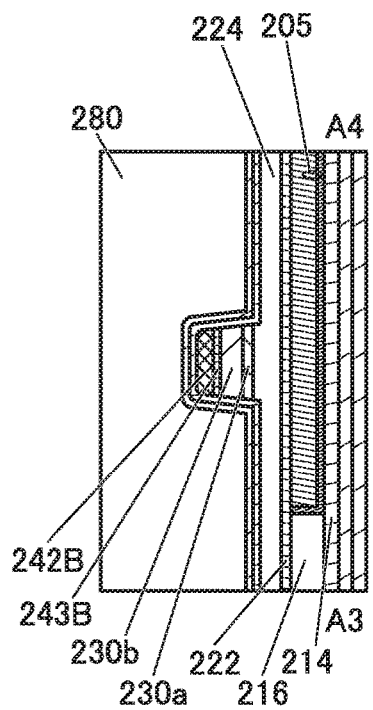
FIGS. 7B to 7D are cross-sectional views illustrating the method for manufacturing a semiconductor device.
Figure 7B:
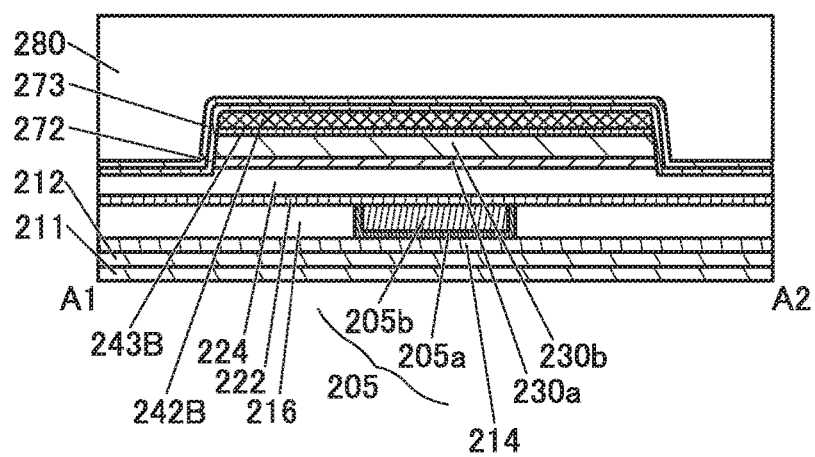
Figure 7D:
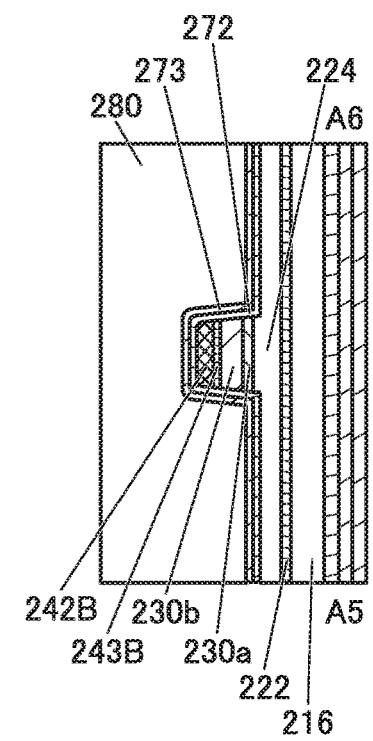
Figure 8A:
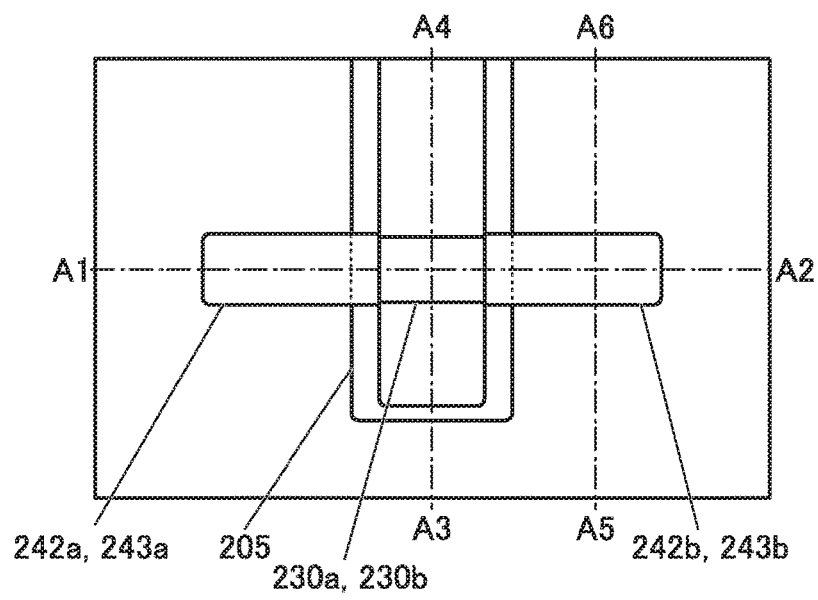
FIG. 8A is a top view illustrating a method for manufacturing a semiconductor device.
Figure 8C:
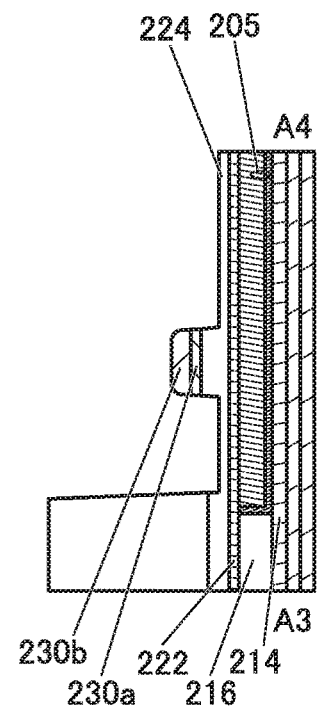
FIGS. 8B to 8D are cross-sectional views illustrating the method for manufacturing a semiconductor device.
Figure 8B:
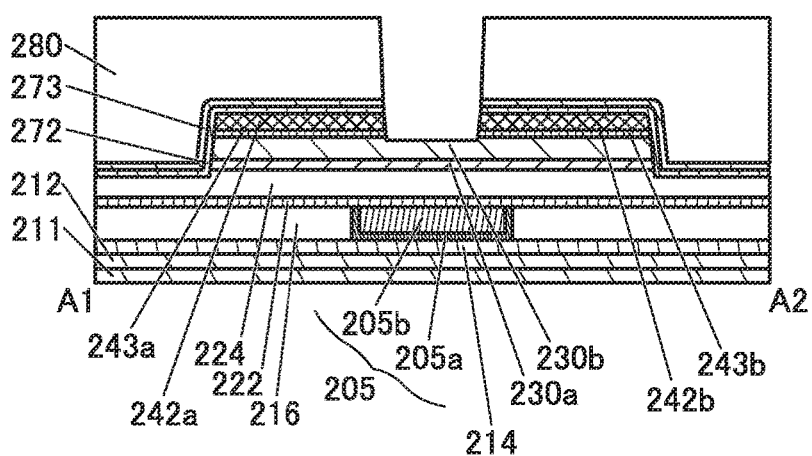
Figure 8D:
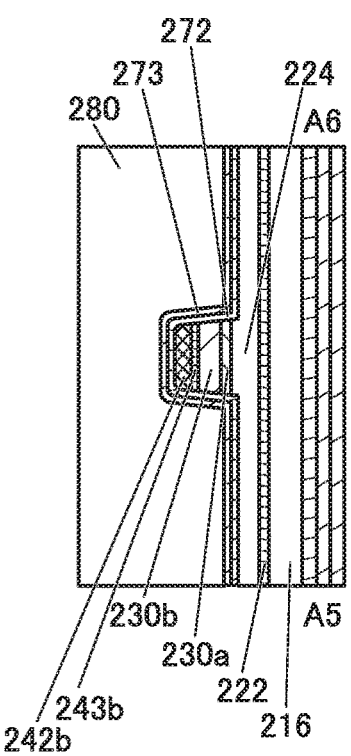
Figure 9A:
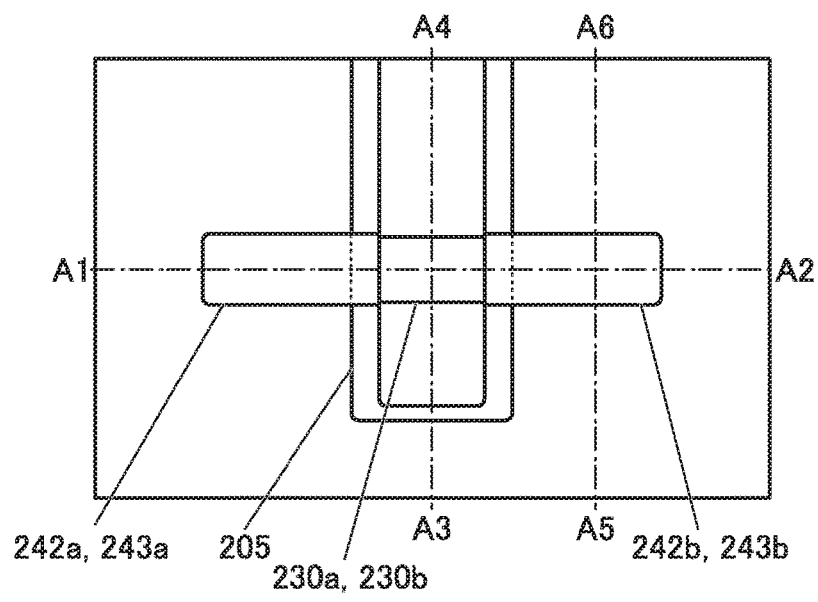
FIG. 9A is a top view illustrating a method for manufacturing a semiconductor device.
Figure 9C:
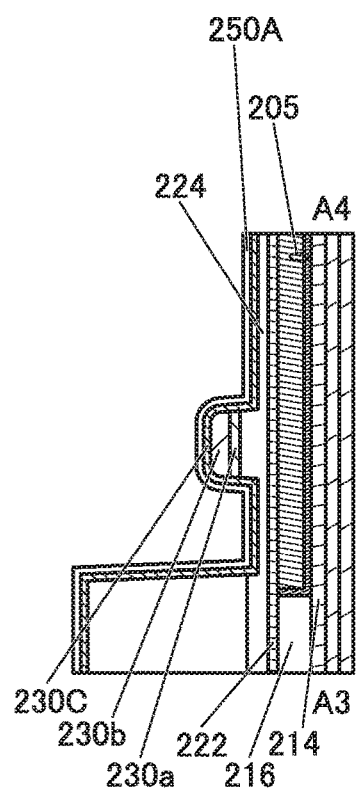
FIGS. 9B to 9D are cross-sectional views illustrating the method for manufacturing a semiconductor device.
Figure 9B:
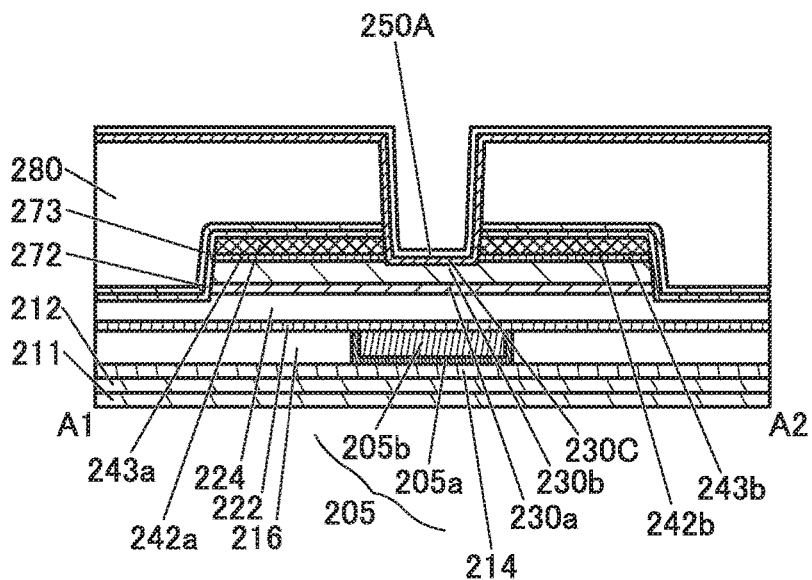
Figure 9D:
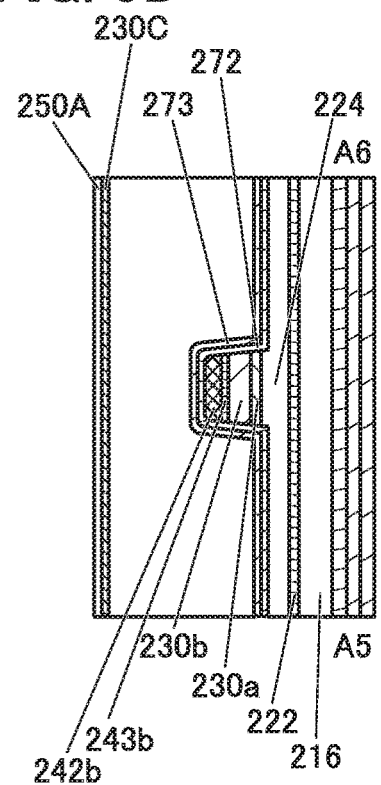
Figure 10A:
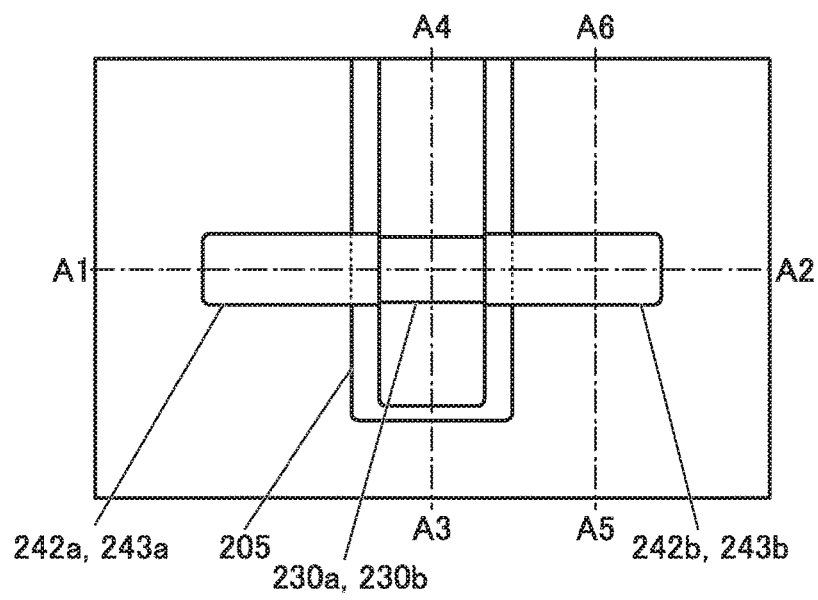
FIG. 10A is a top view illustrating a method for manufacturing a semiconductor device.
Figure 10C:
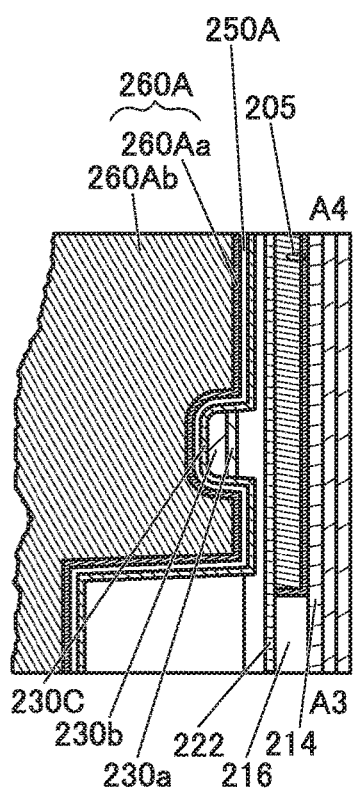
FIGS. 10B to 10D are cross-sectional views illustrating the method for manufacturing a semiconductor device.
Figure 10B:
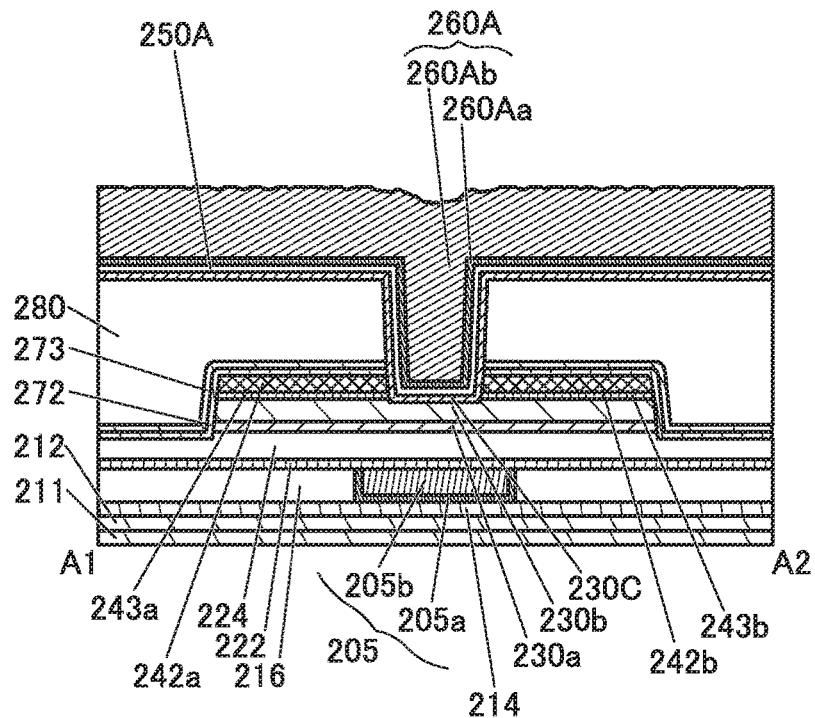
Figure 10D:
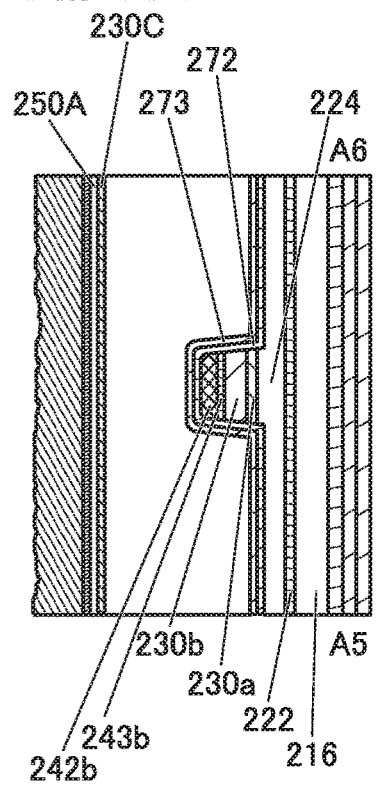
Figure 11A:
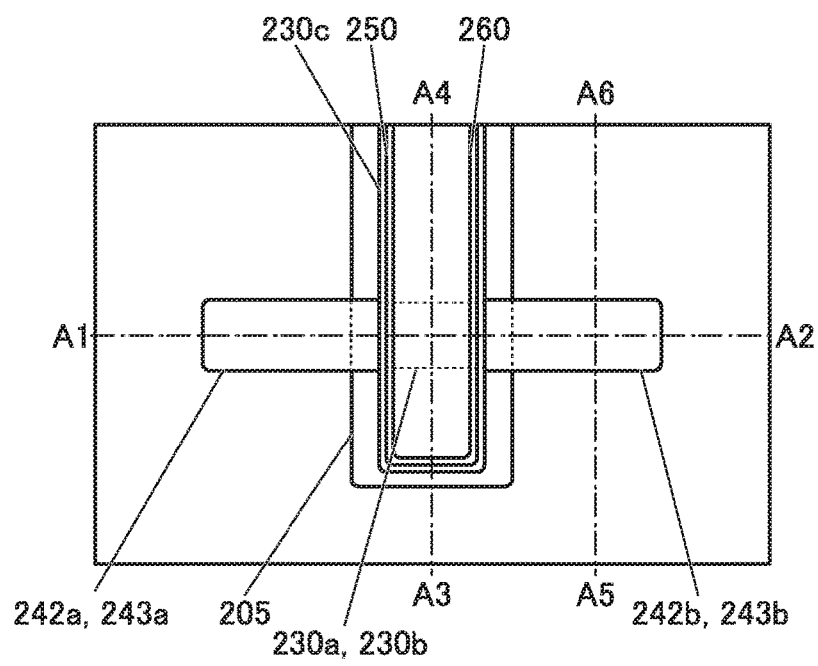
FIG. 11A is a top view illustrating a method for manufacturing a semiconductor device.
Figure 11C:
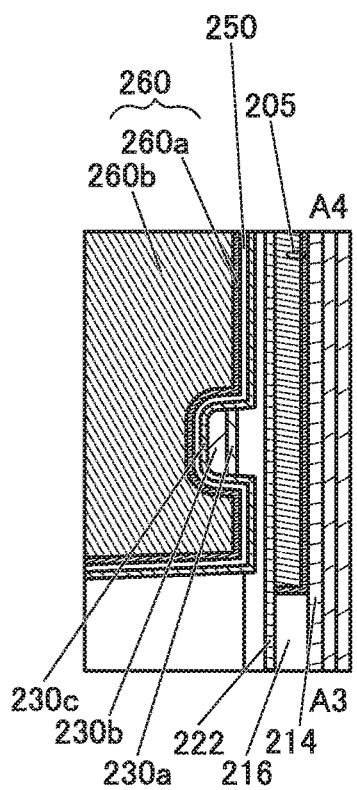
FIGS. 11B to 11D are cross-sectional views illustrating the method for manufacturing a semiconductor device.
Figure 11B:
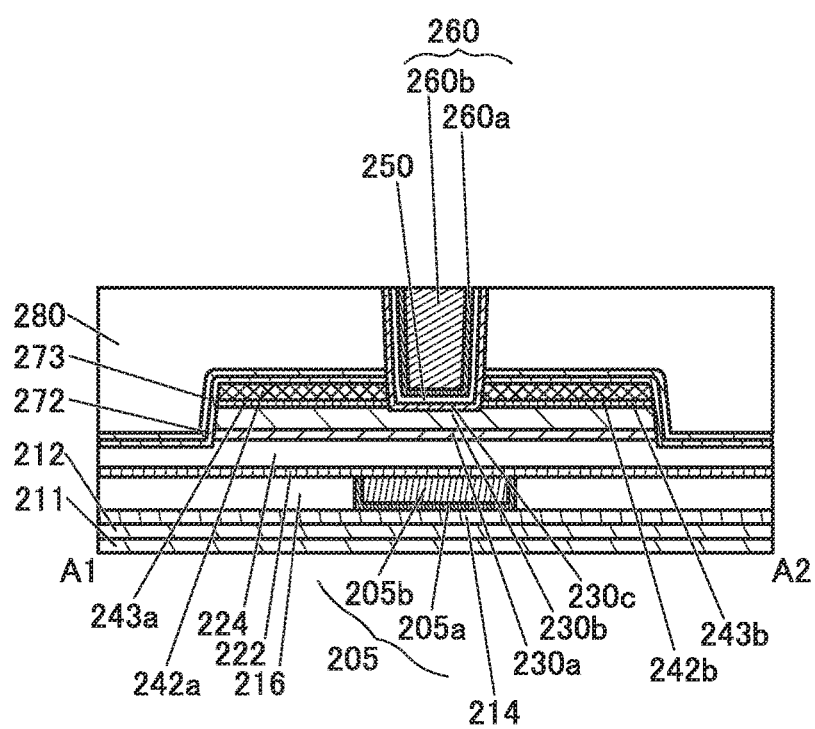
Figure 11D:
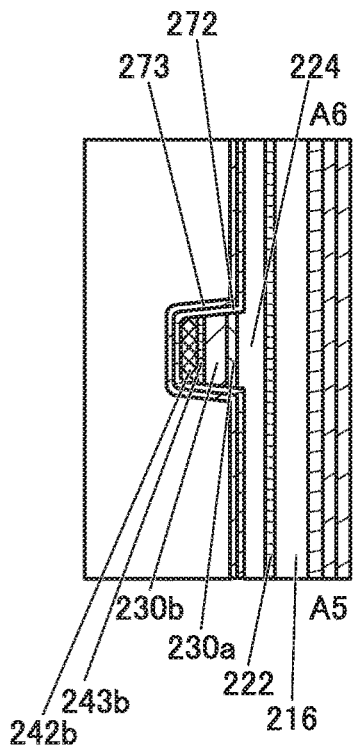
Figure 12A:
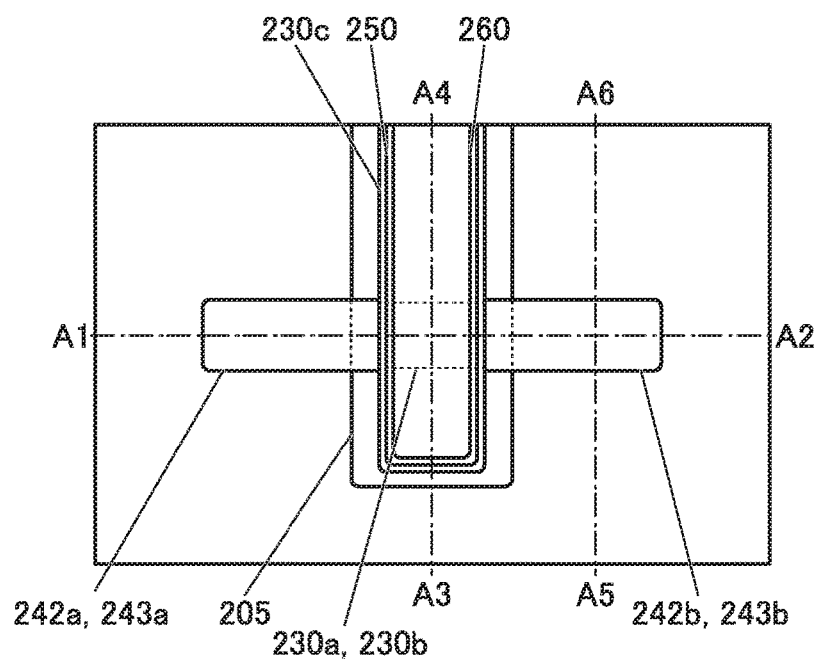
FIG. 12A is a top view illustrating a method for manufacturing a semiconductor device.
Figure 12C:
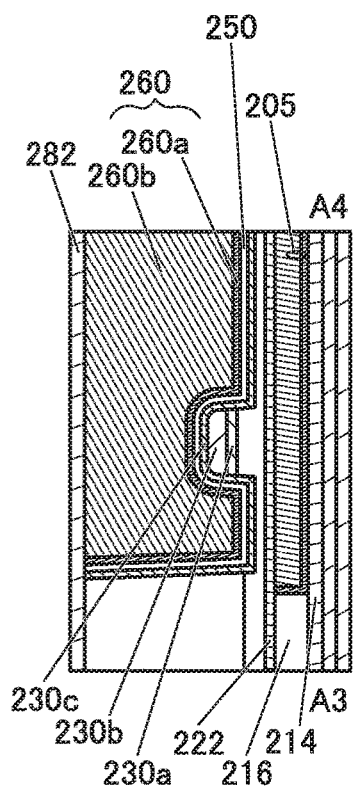
FIGS. 12B to 12D are cross-sectional views illustrating the method for manufacturing a semiconductor device.
Figure 12B:
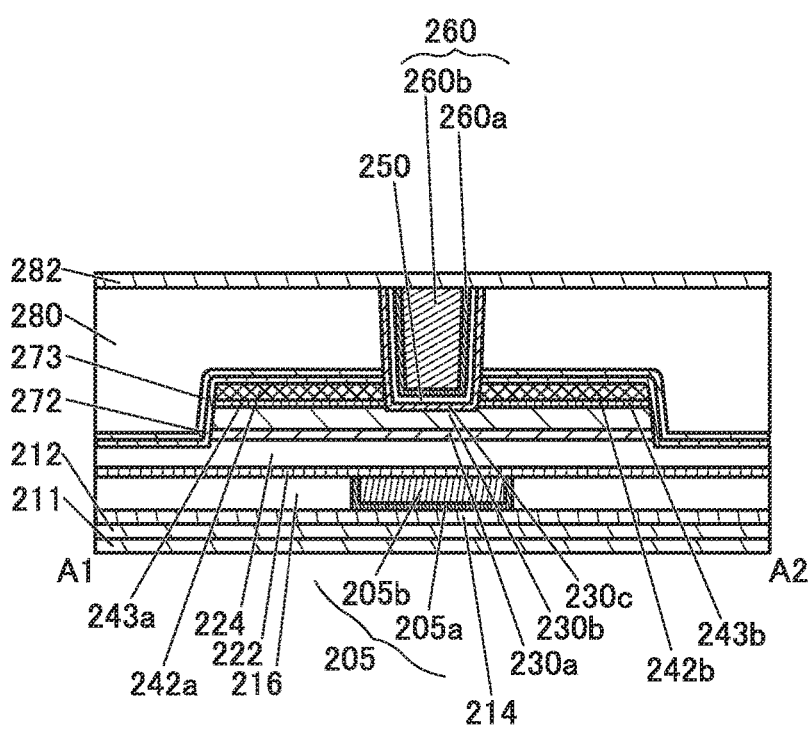
Figure 12D:
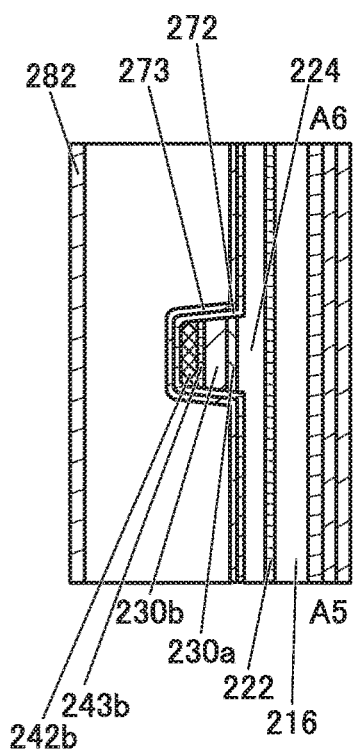
Figure 13A:
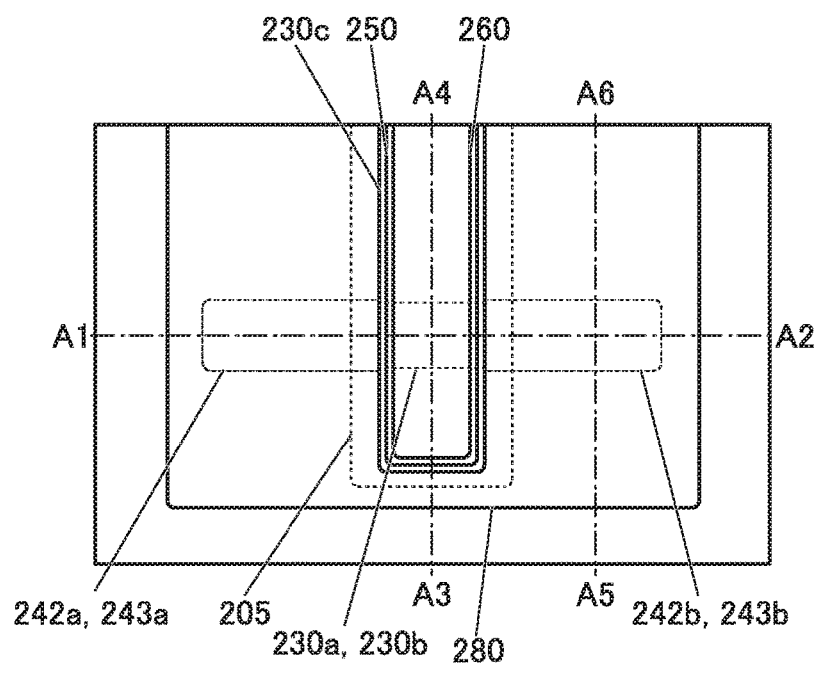
FIG. 13A is a top view illustrating a method for manufacturing a semiconductor device.
Figure 13C:
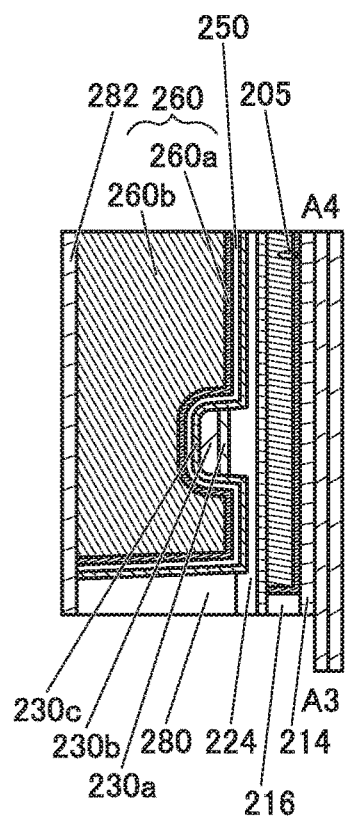
FIGS. 13B to 13D are cross-sectional views illustrating the method for manufacturing a semiconductor device.
Figure 13B:
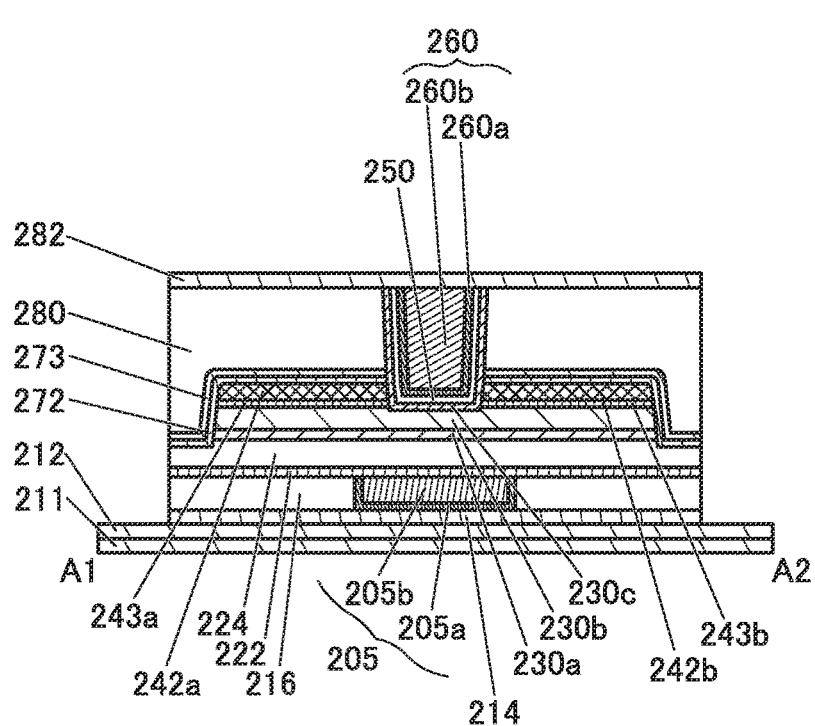
Figure 13D:
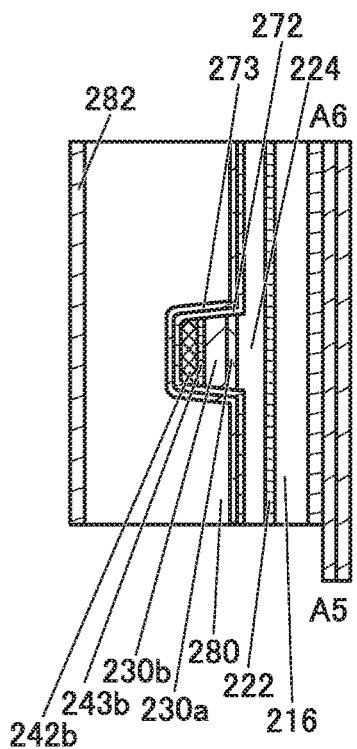
Figure 14A:
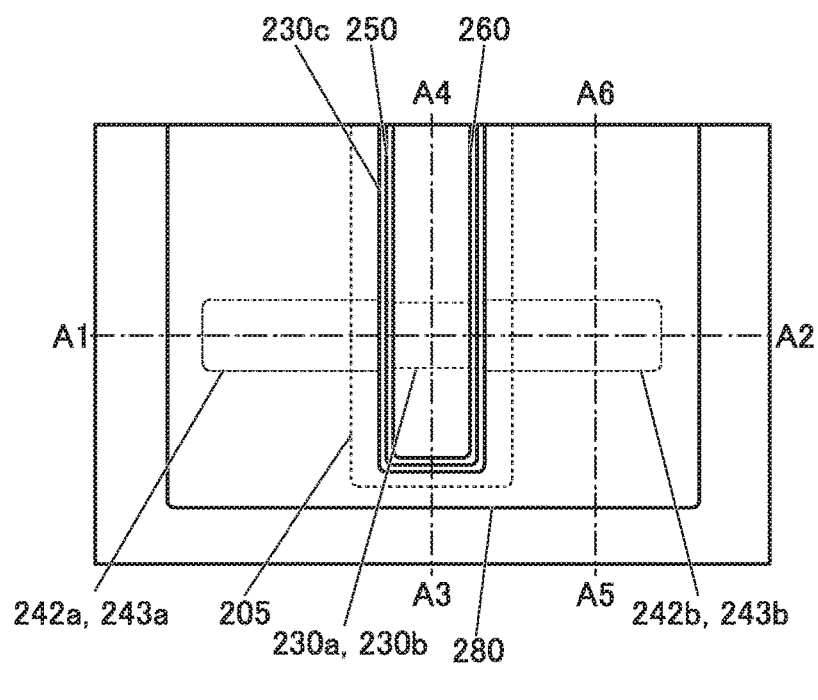
FIG. 14A is a top view illustrating a method for manufacturing a semiconductor device.
Figure 14C:
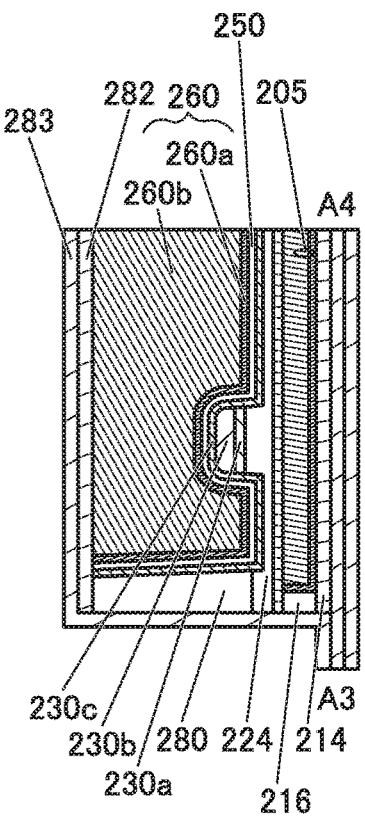
FIGS. 14B to 14D are cross-sectional views illustrating the method for manufacturing a semiconductor device.
Figure 14B:
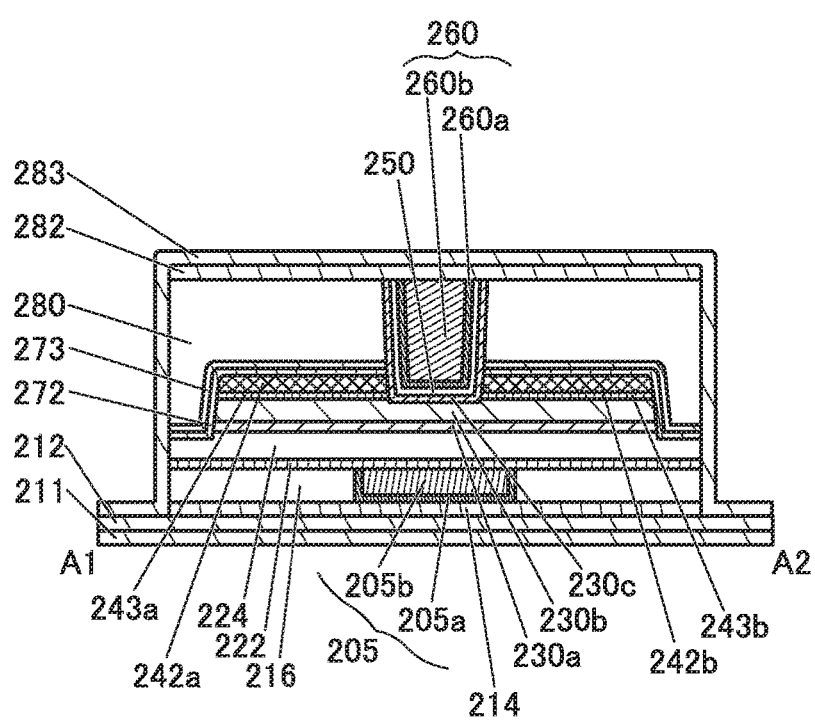
Figure 14D:
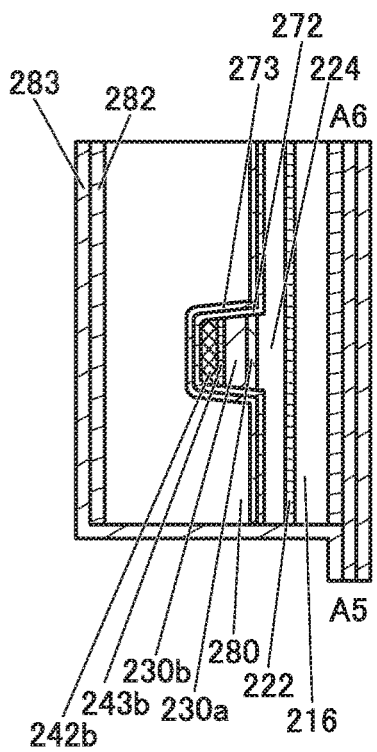
Figure 15A:
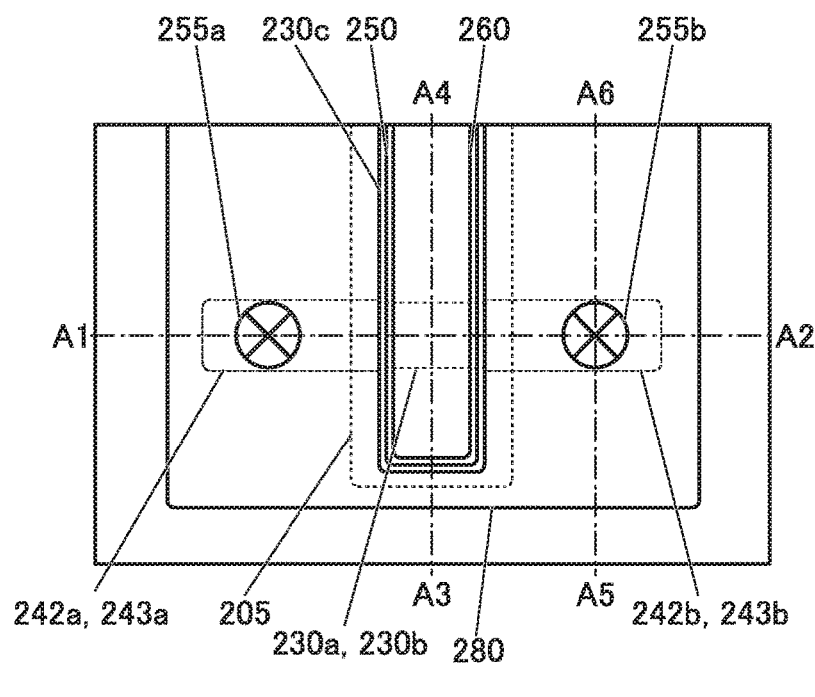
FIG. 15A is a top view illustrating a method for manufacturing a semiconductor device.
Figure 15C:
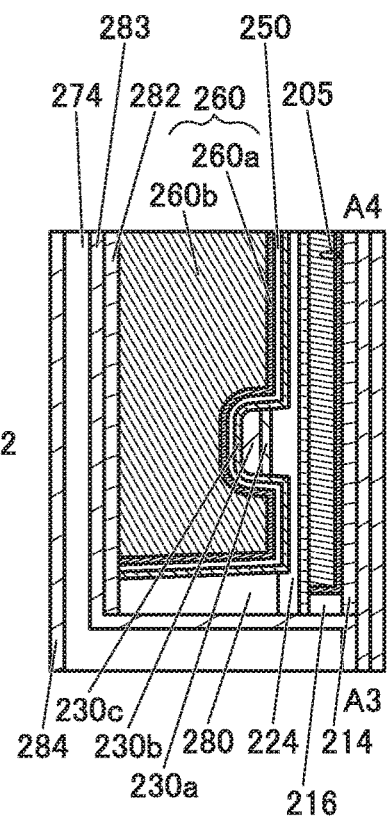
FIGS. 15B to 15D are cross-sectional views illustrating the method for manufacturing a semiconductor device.
Figure 15B:
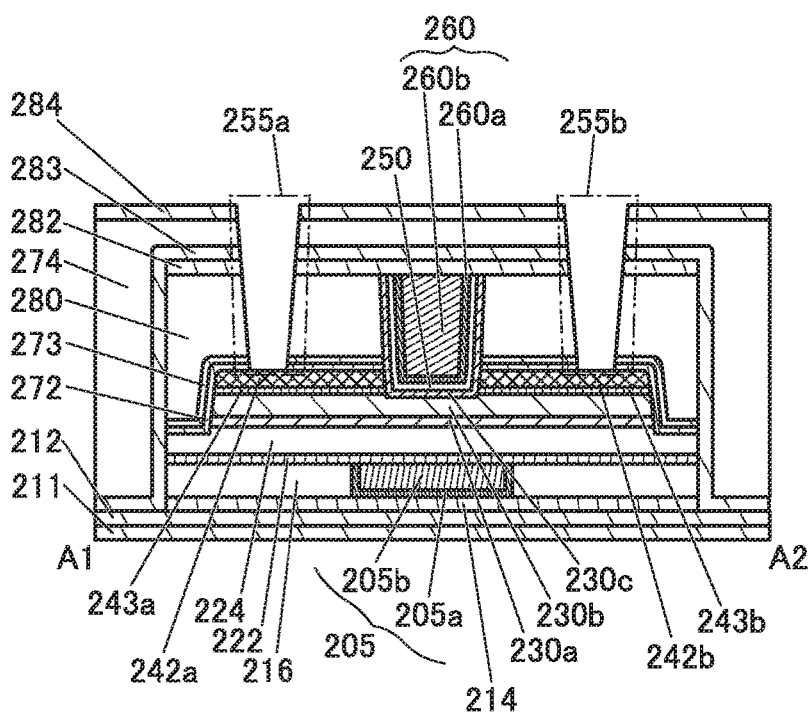
Figure 15D:
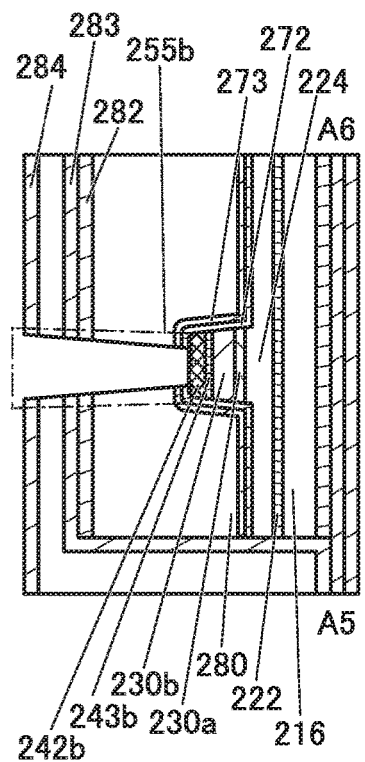
Figure 16A:
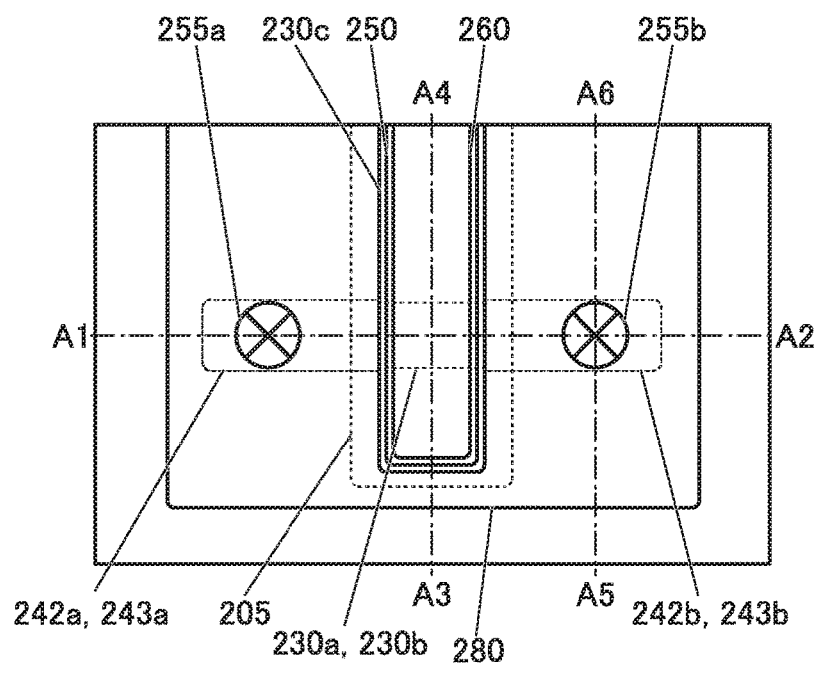
FIG. 16A is a top view illustrating a method for manufacturing a semiconductor device.
Figure 16C:
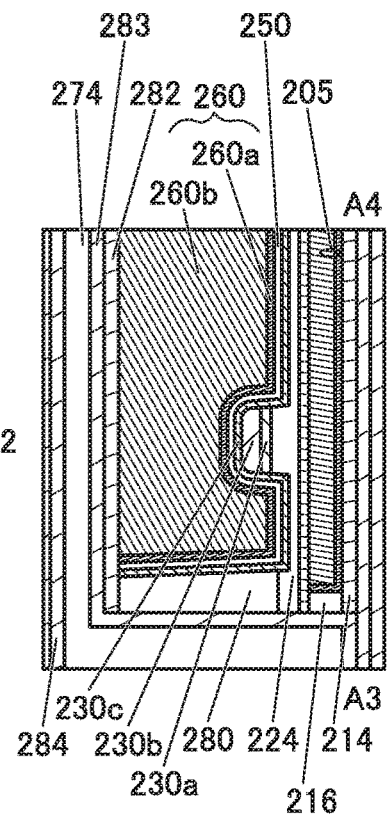
FIGS. 16B to 16D are cross-sectional views illustrating the method for manufacturing a semiconductor device.
Figure 16B:
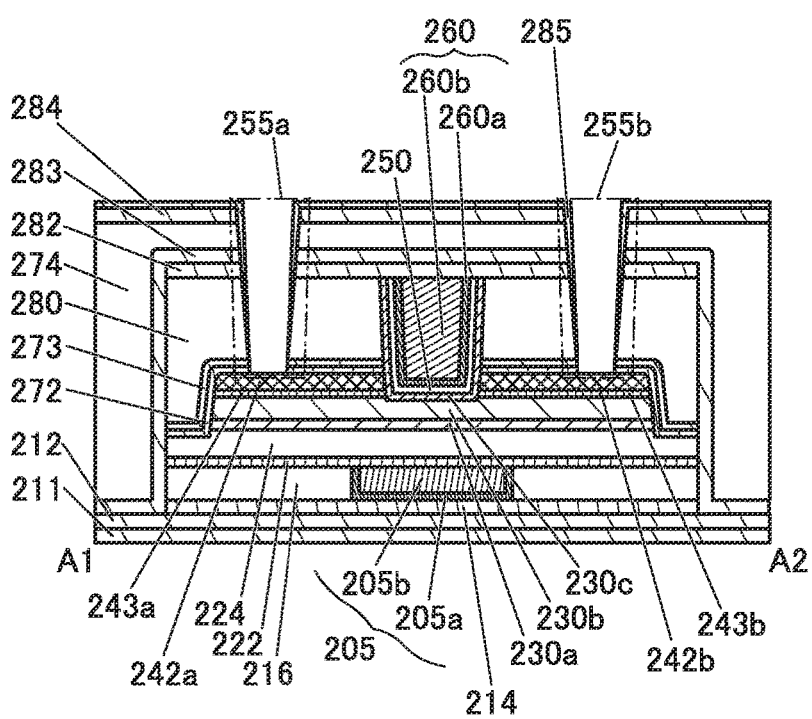
Figure 16D:
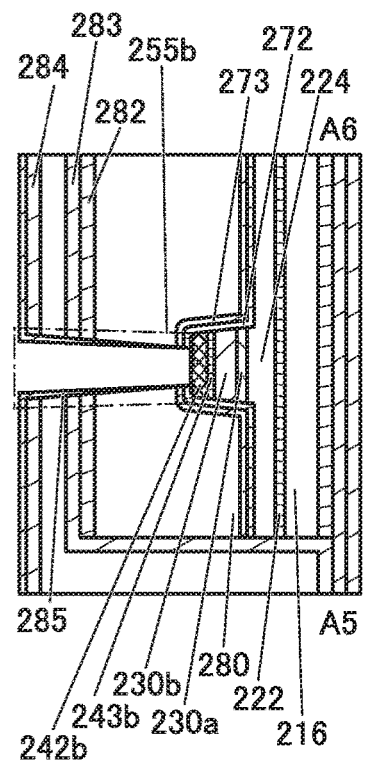
Figure 17A:
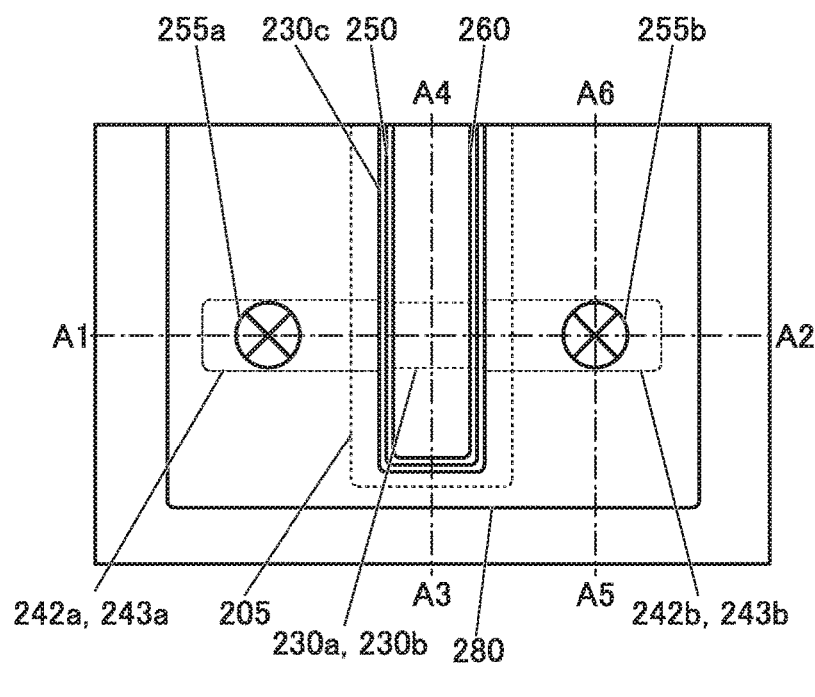
FIG. 17A is a top view illustrating a method for manufacturing a semiconductor device.
Figure 17C:
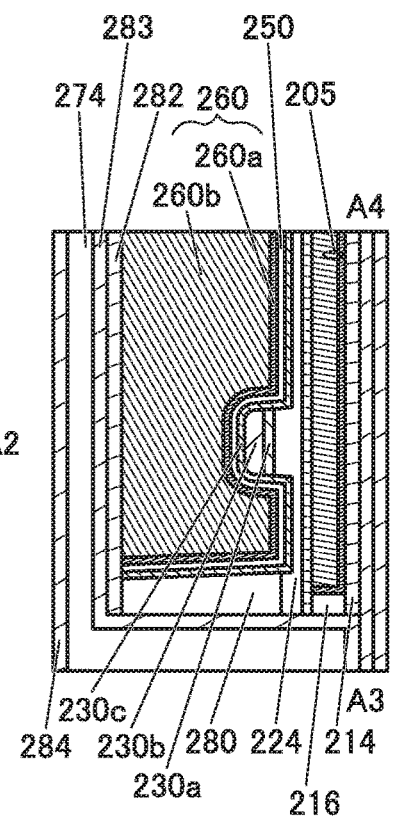
FIGS. 17B to 17D are cross-sectional views illustrating the method for manufacturing a semiconductor device.
Figure 17B:
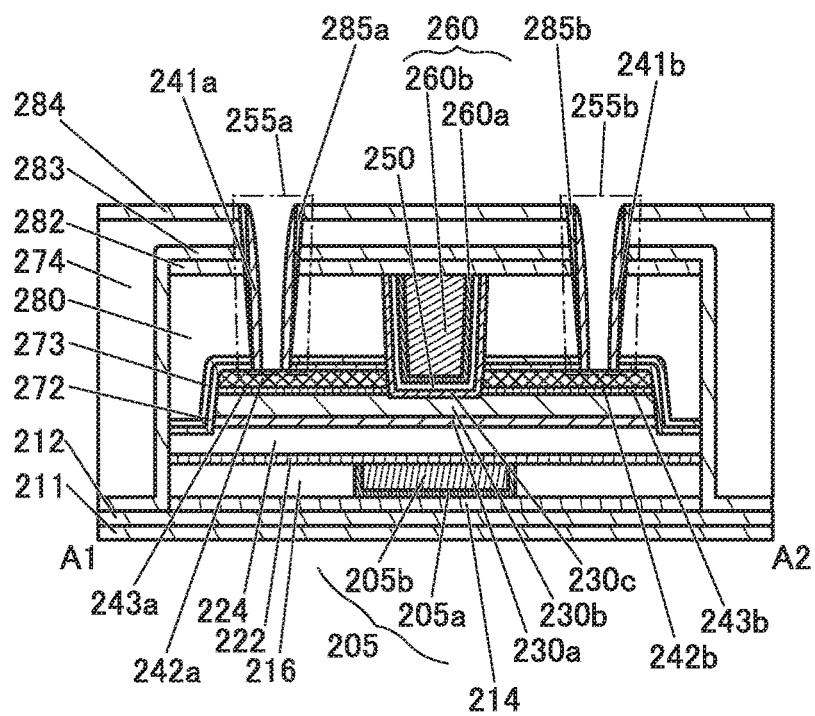
Figure 17D:
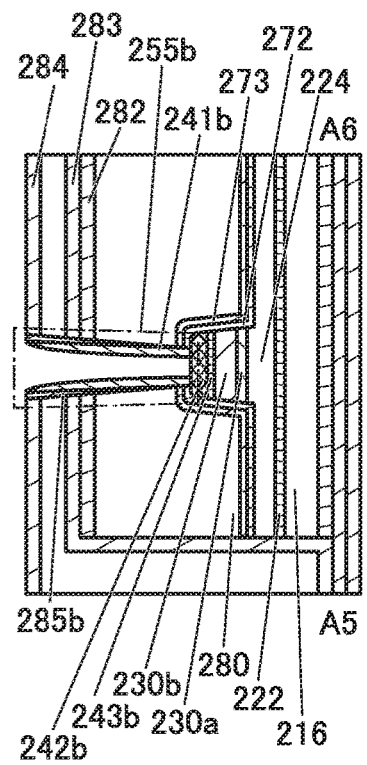
Figure 18A:
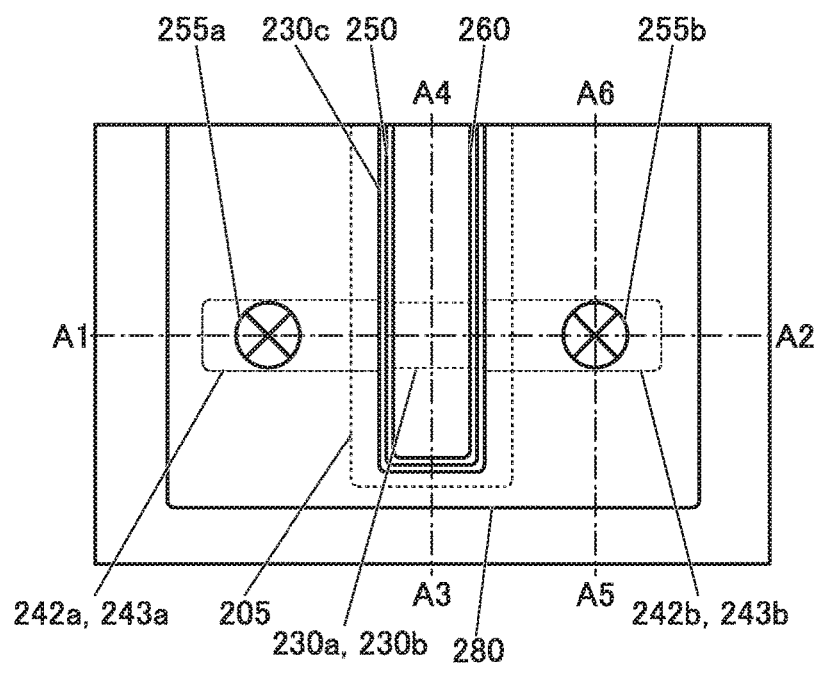
FIG. 18A is a top view illustrating a method for manufacturing a semiconductor device.
Figure 18C:
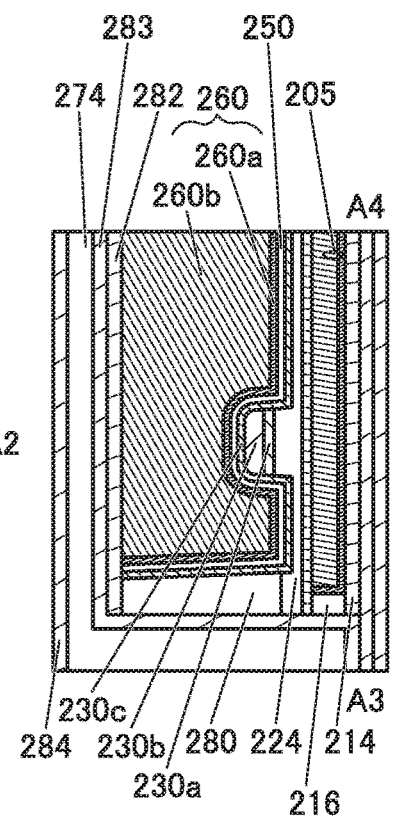
FIGS. 18B to 18D are cross-sectional views illustrating the method for manufacturing a semiconductor device.
Figure 18B:
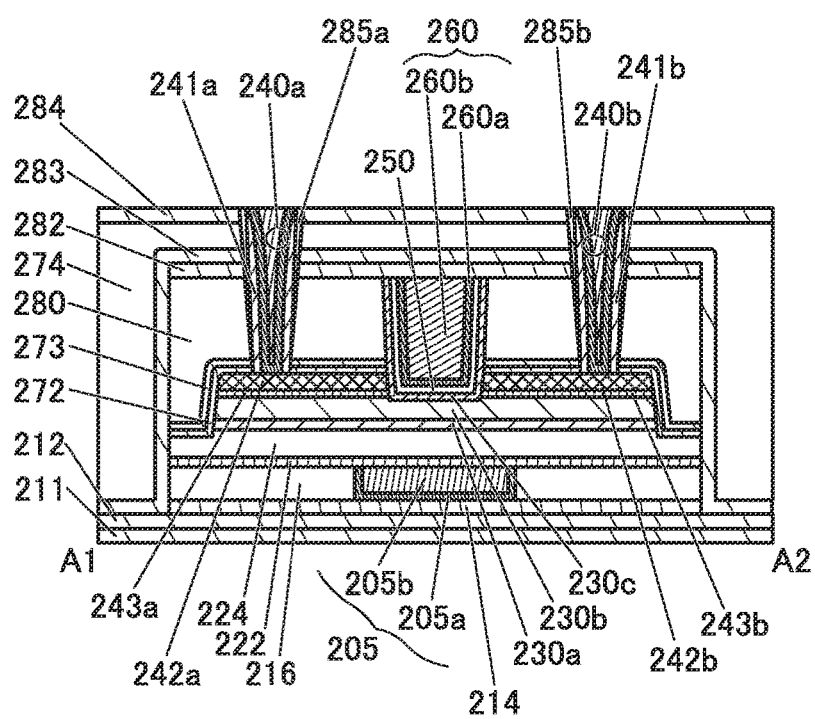
Figure 18D:
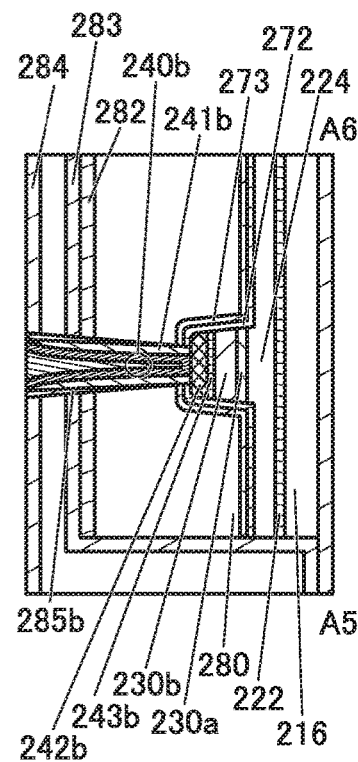
Figure 19A:
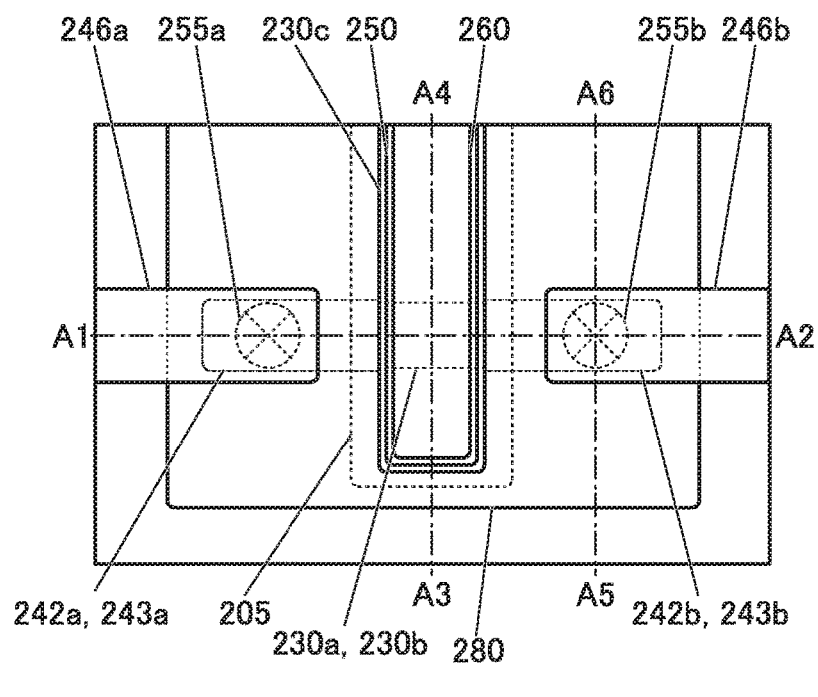
FIG. 19A is a top view illustrating a method for manufacturing a semiconductor device.
Figure 19C:
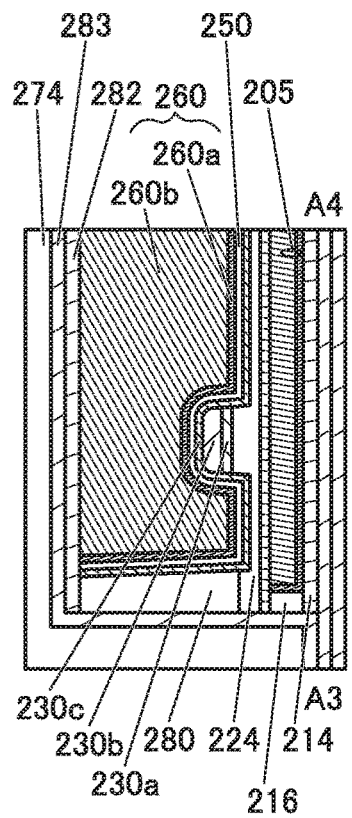
FIGS. 19B to 19D are cross-sectional views illustrating the method for manufacturing a semiconductor device.
Figure 19B:
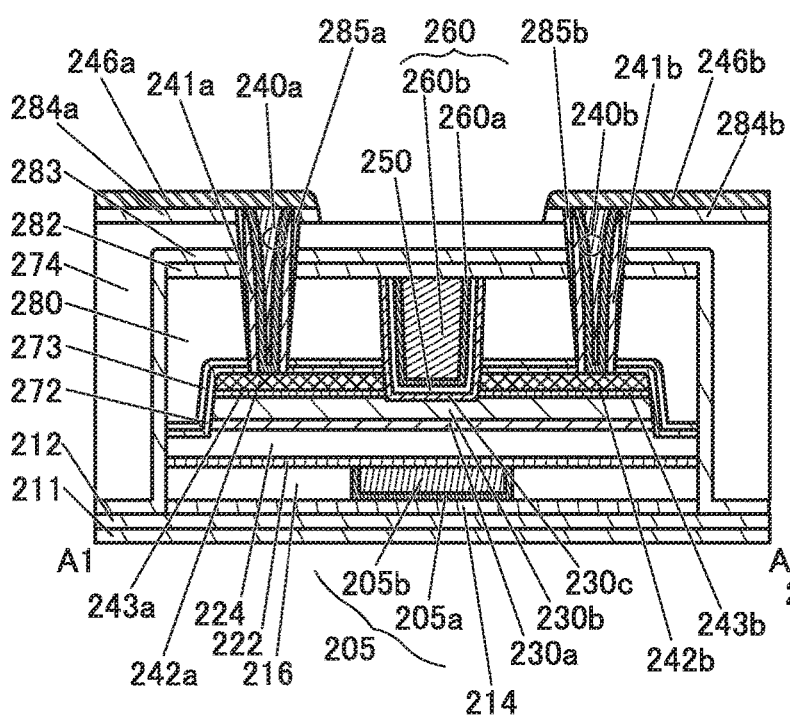
Figure 19D:
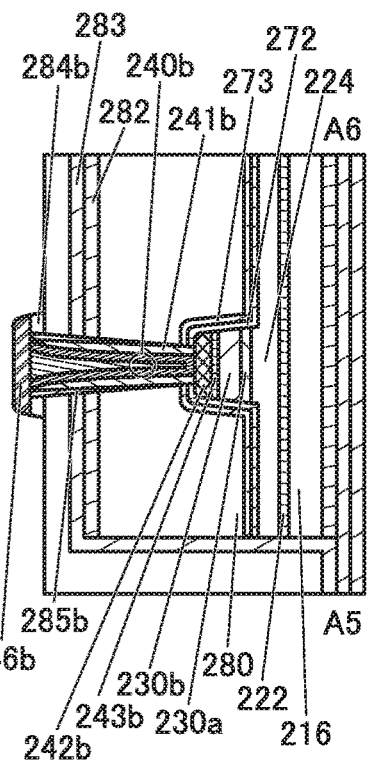

FIG. 3A is a top view of the semiconductor device including the transistor 200. FIG. 3B is a cross-sectional view taken along the dashed-dotted line A1-A2 in FIG. 3A, which corresponds to a cross-sectional view in the channel length direction of the transistor 200. FIG. 3C is a cross-sectional view taken along the dashed-dotted line A3-A4 in FIG. 3A, which corresponds to a cross-sectional view in the channel width direction of the transistor 200. FIG. 3D is a cross-sectional view taken along the dashed-dotted line A5-A6 in FIG. 3A. Note that for simplification of the drawing, some components are not illustrated in the top view in FIG. 3A.

The transistor 200 illustrated in FIGS. 3A to 3D is different from the transistor 200 illustrated in FIGS. 1A to 1D in that the insulator 284 remains also in a region not overlapping with the conductor 246.

In the case where the conductor 246 is formed by a dry etching method or a wet etching method, for example, the insulator 284 can remain also in a region not overlapping with the conductor 246 by setting the etching rate of the insulator 284 extremely lower than that of the conductor 246.

Even with such a structure, the top and side surfaces of the conductor 246 are in contact with the insulator 286, and the bottom surface of the conductor 246 is in contact with the insulator 284. In other words, the conductor 246 can be surrounded by the insulators 284 and 286. Such a structure can inhibit penetration of oxygen from the outside and oxidation of the conductor 246. Furthermore, such a structure is preferable because impurities such as water and hydrogen can be prevented from diffusing from the conductor 246 to the outside.

Modification Example 3 of Semiconductor Device

FIGS. 20A and 20B each illustrate a structure in which transistors 200_1 to 200_n are collectively sealed with the insulators 283 and 212. Note that the transistors 200_1 to 200_n are arranged in the channel length direction in FIGS. 20A and 20B but are not limited thereto. The transistors 200_1 to 200_n may be arranged in the channel width direction, in a matrix, or without particular regularity.

As illustrated in FIG. 20A, a portion where the insulator 283 is in contact with the insulator 212 (hereinafter, sometimes referred to as a sealing portion 265) is formed outside the transistors 200_1 to 200_n. The sealing portion 265 is formed to surround the transistors 200_1 to 200_n. Such a structure enables the transistors 200_1 to 200_n to be surrounded by the insulators 283 and 212. Accordingly, a plurality of transistor groups surrounded by the sealing portion 265 are provided over the substrate.

Dicing lines (sometimes referred to as scribe lines, dividing lines, or cutting lines) may be provided to overlap with the sealing portion 265. Since the substrate is divided along the dicing lines, a group of transistors surrounded by the sealing portion 265 are cut into one chip.

FIG. 20A illustrates an example where the transistors 200_1 to 200_n are surrounded by one sealing portion 265; however, the number of sealing portions 265 is not limited to one. As illustrated in FIG. 20B, the transistors 200_1 to 200_n may be surrounded by a plurality of sealing portions. In FIG. 20B, the transistors 200_1 to 200_n are surrounded by a sealing portion 265a and further surrounded by a sealing portion 265b.

When the transistors 200_1 to 200_n are surrounded by the plurality of sealing portions in this manner, the area of a portion where the insulator 283 is in contact with the insulator 212 increases, which further improves adhesion between the insulators 283 and 212. Accordingly, the transistors 200_1 to 200_n can be sealed more surely.

In that case, the dicing lines may be provided to overlap with the sealing portion 265a or 265b, or may be provided between the sealing portions 265a and 265b.

Modification Example 4 of Semiconductor Device

FIGS. 21A and 21B each illustrate a structure in which the transistors 200_1 to 200_n are collectively sealed with the insulators 283 and 212. The semiconductor device in FIGS. 21A and 21B is different from the semiconductor device in FIGS. 20A and 20B in that the transistors 200 have the structure described in <Modification example 1 of semiconductor device>. Refer to the description of FIGS. 20A and 20B for the other components and effects.

According to one embodiment of the present invention, a semiconductor device having favorable electrical characteristics can be provided. According to one embodiment of the present invention, a semiconductor device with normally-off electrical characteristics can be provided. According to one embodiment of the present invention, a highly reliable semiconductor device can be provided. According to one embodiment of the present invention, a semiconductor device with a high on-state current can be provided. According to one embodiment of the present invention, a semiconductor device with excellent frequency characteristics can be provided. According to one embodiment of the present invention, a semiconductor device that can be miniaturized or highly integrated can be provided. According to one embodiment of the present invention, a semiconductor device with a low off-state current can be provided. According to one embodiment of the present invention, a semiconductor device with low power consumption can be provided. According to one embodiment of the present invention, a semiconductor device that can be manufactured with high productivity can be provided.

Embodiment 2

In this embodiment, one embodiment of a semiconductor device is described with reference to FIG. 22 to FIG. 25.

[Memory Device 1]

Figure 22:
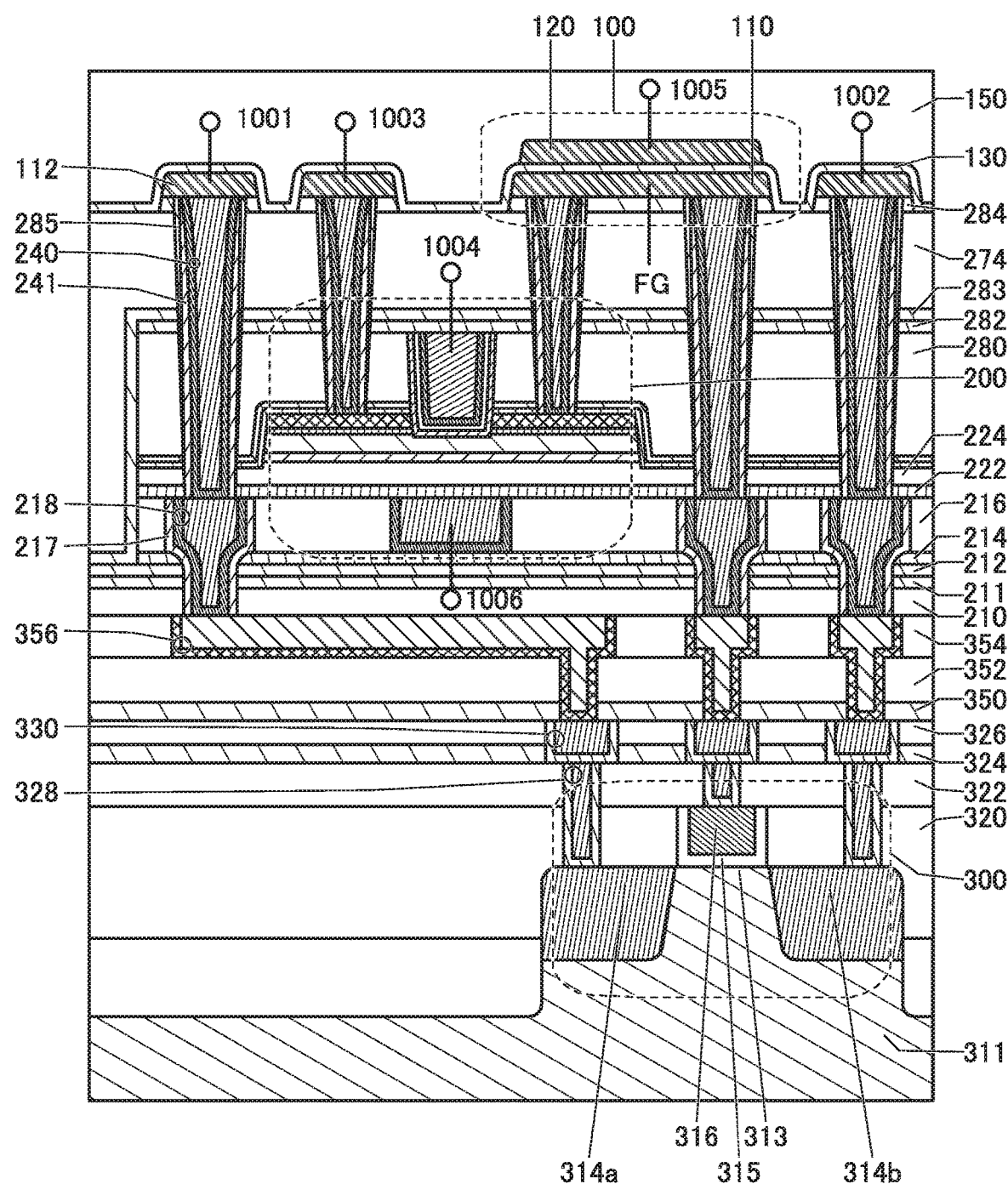
FIG. 22 is a cross-sectional view illustrating a structure of a memory device.

FIG. 22 illustrates an example of a memory device using the semiconductor device of one embodiment of the present invention. The memory device illustrated in FIG. 22 includes the transistor 200, a transistor 300, and a capacitor 100. The transistor 200 is provided above the transistor 300, and the capacitor 100 is provided above the transistor 300 and the transistor 200. The transistor 200 described in the above embodiment can be used as the transistor 200.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of refresh operation, which leads to a sufficient reduction in power consumption of the memory device.

In the semiconductor device illustrated in FIG. 22, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

By arranging the memory devices illustrated in FIG. 22 in a matrix, a memory cell array can be formed.

<Transistor 300>

The transistor 300 is provided on a substrate 311 and includes a conductor 316 functioning as a gate, an insulator 315 functioning as a gate insulator, a semiconductor region 313 that is part of the substrate 311, and a low-resistance region 314a and a low-resistance region 314b functioning as a source region and a drain region. The transistor 300 may be a p-channel transistor or an n-channel transistor.

In the transistor 300 illustrated in FIG. 22, the semiconductor region 313 (part of the substrate 311) in which a channel is formed has a projecting portion. Furthermore, the conductor 316 is provided to cover the top and side surfaces of the semiconductor region 313 with the insulator 315 positioned therebetween. Note that the conductor 316 may be formed using a material for adjusting the work function. The transistor 300 having such a structure is also referred to as a FIN transistor because the projecting portion of the semiconductor substrate is utilized. An insulator functioning as a mask for forming the projecting portion may be provided in contact with the top surface of the projecting portion. Although the case where the projecting portion is formed by processing part of the semiconductor substrate is described here, a semiconductor film having a projecting shape may be formed by processing an SOI substrate.

Note that the structure of the transistor 300 is not limited to that illustrated in FIG. 22, which is only an example, and an appropriate transistor may be used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 that are over the conductor 240 can be formed at the same time. Note that the conductor 112 functions as a plug or a wiring that is electrically connected to the capacitor 100, the transistor 200, or the transistor 300.

The conductor 112 and the conductor 110 each have a single-layer structure in FIG. 22; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, the insulator 130 preferably has a stacked-layer structure using a material with high dielectric strength, such as silicon oxynitride, and a high dielectric constant (high-k) material. In the capacitor 100 having such a structure, a sufficient capacitance can be provided owing to the high dielectric constant (high-k) insulator, and the dielectric strength can be increased owing to the insulator with high dielectric strength, so that the electrostatic breakdown of the capacitor 100 can be prevented.

Examples of the insulator using a high dielectric constant (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the material with high dielectric strength (a material having a low dielectric constant) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

A wiring layer provided with an interlayer film, a wiring, a plug, and the like may be provided between the components. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases, and part of a conductor functions as a plug in other cases.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are provided in the insulators 320, 322, 324, and 326. Note that the conductors 328 and 330 each function as a plug or a wiring.

The insulator functioning as an interlayer film may function as a planarization film that covers a roughness thereunder. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 22, an insulator 350, an insulator 352, and an insulator 354 are stacked in this order. Furthermore, a conductor 356 is formed in the insulators 350, 352, and 354. The conductor 356 functions as a plug or a wiring.

Similarly, a conductor 218, a conductor (the conductor 205) included in the transistor 200, and the like are provided in the insulators 210, 211, 212, 214, and 216. Note that the conductor 218 functions as a plug or a wiring that is electrically connected to the capacitor 100 or the transistor 300. In addition, an insulator 150 is provided over the conductor 120 and the insulator 130.

Here, like the insulator 241 described in the above embodiment, an insulator 217 is provided in contact with the side surface of the conductor 218 functioning as a plug. The insulator 217 is provided in contact with the inner wall of the opening formed in the insulators 210, 212, 214, and 216. That is, the insulator 217 is provided between the conductor 218 and the insulators 210, 212, 214, and 216. Note that the conductors 205 and 218 can be formed in parallel; thus, the insulator 217 is sometimes formed in contact with the side surface of the conductor 205.

As the insulator 217, for example, an insulator such as silicon nitride, aluminum oxide, or silicon nitride oxide can be used. The insulator 217 is provided in contact with the insulators 212, 214, and 222; thus, impurities such as water and hydrogen can be inhibited from entering the oxide 230 from the insulator 210, the insulator 216, or the like through the conductor 218. Silicon nitride is particularly preferable because of its high hydrogen blocking property. Furthermore, oxygen contained in the insulator 210 or the insulator 216 can be prevented from being absorbed by the conductor 218.

The insulator 217 can be formed by a method similar to that for the insulator 241. For example, silicon nitride is deposited by a PEALD method and an opening reaching the conductor 356 is formed by anisotropic etching.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low dielectric constant is used for the insulator functioning as an interlayer film, the parasitic capacitance between wirings can be reduced. Accordingly, a material is preferably selected in accordance with the function of an insulator.

For example, the insulators 150, 210, 352, 354, and the like preferably include an insulator having a low dielectric constant. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Silicon oxide and silicon oxynitride have thermal stability; thus, a combination of silicon oxide or silicon oxynitride with a resin allows the stacked-layer structure to be thermally stable and have a low dielectric constant. Examples of the resin include polyester, polyolefin, polyamide (e.g., nylon and aramid), polyimide, polycarbonate, and acrylic.

When the transistor including an oxide semiconductor is surrounded by an insulator having a function of inhibiting the penetration of oxygen and impurities such as hydrogen, the electrical characteristics of the transistor can be stabilized. Thus, the insulator having a function of inhibiting the penetration of oxygen and impurities such as hydrogen is preferably used as the insulators 214, 211, 212, 350, and the like.

The insulator having a function of inhibiting the penetration of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the penetration of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

The conductors that can be used for wirings or plugs can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having high electrical conductivity typified by polycrystalline silicon containing an impurity element such as phosphorus, or silicide such as nickel silicide may be used.

For example, the conductors 328, 330, 356, 218, 112, and the like may have a single-layer structure or a stacked-layer structure using a conductive material such as a metal material, an alloy material, a metal nitride material, or a metal oxide material which contains any of the above materials. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Plug in Layer Including Oxide Semiconductor>

As described in the above embodiment, the insulator 241 is preferably provided in contact with the side surface of the conductor 240 functioning as a plug. The insulator 285 is preferably formed in contact with at least the insulators 282, 283, and 274 on the inner wall of the opening formed in the insulators 222, 224, 272, 273, 280, 282, 283, 274, and 284. That is, the insulators 241 and 285 are provided between the conductor 240 and the insulators 222, 224, 272, 273, 280, 282, 283, 274, and 284; thus, impurities such as water and hydrogen can be inhibited from entering the oxide 230 from the insulators 224, 280, 274, and the like through the conductor 240. In addition, the formation of the insulators 241 and 285 can prevent oxygen contained in the insulators 224, 280, and 274 from being absorbed by the conductor 240. Thus, the amount of hydrogen diffused from the conductor 240 to the conductor 242 and the oxide 230 can be reduced.

The insulators 241 and 285 are preferably formed using an insulating material having a function of inhibiting diffusion of oxygen and impurities such as water and hydrogen. For example, silicon nitride, silicon nitride oxide, aluminum oxide, or hafnium oxide is preferably used. Silicon nitride is particularly preferable because of its high hydrogen blocking property. Alternatively, for example, a metal oxide such as magnesium oxide, gallium oxide, germanium oxide, yttrium oxide, zirconium oxide, lanthanum oxide, neodymium oxide, or tantalum oxide can be used.

As in the above embodiment, the transistor 200 is preferably sealed with the insulators 283 and 212. Such a structure can inhibit entry of hydrogen contained in the insulator 274 into the insulator 280 or the like.

Note that the conductor 240 penetrates the insulator 283 and the conductor 218 penetrates the insulator 212; however, as described above, the insulator 241 is provided in contact with the conductor 240, and the insulator 217 is provided in contact with the conductor 218. This can reduce the amount of hydrogen entering the inside of the insulators 283 and 212 through the conductors 240 and 218. In this manner, the transistor 200 is sealed more surely with the insulators 283, 212, 241, and 217, so that impurities such as hydrogen contained in the insulator 274 or the like can be inhibited from entering from the outside of the insulator 283.

As described in the above embodiment, the insulators 216, 224, 280, 250, and 274 are preferably formed by a deposition method using the gas in which the number of hydrogen atoms is reduced or hydrogen atoms are removed. This can reduce the hydrogen concentration of the insulators 216, 224, 280, 250, and 274.

As illustrated in FIG. 22, the conductors 240 and 218, which are the vias connected to the conductor 242, are provided in the insulators 216, 224, 280, and 274. As described above, when the hydrogen concentration of the insulators 216, 224, 280, and 274 is reduced, the amount of hydrogen diffused to the conductor 242 and the oxide 230 through the conductors 240 and 218 can be further reduced.

In this manner, the hydrogen concentration of silicon-based insulating films near the transistor 200 can be reduced; thus, the hydrogen concentration of the oxide 230 can be reduced.

<Dicing Line>

Here, a dicing line (also referred to as a scribe line, a dividing line, or a cutting line) that is provided when a large-sized substrate is divided into semiconductor elements so that a plurality of semiconductor devices are each formed in a chip form will be described below. In an example of a dividing method, for example, a groove (a dicing line) for separating the semiconductor elements is formed on the substrate, and then the substrate is cut along the dicing line so that a plurality of semiconductor devices that are separated are obtained.

Here, for example, as illustrated in FIG. 22, a region where the insulator 283 is in contact with the insulator 212 preferably overlaps with the dicing line. That is, an opening is formed in the insulators 280, 273, 272, 224, 222, 216, and 214 in the vicinity of a region to be the dicing line that is provided on the outer edge of a memory cell including the transistors 200.

In other words, the insulator 212 is in contact with the insulator 283 in the opening formed in the insulators 282, 280, 273, 272, 224, 222, 216, and 214. At that time, the insulators 212 and 283 may be formed using the same material and the same method, for example. When the insulators 212 and 283 are formed using the same material and the same method, the adhesion therebetween can be increased. For example, silicon nitride is preferably used.

With such a structure, the transistor 200 can be surrounded by the insulators 212 and 283. Since the insulators 212 and 283 each have a function of inhibiting diffusion of oxygen, hydrogen, and water, entry and diffusion of impurities such as hydrogen and water from the direction of the side surface of the divided substrate into the transistor 200 can be prevented even when the substrate is divided into circuit regions each of which is provided with the semiconductor element in this embodiment to form a plurality of chips.

Figure 23:
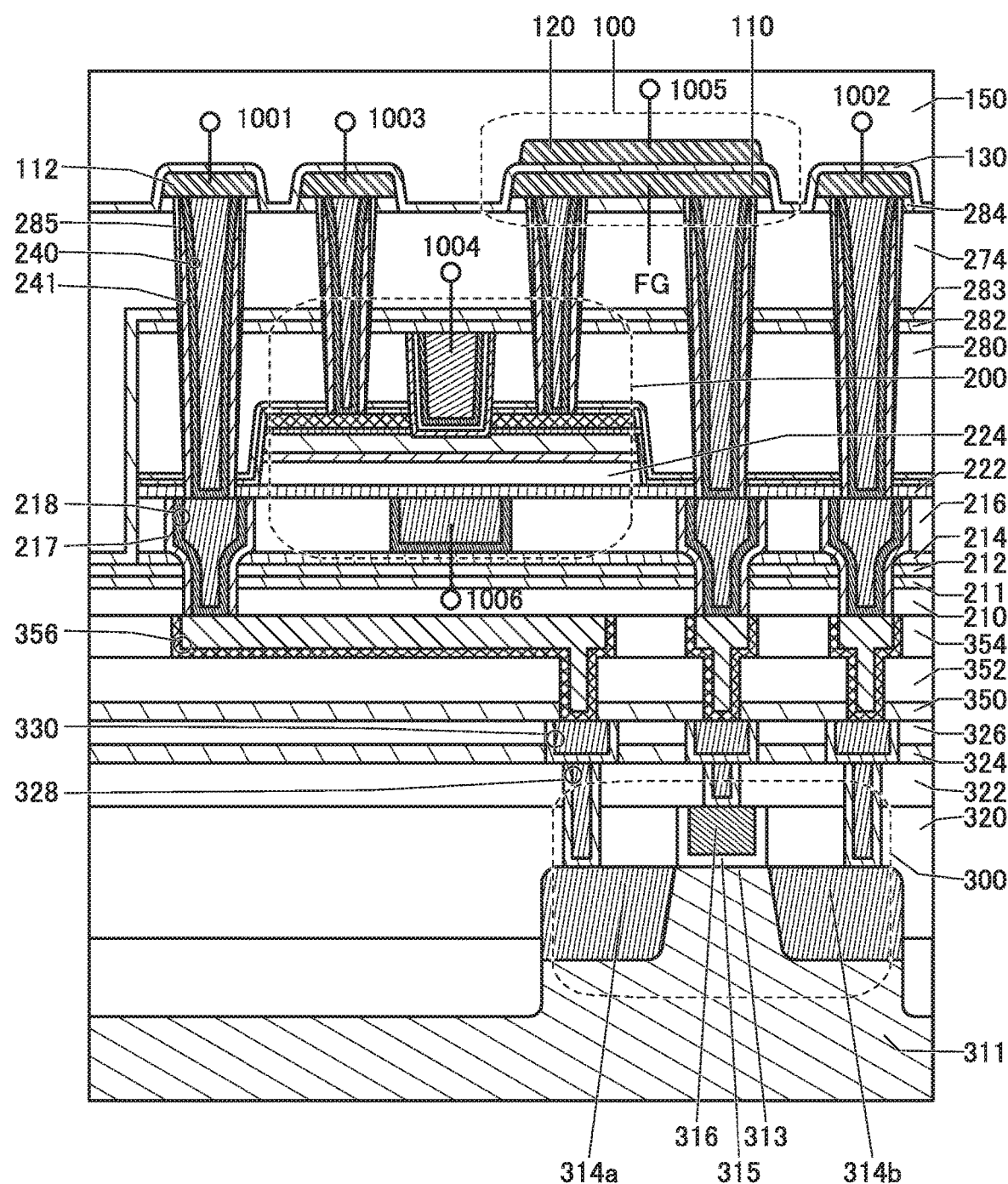
FIG. 23 is a cross-sectional view illustrating a structure of a memory device.

Furthermore, with the structure, excess oxygen in the insulators 280 and 224 can be prevented from diffusing to the outside. Accordingly, excess oxygen in the insulators 280 and 224 is efficiently supplied to the oxide where the channel is formed in the transistor 200. The oxygen can reduce the amount of oxygen vacancies in the oxide where the channel is formed in the transistor 200. Thus, the oxide where the channel is formed in the transistor 200 can be an oxide semiconductor with a low density of defect states and stable characteristics. That is, a change in electrical characteristics of the transistor 200 can be prevented and the reliability can be improved. Note that the structure of the semiconductor device illustrated in FIG. 23 is different from that of the semiconductor device illustrated in FIG. 22 in that the transistor 200 has the structure described in <Modification example 1 of semiconductor device>. Refer to the description of the semiconductor device illustrated in FIG. 22 for the other components.

The above is the description of the structure example. With the use of the structure, a change in electrical characteristics can be reduced and reliability can be improved in a semiconductor device using a transistor including an oxide semiconductor. Alternatively, a transistor including an oxide semiconductor with a high on-state current can be provided. Alternatively, a transistor including an oxide semiconductor with a low off-state current can be provided. Alternatively, a semiconductor device with low power consumption can be provided.

[Memory Device 2]

Figure 24:
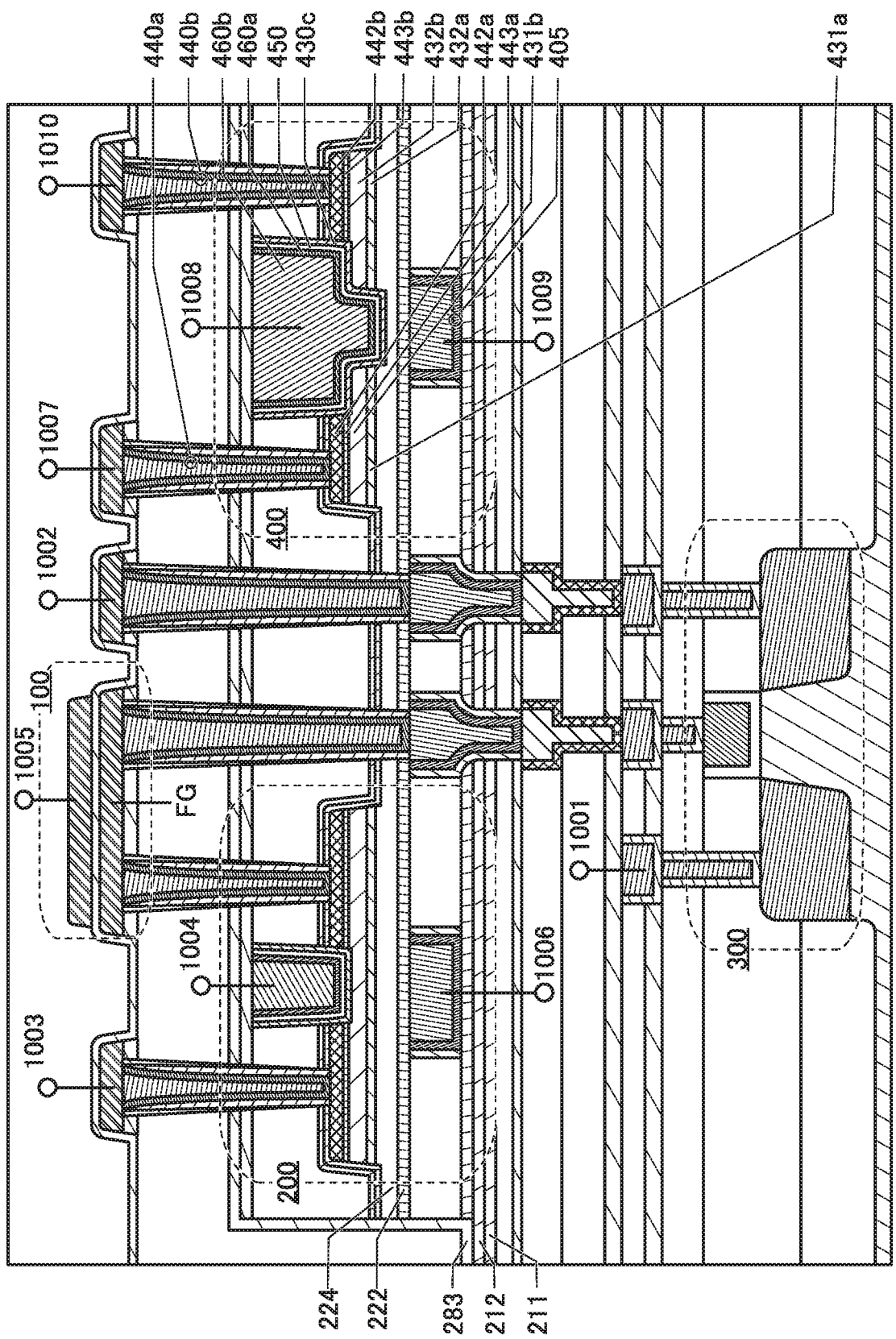
FIG. 24 is a cross-sectional view illustrating a structure of a memory device.

FIG. 24 illustrates an example of a memory device using the semiconductor device of one embodiment of the present invention. The memory device illustrated in FIG. 24 includes a transistor 400 in addition to the semiconductor device illustrated in FIG. 22 that includes the transistor 200, the transistor 300, and the capacitor 100.

The transistor 400 can control a second gate voltage of the transistor 200. For example, a first gate and a second gate of the transistor 400 are diode-connected to a source thereof, and the source of the transistor 400 is connected to the second gate of the transistor 200. When a negative potential of the second gate of the transistor 200 is retained in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be retained for a long time even without power supply to the transistors 200 and 400. Accordingly, the memory device including the transistors 200 and 400 can retain stored data for a long time.

In FIG. 24, the wiring 1001 is electrically connected to the source of the transistor 300. The wiring 1002 is electrically connected to the drain of the transistor 300. The wiring 1003 is electrically connected to one of the source and the drain of the transistor 200. The wiring 1004 is electrically connected to the gate of the transistor 200. The wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400. The wirings 1006, 1007, 1008, and 1009 are electrically connected to each other.

When the memory devices each of which is illustrated in FIG. 24 are arranged in a matrix as in the case of the memory devices illustrated in FIG. 22, a memory cell array can be formed. Note that one transistor 400 can control second gate voltages of the transistors 200. For this reason, the number of transistors 400 is preferably smaller than the number of transistors 200. The transistors 200 and 400 can be sealed with the insulators 212 and 283 in the memory device illustrated in FIG. 24, as in the memory device illustrated in FIG. 22.

<Transistor 400>

The transistors 400 and 200 are formed in the same layer and thus can be formed in parallel. The transistor 400 includes a conductor 460 (a conductor 460a and a conductor 460b) functioning as a first gate, a conductor 405 functioning as a second gate, the insulator 222, the insulator 224, and an insulator 450 functioning as a gate insulating layer, an oxide 430c including a channel formation region, a conductor 442a, an oxide 443a, an oxide 431a, and an oxide 431b functioning as a source, a conductor 442b, an oxide 443b, an oxide 432a, and an oxide 432b functioning as a drain, a conductor 440 (a conductor 440a and a conductor 440b) functioning as a plug, and the insulators 272 and 273 functioning as a barrier insulating film.

In the transistor 400, the conductor 405 is in the same layer as the conductor 205. The oxides 431a and 432a are in the same layer as the oxide 230a, and the oxides 431b and 432b are in the same layer as the oxide 230b. The conductor 442 is in the same layer as the conductor 242. The oxide 443 is in the same layer as the oxide 243. The oxide 430c is in the same layer as the oxide 230c. The insulator 450 is in the same layer as the insulator 250. The conductor 460 is in the same layer as the conductor 260. The conductor 440 is in the same layer as the conductor 240.

Note that the components in the same layer can be formed at the same time. For example, the oxide 430c can be formed by processing an oxide film to be the oxide 230c.

Figure 25:
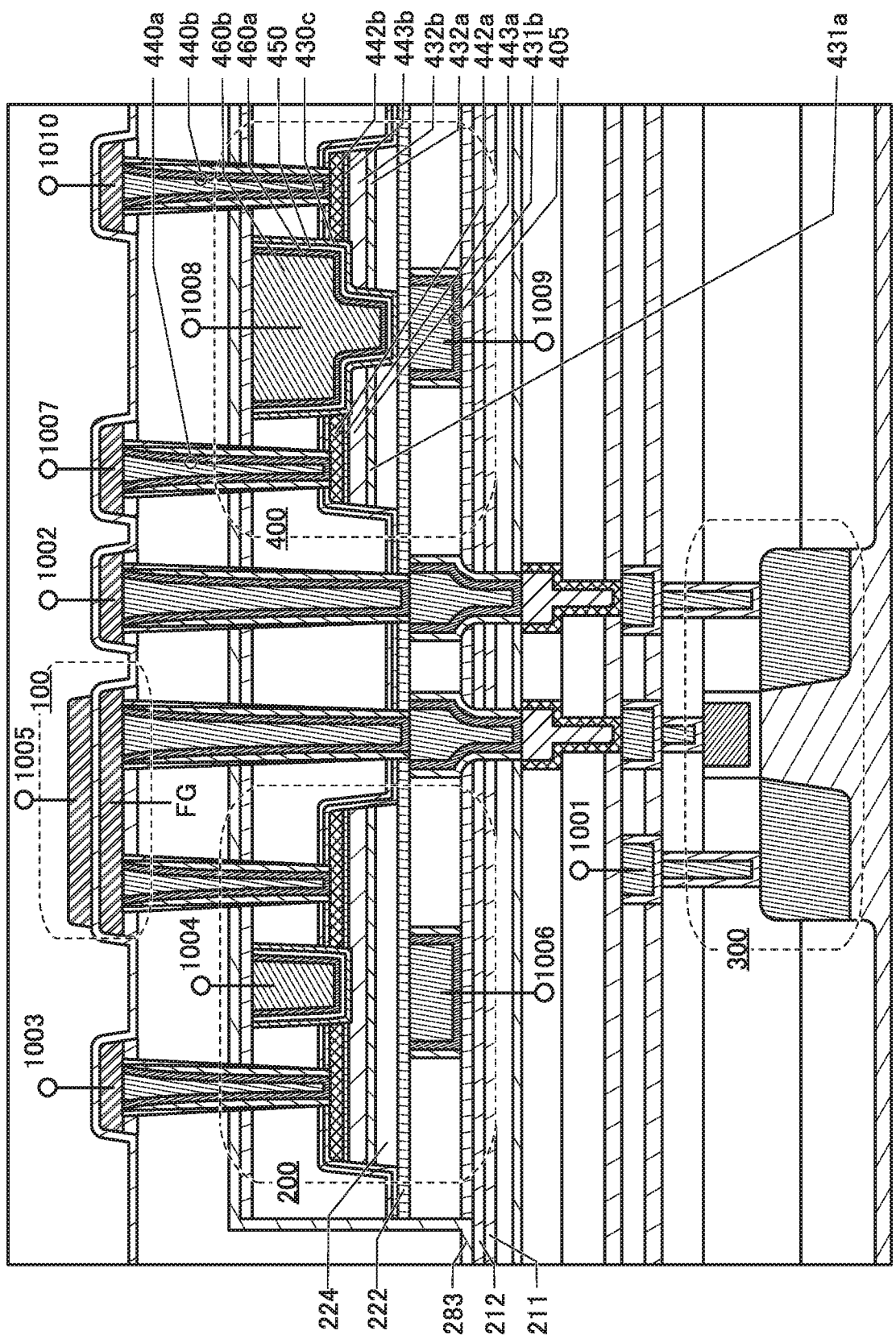
FIG. 25 is a cross-sectional view illustrating a structure of a memory device.

In the oxide 430c functioning as an active layer of the transistor 400, the amounts of oxygen vacancies and impurities such as hydrogen and water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low. Note that the structure of the semiconductor device illustrated in FIG. 25 is different from that of the semiconductor device illustrated in FIG. 24 in that the transistor 200 has the structure described in <Modification example 1 of semiconductor device>. Refer to the description of the semiconductor device illustrated in FIG. 24 for the other components.

The structures, the methods, and the like described in this embodiment can be combined as appropriate with any of the structures, the methods, and the like described in the other embodiments and examples.

Embodiment 3

In this embodiment, a memory device of one embodiment of the present invention including a transistor in which an oxide is used for a semiconductor (hereinafter, sometimes referred to as an OS transistor) and a capacitor (hereinafter, such a memory device is sometimes referred to as an OS memory device) is described with reference to FIGS. 26A and 26B and FIGS. 27A to 27H. An OS memory device includes at least a capacitor and an OS transistor that controls the charging and discharging of the capacitor. Since the OS transistor has an extremely low off-state current, the OS memory device has excellent retention characteristics and can function as a nonvolatile memory.

<Structure Example of Memory Device>

Figure 26A:
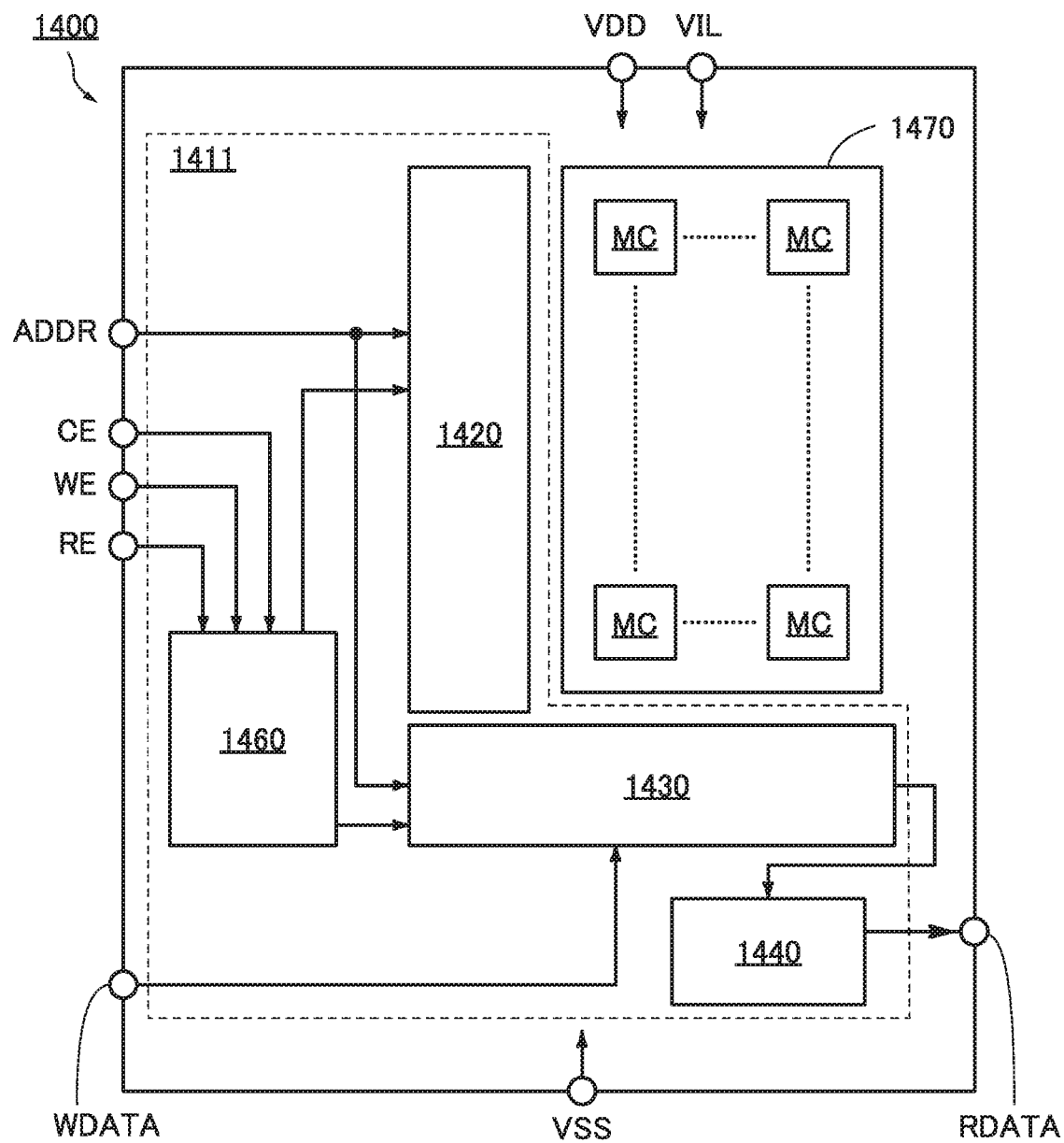
FIG. 26A is a block diagram illustrating a structure example of a memory device.

FIG. 26A illustrates a structure example of an OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes a column decoder, a precharge circuit, a sense amplifier, and a write circuit, for example. The precharge circuit has a function of precharging wirings. The sense amplifier has a function of amplifying a data signal read from a memory cell. Note that the wirings mentioned above are connected to memory cells included in the memory cell array 1470 and will be described later in detail. The amplified data signal is output as a data signal RDATA to the outside of the memory device 1400 through the output circuit 1440. The row circuit 1420 includes a row decoder and a word line driver circuit, for example, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the signals (CE, WE, and RE) input from the outside, and generates control signals for the row decoder and the column decoder. The signal CE is a chip enable signal, the signal WE is a write enable signal, and the signal RE is a read enable signal. Signals processed by the control logic circuit 1460 are not limited to the above, and other control signals may be input as necessary.

The memory cell array 1470 includes a plurality of memory cells MC arranged in a matrix and a plurality of wirings. Note that the number of wirings that connect the memory cell array 1470 to the row circuit 1420 depends on the configuration of the memory cell MC, the number of memory cells MC in one column, and the like. The number of wirings that connect the memory cell array 1470 to the column circuit 1430 depends on the configuration of the memory cell MC, the number of memory cells MC in one row, and the like.

Figure 26B:
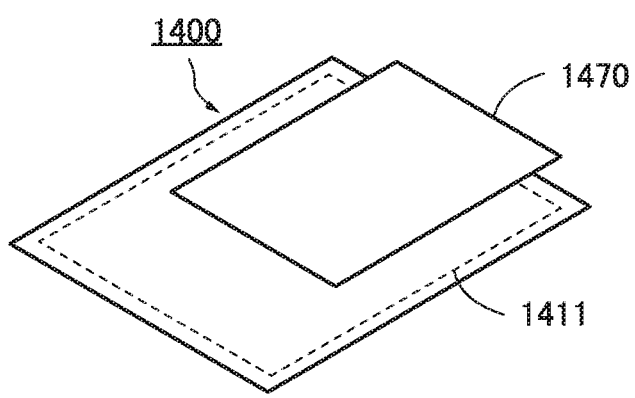
FIG. 26B is a schematic view of the memory device.

Note that FIG. 26A illustrates an example in which the peripheral circuit 1411 and the memory cell array 1470 are formed on the same plane; however, this embodiment is not limited thereto. For example, as illustrated in FIG. 26B, the memory cell array 1470 may be provided over the peripheral circuit 1411 to partly overlap with the peripheral circuit 1411. For example, the sense amplifier may be provided below the memory cell array 1470 so that they overlap with each other.

FIGS. 27A to 27H each illustrate a configuration example of a memory cell that can be used as the memory cell MC.

[DOSRAM]

Figure 27A:
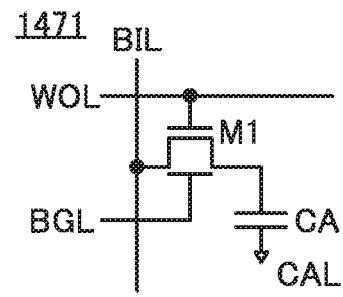
FIGS. 27A to 27H are circuit diagrams each illustrating a configuration example of a memory device.
Figure 27B:
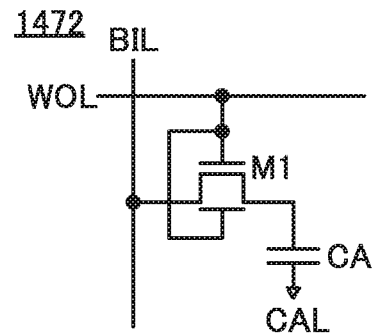
Figure 27C:
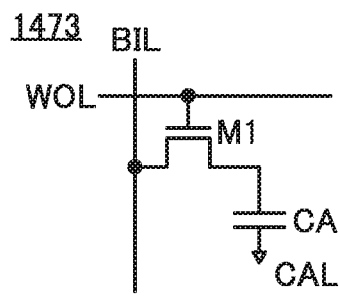
Figure 27D:
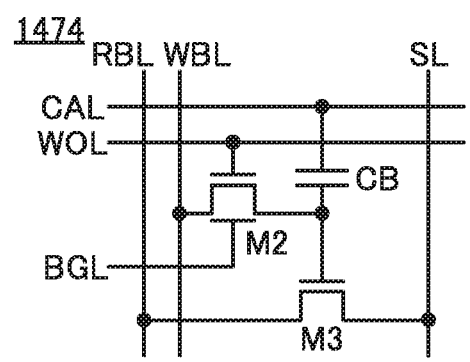
Figure 27E:
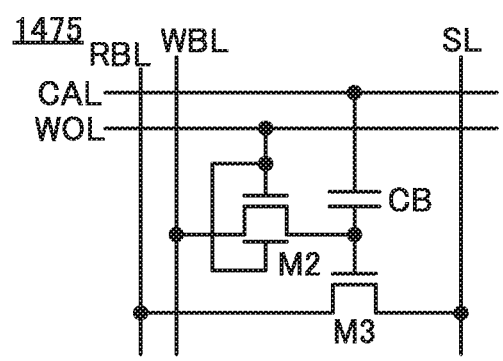
Figure 27F:
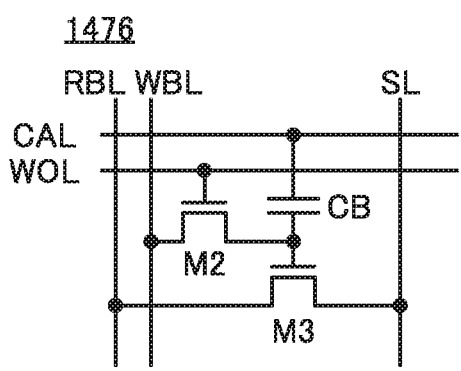
Figure 27G:
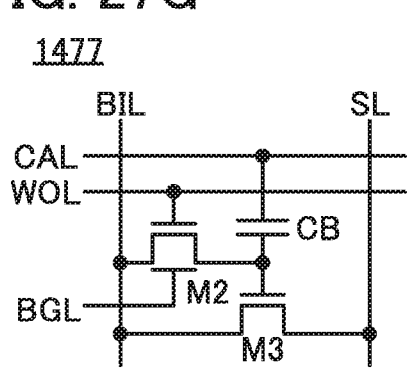

FIGS. 27A to 27C illustrate circuit configuration examples of a DRAM cell. In this specification and the like, a DRAM using a memory cell including one OS transistor and one capacitor is sometimes referred to as a dynamic oxide semiconductor random access memory (DOSRAM). A memory cell 1471 illustrated in FIG. 27A includes a transistor M1 and a capacitor CA. The transistor M1 includes a gate (also sometimes referred to as a front gate) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. A low-level potential is preferably applied to the wiring CAL at the time of data writing and data reading. The wiring BGL functions as a wiring for applying a potential to the back gate of the transistor M1. The threshold voltage of the transistor M1 can be increased or decreased by application of a given potential to the wiring BGL.

The memory cell MC is not limited to the memory cell 1471 and can have a different circuit configuration. For example, in the memory cell MC, the back gate of the transistor M1 may be connected to the wiring WOL instead of the wiring BGL as in a memory cell 1472 illustrated in FIG. 27B. For another example, in the memory cell MC, the transistor M1 may be a single-gate transistor, that is, a transistor without a back gate as in a memory cell 1473 illustrated in FIG. 27C.

When the semiconductor device described in any of the above embodiments is used in the memory cell 1471 and the like, the transistor 200 can be used as the transistor M1 and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of refresh operation for the memory cell can be decreased. Alternatively, refresh operation for the memory cell can be omitted. In addition, since the transistor M1 has an extremely low leakage current, multi-level data or analog data can be retained in the memory cells 1471, 1472, and 1473.

In the DOSRAM, when the sense amplifier is provided below the memory cell array 1470 so that they overlap with each other as described above, the bit line can be shortened. A shorter bit line results in a smaller bit line capacitance, which allows the storage capacitance of the memory cell to be reduced.

[NOSRAM]

FIGS. 27D to 27H illustrate circuit configuration examples of a gain memory cell including two transistors and one capacitor. A memory cell 1474 illustrated in FIG. 27D includes a transistor M2, a transistor M3, and a capacitor CB. The transistor M2 includes a front gate (simply referred to as a gate in some cases) and a back gate. In this specification and the like, a memory device including a gain memory cell using an OS transistor as the transistor M2 is sometimes referred to as a nonvolatile oxide semiconductor RAM (NOSRAM).

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. A low-level potential is preferably applied to the wiring CAL at the time of data writing and reading and during data retention. The wiring BGL functions as a wiring for applying a potential to the back gate of the transistor M2. The threshold voltage of the transistor M2 can be increased or decreased by application of a given potential to the wiring BGL.

The memory cell MC is not limited to the memory cell 1474 and can have a different circuit configuration as appropriate. For example, in the memory cell MC, the back gate of the transistor M2 may be connected to the wiring WOL instead of the wiring BGL as in a memory cell 1475 illustrated in FIG. 27E. For another example, in the memory cell MC, the transistor M2 may be a single-gate transistor, that is, a transistor without a back gate as in a memory cell 1476 illustrated in FIG. 27F. For another example, in the memory cell MC, one wiring BIL may be provided instead of the wiring WBL and the wiring RBL as in a memory cell 1477 illustrated in FIG. 27G.

When the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. That is, with the use of the transistor M2, written data can be retained for a long time, and thus the frequency of refresh operation for the memory cell can be decreased. Alternatively, refresh operation for the memory cell can be omitted. In addition, since the transistor M2 has an extremely low leakage current, multi-level data or analog data can be retained in the memory cell 1474. The same applies to the memory cells 1475 to 1477.

Note that the transistor M3 may be a transistor containing silicon in a channel formation region (hereinafter, sometimes referred to as a Si transistor). A Si transistor may be either an n-channel transistor or a p-channel transistor. A Si transistor has higher field-effect mobility than an OS transistor in some cases. For that reason, a Si transistor may be used as the transistor M3 functioning as a read transistor. Furthermore, when a Si transistor is used as the transistor M3, the transistor M2 can be formed over the transistor M3, in which case the area of the memory cell can be reduced, leading to high integration of the memory device.

Alternatively, the transistor M3 may be an OS transistor. When an OS transistor is used as each of the transistors M2 and M3, the memory cell array 1470 can be formed using only n-channel transistors.

Figure 27H:
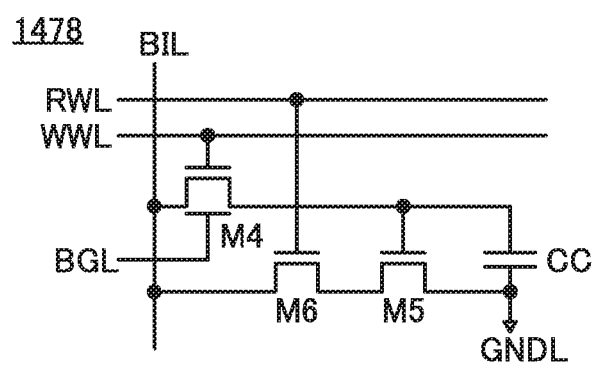

FIG. 27H illustrates an example of a gain memory cell including three transistors and one capacitor. A memory cell 1478 illustrated in FIG. 27H includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL supplies a low-level potential. Note that the memory cell 1478 may be electrically connected to the wiring RBL and the wiring WBL instead of the wiring BIL.

The transistor M4 is an OS transistor with a back gate that is electrically connected to the wiring BGL. Note that the back gate and the gate of the transistor M4 may be electrically connected to each other. The transistor M4 does not necessarily include the back gate.

Note that each of the transistors M5 and M6 may be an n-channel Si transistor or a p-channel Si transistor. Alternatively, the transistors M4 to M6 may be OS transistors, in which case the memory cell array 1470 can be formed using only n-channel transistors.

When the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the configurations of the peripheral circuit 1411, the memory cell array 1470, and the like described in this embodiment are not limited to those described above. The arrangement and functions of these circuits and the wirings, circuit components, and the like connected to the circuits can be changed, removed, or added as needed.

The structures, the methods, and the like described in this embodiment can be combined as appropriate with any of the structures, the methods, and the like described in the other embodiments and examples.

Embodiment 4

In this embodiment, an example of a chip 1200 on which the semiconductor device of the present invention is mounted is described with reference to FIGS. 28A and 28B. A plurality of circuits (systems) are mounted on the chip 1200. The technique for integrating a plurality of circuits (systems) on one chip is sometimes referred to as system on chip (SoC).

Figure 28A:
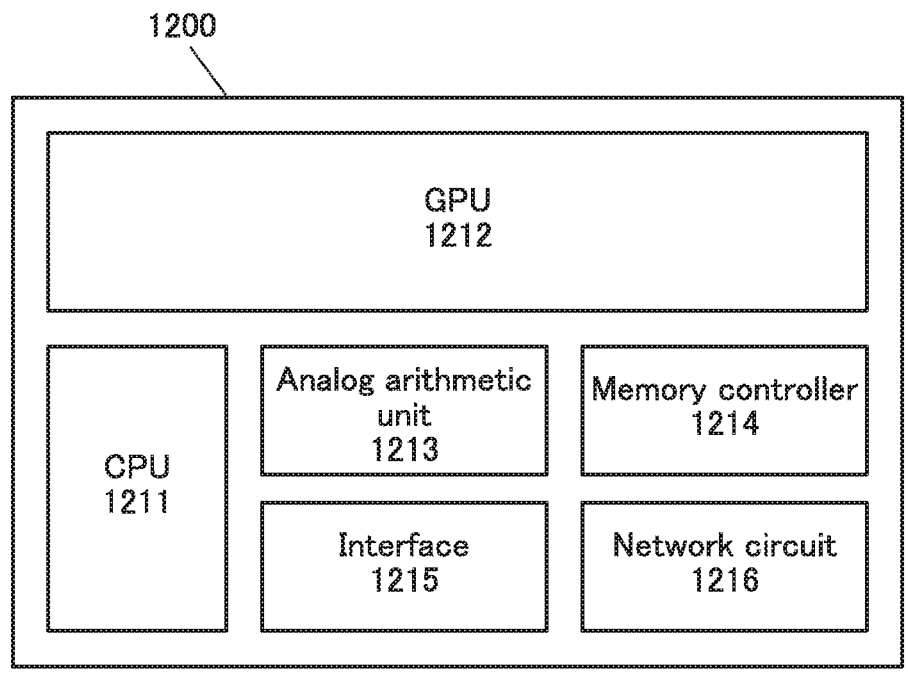
FIG. 28A is a block diagram of a semiconductor device.

As illustrated in FIG. 28A, the chip 1200 includes a central processing unit (CPU) 1211, a graphics processing unit (GPU) 1212, at least one analog arithmetic unit 1213, at least one memory controller 1214, at least one interface 1215, at least one network circuit 1216, and the like.

Figure 28B:
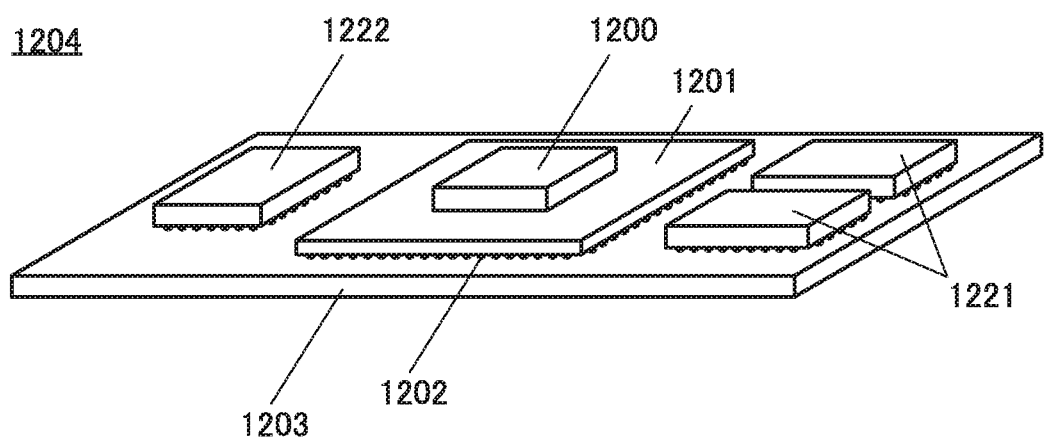
FIG. 28B is a schematic view of the semiconductor device.

A bump (not illustrated) is provided on the chip 1200, and as illustrated in FIG. 28B, the chip 1200 is connected to a first surface of a printed circuit board (PCB) 1201. A plurality of bumps 1202 are provided on the rear side of the first surface of the PCB 1201, and the PCB 1201 is connected to a motherboard 1203.

Memory devices such as a DRAM 1221 and a flash memory 1222 may be provided on the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the common memory. The GPU 1212 is suitable for parallel computation of a large quantity of data and thus can be used for image processing and product-sum operation. When an image processing circuit and a product-sum operation circuit that include an oxide semiconductor of the present invention are provided in the GPU 1212, image processing and product-sum operation can be performed with low power consumption.

Since the CPU 1211 and the GPU 1212 are provided in the same chip, a wiring between the CPU 1211 and the GPU 1212 can be shortened. Accordingly, data transfer from the CPU 1211 to the GPU 1212, data transfer between the memories included in the CPU 1211 and the GPU 1212, and transfer of arithmetic operation results from the GPU 1212 to the CPU 1211 after the arithmetic operation in the GPU 1212 can be performed at high speed.

The analog arithmetic unit 1213 includes one or both of an analog/digital (A/D) converter circuit and a digital/analog (D/A) converter circuit. Moreover, the analog arithmetic unit 1213 may include the above product-sum operation circuit.

The memory controller 1214 includes a circuit functioning as a controller of the DRAM 1221 and a circuit functioning as the interface of the flash memory 1222.

The interface 1215 includes an interface circuit to be connected to an external device such as a display device, a speaker, a microphone, a camera, or a controller. Examples of the controller include a mouse, a keyboard, and a game controller. As such an interface, a universal serial bus (USB), a high-definition multimedia interface (HDMI) (registered trademark), or the like can be used.

The network circuit 1216 includes a circuit for a network such as a local-area network (LAN). The network circuit 1216 may also include a circuit for network security.

In the chip 1200, the circuits (systems) can be formed in the same manufacturing process. Consequently, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology and thus can be small in size. Moreover, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can execute an arithmetic operation in a deep neural network (DNN), a convolutional neural network (CNN), a recurrent neural network (RNN), an autoencoder, a deep Boltzmann machine (DBM), a deep belief network (DBN), or the like; hence, the chip 1200 can be used as an AI chip or the GPU module 1204 can be used as an AI system module.

The structures, the methods, and the like described in this embodiment can be combined as appropriate with any of the structures, the methods, and the like described in the other embodiments and examples.

Embodiment 5

In this embodiment, application examples of a memory device using the semiconductor device described in the above embodiment are described. For example, the semiconductor device described in the above embodiment can be used for memory devices of a variety of electronic devices (e.g., information terminals, computers, smartphones, e-book readers, digital cameras (including video cameras), video recording/reproducing devices, and navigation systems). Here, computers refer not only to tablet computers, laptop computers, and desktop computers, but also to large computers such as server systems. Alternatively, the semiconductor device described in the above embodiment is used for removable memory devices such as memory cards (e.g., SD cards), USB memories, and solid state drives (SSD). FIGS. 29A to 29E schematically illustrate some structure examples of removable memory devices. For example, the semiconductor device described in the above embodiment is processed into a packaged memory chip and used in a variety of storage devices and removable memories.

Figure 29A:
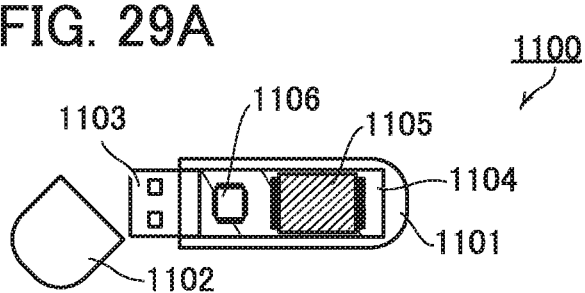
FIGS. 29A to 29E are schematic views of memory devices.

FIG. 29A is a schematic view of a USB memory. A USB memory 1100 includes a housing 1101, a cap 1102, a USB connector 1103, and a substrate 1104. The substrate 1104 is held in the housing 1101. A memory chip 1105 and a controller chip 1106 are attached to the substrate 1104, for example. The semiconductor device described in the above embodiment can be incorporated in the memory chip 1105 or the like on the substrate 1104.

Figure 29B:
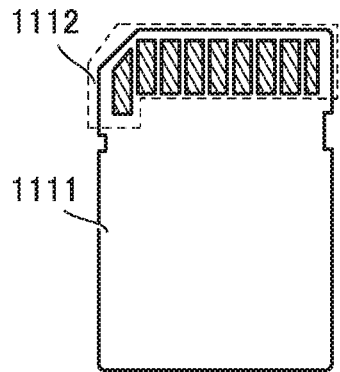
Figure 29C:
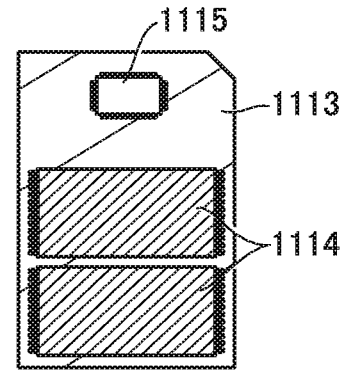

FIG. 29B is a schematic external view of an SD card, and FIG. 29C is a schematic view illustrating the internal structure of the SD card. An SD card 1110 includes a housing 1111, a connector 1112, and a substrate 1113. The substrate 1113 is held in the housing 1111. A memory chip 1114 and a controller chip 1115 are attached to the substrate 1113, for example. When the memory chip 1114 is also provided on the rear side of the substrate 1113, the capacity of the SD card 1110 can be increased. In addition, a wireless chip with a radio communication function may be provided on the substrate 1113, in which case data can be read from and written in the memory chip 1114 by radio communication between the host device and the SD card 1110. The semiconductor device described in the above embodiment can be incorporated in the memory chip 1114 or the like on the substrate 1113.

Figure 29D:
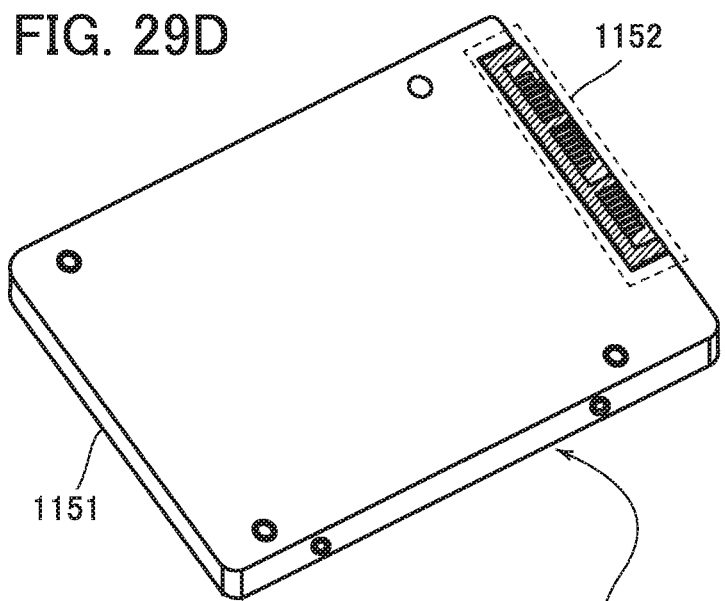
Figure 29E:
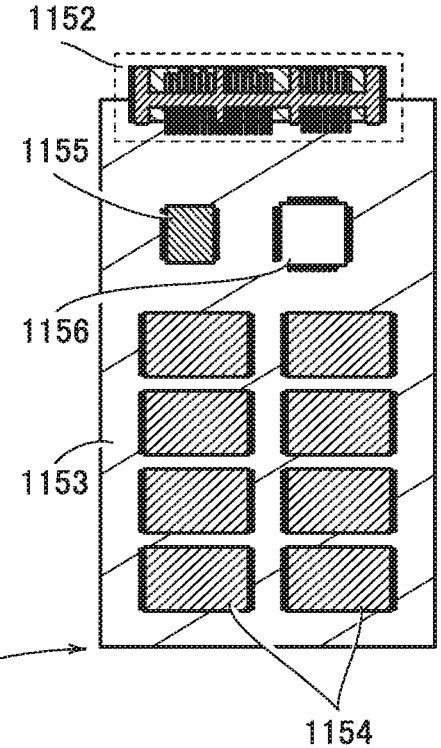

FIG. 29D is a schematic external view of an SSD, and FIG. 29E is a schematic view illustrating the internal structure of the SSD. An SSD 1150 includes a housing 1151, a connector 1152, and a substrate 1153. The substrate 1153 is held in the housing 1151. A memory chip 1154, a memory chip 1155, and a controller chip 1156 are attached to the substrate 1153, for example. The memory chip 1155 is a work memory for the controller chip 1156, and a DOSRAM chip can be used, for example. When the memory chip 1154 is also provided on the rear side of the substrate 1153, the capacity of the SSD 1150 can be increased. The semiconductor device described in the above embodiment can be incorporated in the memory chip 1154 or the like on the substrate 1153.

The structures, the methods, and the like described in this embodiment can be combined as appropriate with any of the structures, the methods, and the like described in the other embodiments and examples.

Embodiment 6

In this embodiment, a field-programmable gate array (FPGA) is described as an example of a semiconductor device of one embodiment of the present invention that includes an OS transistor and a capacitor, with reference to FIGS. 30A to 30C, FIGS. 31A to 31C, FIG. 32, and FIGS. 33A and 33B. In the FPGA of this embodiment, an OS memory is used for a configuration memory and a register. Here, such an FPGA is referred to as an "OS-FPGA".

<<OS-FPGA>>

Figure 30A:
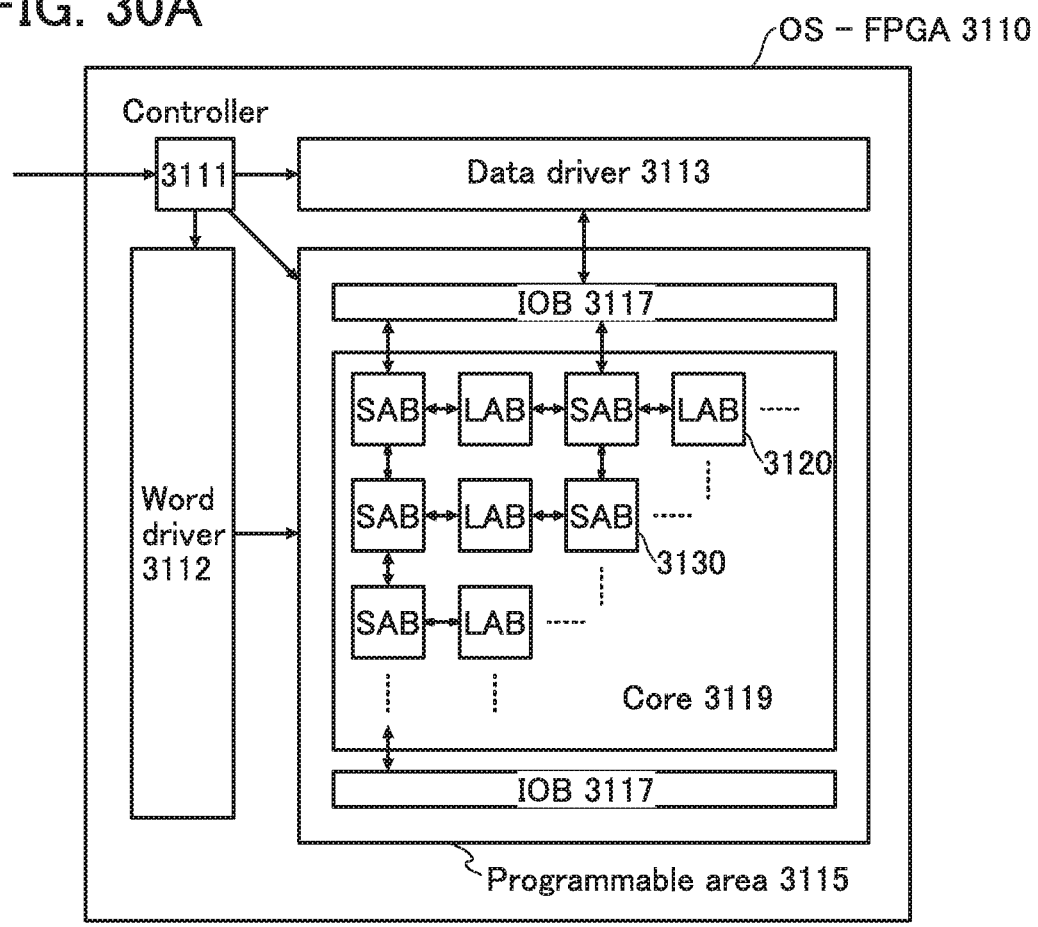
FIGS. 30A to 30C are block diagrams each illustrating a configuration example of a semiconductor device.

FIG. 30A illustrates a configuration example of an OS-FPGA. An OS-FPGA 3110 illustrated in FIG. 30A is capable of normally-off (NOFF) computing for context switching by a multi-context configuration and fine-grained power gating in each PLE. The OS-FPGA 3110 includes a controller 3111, a word driver 3112, a data driver 3113, and a programmable area 3115.

Figure 30B:
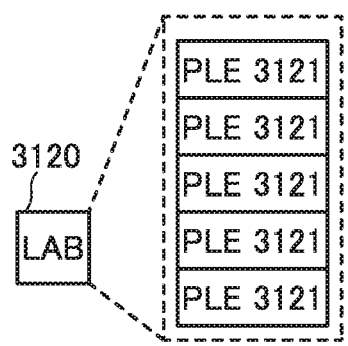
Figure 30C:
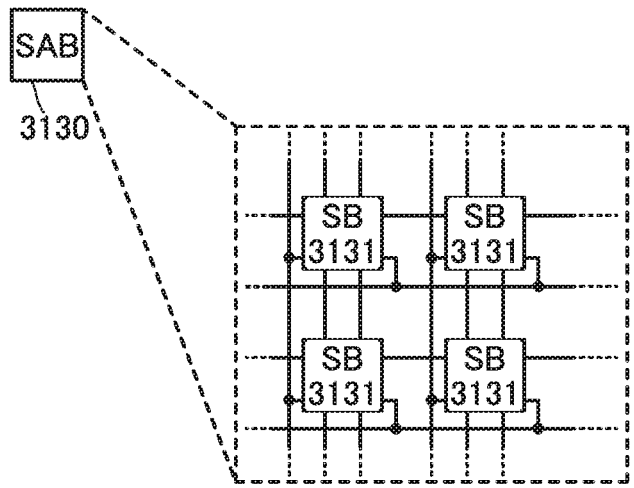

The programmable area 3115 includes two input/output blocks (IOBs) 3117 and a core 3119. The IOBs 3117 each include a plurality of programmable input/output circuits. The core 3119 includes a plurality of logic array blocks (LABs) 3120 and a plurality of switch array blocks (SABs) 3130. Each of the LABs 3120 includes a plurality of PLEs 3121. FIG. 30B illustrates an example in which the LAB 3120 includes five PLEs 3121. As illustrated in FIG. 30C, the SAB 3130 includes a plurality of switch blocks (SBs) 3131 arranged in an array. The LAB 3120 is connected to the LABs 3120 in four directions (on the left, right, top, and bottom sides) through its input terminals and the SABs 3130.

Figure 31A:
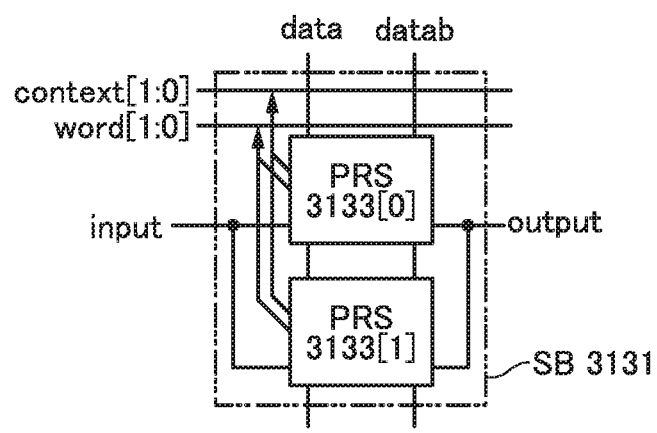
FIG. 31A is a block diagram illustrating a configuration example of a semiconductor device.

The SB 3131 is described with reference to FIGS. 31A to 31C. To the SB 3131 in FIG. 31A, data, datab, signals context[1:0], and signals word[1:0] are input. The data and the datab are configuration data, and the logics of the data and the datab are complementary to each other. The number of contexts in the OS-FPGA 3110 is two, and the signals context[1:0] are context selection signals. The signals word [1:0] are word line selection signals, and wirings to which the signals word[1:0] are input are each a word line.

The SB 3131 includes a programmable routing switch (PRS) 3133[0] and a PRS 3133[1]. The PRS 3133[0] and the PRS 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 31B:
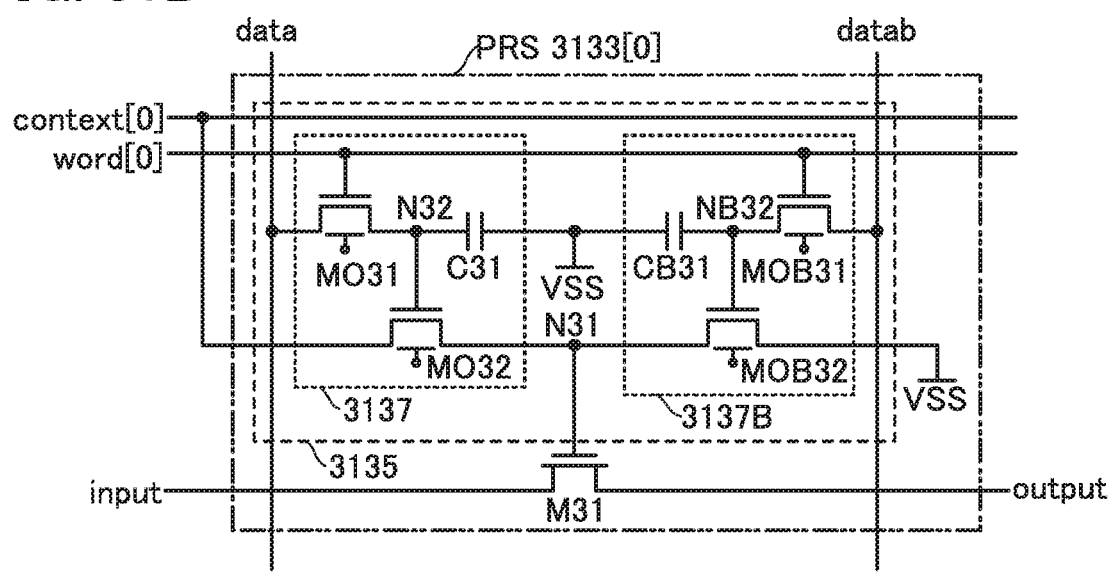
FIG. 31B is a circuit diagram of the semiconductor device.
Figure 31C:
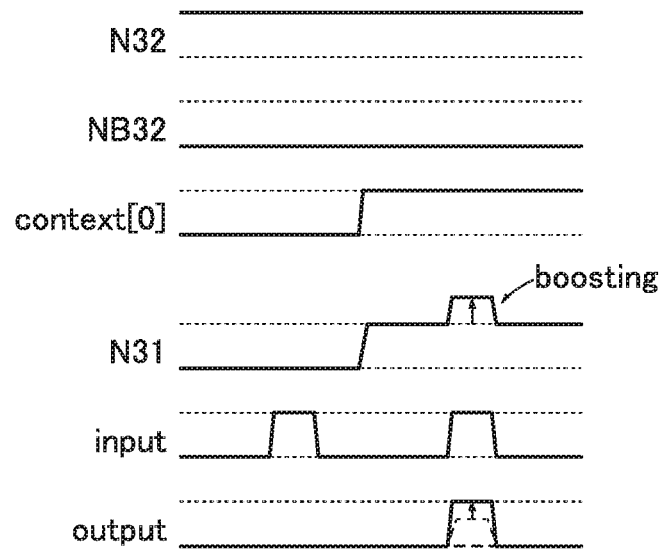
FIG. 31C is a timing chart showing an operation example of the semiconductor device.

FIG. 31B illustrates a circuit configuration example of the PRS 3133[0]. The PRS 3133[0] and the PRS 3133[1] have the same circuit configuration. The PRS 3133[0] and the PRS 3133[1] are different from each other in a context selection signal and a word line selection signal that are input. The signal context[0] and the signal word[0] are input to the PRS 3133[0], and the signal context[1] and the signal word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes a memory circuit 3137 and a memory circuit 3137B. The memory circuit 3137 and the memory circuit 3137B have the same circuit configuration. The memory circuit 3137 includes a capacitor C31, an OS transistor MO31, and an OS transistor MO32. The memory circuit 3137B includes a capacitor CB31, an OS transistor MOB31, and an OS transistor MOB32.

In the case where the semiconductor device described in any of the above embodiments is used in the SAB 3130, the transistor described in any of the above embodiments can be used as the OS transistors MO31 and MOB31. Accordingly, the off-state current of the OS transistors MO31 and MOB31 can be reduced; thus, configuration data can be retained for a long time. In addition, the area occupied by each set consisting of one transistor and one capacitor in the top view can be reduced; accordingly, the semiconductor device of this embodiment can be highly integrated.

The OS transistors MO31, MO32, MOB31, and MOB32 each include a back gate, and these back gates are electrically connected to power supply lines that each supply a fixed voltage.

A gate of the Si transistor M31, a gate of the OS transistor MO32, and a gate of the OS transistor MOB32 correspond to a node N31, a node N32, and a node NB32, respectively. The node N32 and the node NB32 are each a charge retention node of the CM 3135. The OS transistor MO32 controls the conduction state between the node N31 and a signal line for the signal context[0]. The OS transistor MOB32 controls the conduction state between the node N31 and a low-potential power supply line VSS.

A logic of data retained at the memory circuit 3137 and a logic of data retained at the memory circuit 3137B are complementary to each other. Thus, either the OS transistor MO32 or the OS transistor MOB32 is turned on.

The operation example of the PRS 3133[0] is described with reference to FIG. 31C. In the PRS 3133 [0], to which configuration data has already been written, the node N32 is at "H", whereas the node NB32 is at "L".

The PRS 3133[0] is inactive while the signal context[0] is at "L". During this period, even when an input terminal of the PRS 3133[0] is transferred to "H", the gate of the Si transistor M31 is kept at "L" and an output terminal of the PRS 3133[0] is also kept at "L".

The PRS 3133[0] is active while the signal context[0] is at "H". When the signal context[0] is transferred to "H", the gate of the Si transistor M31 is transferred to "H" by the configuration data stored in the CM 3135.

While the PRS 3133[0] is active, when the input terminal is transferred to "H", the gate voltage of the Si transistor M31 is increased by boosting because the OS transistor MO32 of the memory circuit 3137 is a source follower. As a result, the OS transistor MO32 of the memory circuit 3137 loses the driving capability, and the gate of the Si transistor M31 is brought into a floating state.

In the PRS 3133 with a multi-context function, the CM 3135 also functions as a multiplexer.

Figure 32:
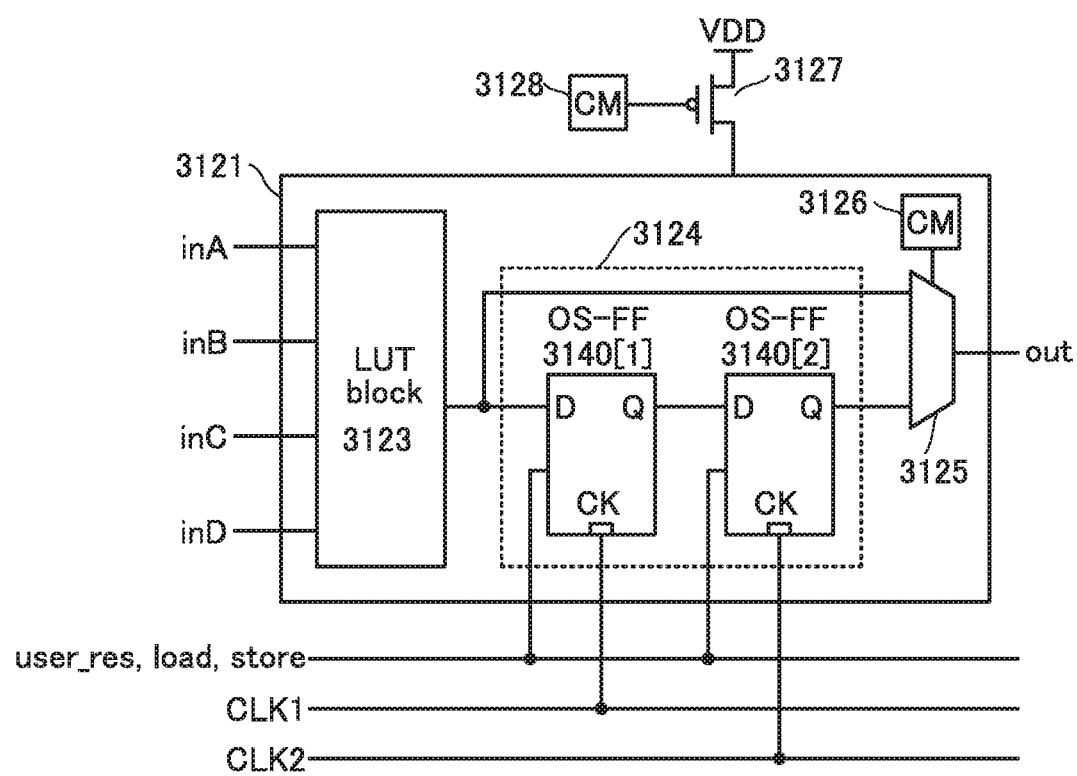
FIG. 32 is a block diagram illustrating a configuration example of a semiconductor device.

FIG. 32 illustrates a configuration example of the PLE 3121. The PLE 3121 includes a lookup table (LUT) block 3123, a register block 3124, a selector 3125, and a CM 3126. The LUT block 3123 is configured to select and output data in the LUT block in accordance with inputs inA to inD. The selector 3125 selects an output of the LUT block 3123 or an output of the register block 3124 in accordance with the configuration data stored in the CM 3126.

The PLE 3121 is electrically connected to a power supply line for a voltage VDD through a power switch 3127. Whether the power switch 3127 is turned on or off is determined in accordance with configuration data stored in a CM 3128. Providing the power switch 3127 for each PLE 3121 enables fine-grained power gating. The PLE 3121 that is not used after context switching can be power gated owing to the fine-grained power gating function; thus, standby power can be effectively reduced.

The register block 3124 is formed using nonvolatile registers to achieve NOFF computing. The nonvolatile registers in the PLE 3121 are each a flip-flop provided with an OS memory (hereinafter, referred to as OS-FF).

Figure 33A:
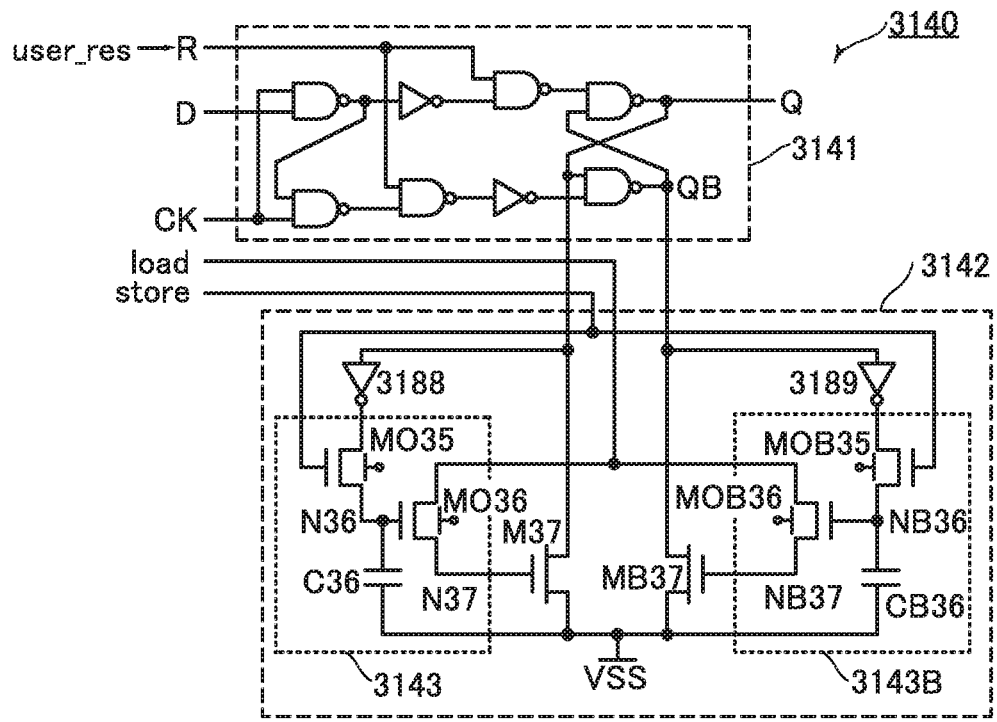
FIG. 33A is a circuit diagram illustrating a configuration example of a semiconductor device.

The register block 3124 includes an OS-FF 3140[1] and an OS-FF 3140[2]. A signal user_res, a signal load, and a signal store are input to the OS-FFs 3140[1] and 3140[2]. A clock signal CLK1 is input to the OS-FF 3140[1] and a clock signal CLK2 is input to the OS-FF 3140[2]. FIG. 33A illustrates a configuration example of the OS-FF 3140.

The OS-FF 3140 includes an FF 3141 and a shadow register 3142. The FF 3141 includes a node CK, a node R, a node D, a node Q, and a node QB. A clock signal is input to the node CK. The signal user_res is input to the node R. The signal user_res is a reset signal. The node D is a data input node, and the node Q is a data output node. The logics of the node Q and the node QB are complementary to each other.

The shadow register 3142 functions as a backup circuit of the FF 3141. The shadow register 3142 backs up data of the node Q and data of the node QB in response to the signal store and writes back the backed up data to the node Q and the node QB in response to the signal load.

The shadow register 3142 includes an inverter circuit 3188, an inverter circuit 3189, a Si transistor M37, a Si transistor MB37, a memory circuit 3143, and a memory circuit 3143B. The memory circuit 3143 and the memory circuit 3143B each have the same circuit configuration as the memory circuit 3137 of the PRS 3133. The memory circuit 3143 includes a capacitor C36, an OS transistor MO35, and an OS transistor MO36. The memory circuit 3143B includes a capacitor CB36, an OS transistor MOB35, and an OS transistor MOB36. A node N36 and a node NB36 correspond to a gate of the OS transistor MO36 and a gate of the OS transistor MOB36, respectively, and are each a charge retention node. A node N37 and a node NB37 correspond to a gate of the Si transistor M37 and a gate of the Si transistor MB37, respectively.

In the case where the semiconductor device described in any of the above embodiments is used in the LAB 3120, the transistor described in any of the above embodiments can be used as the OS transistors MO35 and MOB35. Accordingly, the off-state current of the OS transistors MO35 and MOB35 can be reduced; thus, backed up data in the OS-FF can be retained for a long time. In addition, the area occupied by each set consisting of one transistor and one capacitor in the top view can be reduced; accordingly, the semiconductor device of this embodiment can be highly integrated.

The OS transistors MO35, MO36, MOB35, and MOB36 each include a back gate, and these back gates are electrically connected to power supply lines that each supply a fixed voltage.

Figure 33B:
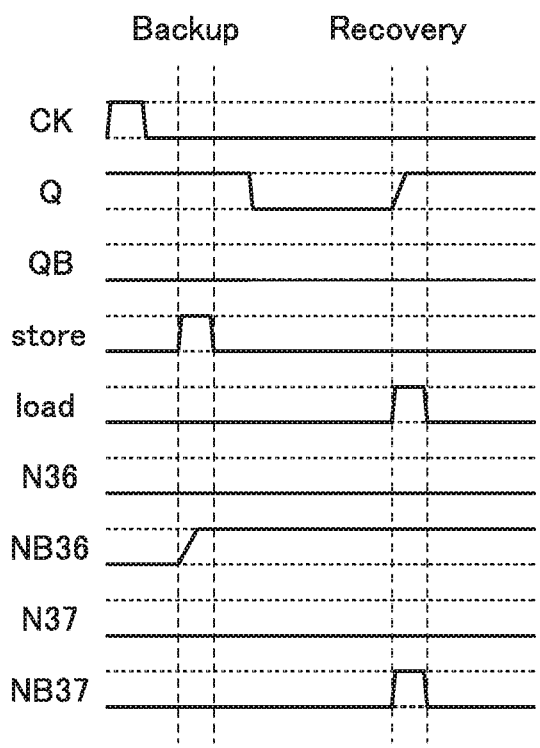
FIG. 33B is a timing chart showing an operation example of the semiconductor device.

An example of an operation method of the OS-FF 3140 is described with reference to FIG. 33B.

(Backup)

When the signal store at "H" is input to the OS-FF 3140, the shadow register 3142 backs up data of the FF 3141. The node N36 becomes "L" when the data of the node Q is written thereto, and the node NB36 becomes "H" when the data of the node QB is written thereto. After that, power gating is performed and the power switch 3127 is turned off. Although the data of the node Q and the data of the node QB of the FF 3141 are lost, the shadow register 3142 retains the backed up data even when power supply is stopped.

(Recovery)

The power switch 3127 is turned on to supply power to the PLE 3121. After that, when the signal load at "H" is input to the OS-FF 3140, the shadow register 3142 writes back the backed up data to the FF 3141. The node N37 is kept at "L" because the node N36 is at "L", and the node NB37 becomes "H" because the node NB36 is at "H". Thus, the node Q becomes "H" and the node QB becomes "L". That is, the OS-FF 3140 is restored to a state at the backup operation.

A combination of the fine-grained power gating and backup/recovery operation of the OS-FF 3140 allows power consumption of the OS-FPGA 3110 to be effectively reduced.

A possible error in a memory circuit is a soft error due to the entry of radiation. The soft error is a phenomenon in which a malfunction such as inversion of data stored in a memory is caused by electron-hole pair generation when a transistor is irradiated with a rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. An OS memory including an OS transistor has a high soft-error tolerance. Therefore, the OS-FPGA 3110 including an OS memory can have high reliability.

The structure described in this embodiment can be used in appropriate combination with any of the structures described in the other embodiments.

Embodiment 7

In this embodiment, an example of a CPU including the semiconductor device of one embodiment of the present invention, such as the above-described memory device, is described.

<Configuration of CPU>

Figure 34:
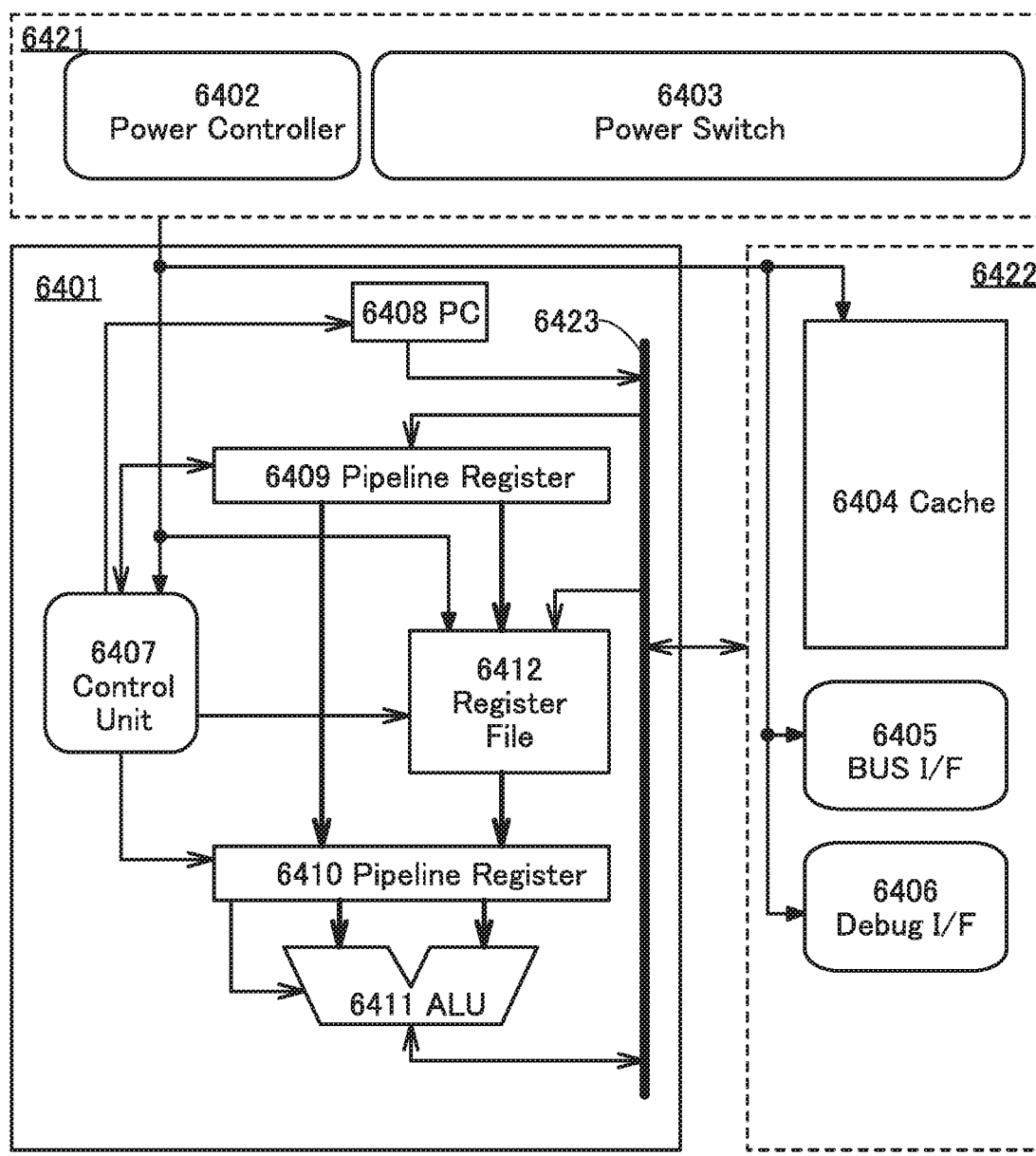
FIG. 34 is a block diagram of a semiconductor device.

A semiconductor device 6400 shown in FIG. 34 includes a CPU core 6401, a power management unit 6421, and a peripheral circuit 6422. The power management unit 6421 includes a power controller 6402 and a power switch 6403. The peripheral circuit 6422 includes a cache 6404 including cache memory, a bus interface (BUS I/F) 6405, and a debug interface (Debug I/F) 6406. The CPU core 6401 includes a data bus 6423, a control unit 6407, a program counter (PC) 6408, a pipeline register 6409, a pipeline register 6410, an arithmetic logic unit (ALU) 6411, and a register file 6412. Data is transmitted between the CPU core 6401 and the peripheral circuit 6422 such as the cache 6404 via the data bus 6423.

The semiconductor device described in any of the above embodiments can be used for many logic circuits typified by the power controller 6402 and the control unit 6407. Accordingly, the semiconductor device 6400 can have reduced power consumption. The semiconductor device 6400 can have a higher operating speed. The semiconductor device 6400 can have a smaller power supply voltage variation.

The semiconductor device 6400 preferably includes a p-channel Si transistor and a transistor including the oxide semiconductor described in the above embodiment in a channel formation region. Accordingly, the semiconductor device 6400 can be small. The semiconductor device 6400 can have reduced power consumption. The semiconductor device 6400 can have a higher operating speed. Particularly when the Si transistors are only p-channel ones, the manufacturing costs of the semiconductor device can be reduced.

The control unit 6407 has functions of decoding and executing instructions contained in a program such as input applications by controlling the overall operations of the PC 6408, the pipeline registers 6409 and 6410, the ALU 6411, the register file 6412, the cache 6404, the bus interface 6405, the debug interface 6406, and the power controller 6402.

The ALU 6411 has a function of performing a variety of arithmetic operations such as four arithmetic operations and logic operations.

The cache 6404 has a function of temporarily storing frequently used data. The PC 6408 is a register having a function of storing an address of an instruction to be executed next. Note that although not shown in FIG. 34, the cache 6404 is provided with a cache controller for controlling the operation of the cache memory.

The pipeline register 6409 has a function of temporarily storing instruction data.

The register file 6412 includes a plurality of registers including a general-purpose register and can store data that is read from the main memory, data obtained as a result of arithmetic operations in the ALU 6411, or the like.

The pipeline register 6410 has a function of temporarily storing data used for arithmetic operations in the ALU 6411, data obtained as a result of arithmetic operations in the ALU 6411, or the like.

The bus interface 6405 functions as a path for data between the semiconductor device 6400 and various devices outside the semiconductor device 6400. The debug interface 6406 functions as a path of a signal for inputting an instruction to control debugging to the semiconductor device 6400.

The power switch 6403 has a function of controlling supply of a power supply voltage to various circuits included in the semiconductor device 6400 other than the power controller 6402. The above various circuits belong to several different power domains. The power switch 6403 controls whether the power supply voltage is supplied to the various circuits in the same power domain. In addition, the power controller 6402 has a function of controlling the operation of the power switch 6403.

The semiconductor device 6400 having the above structure can perform power gating. An example of the power gating operation sequence will be described.

First, by the CPU core 6401, timing for stopping the supply of the power supply voltage is set in a register of the power controller 6402. Then, an instruction of starting power gating is sent from the CPU core 6401 to the power controller 6402. Then, various registers and the cache 6404 included in the semiconductor device 6400 start data saving. Then, the power switch 6403 stops the supply of the power supply voltage to the various circuits included in the semiconductor device 6400 other than the power controller 6402. Then, an interrupt signal is input to the power controller 6402, whereby the supply of the power supply voltage to the various circuits included in the semiconductor device 6400 is started. Note that a counter may be provided in the power controller 6402 to be used to determine the timing of starting the supply of the power supply voltage regardless of input of an interrupt signal. Next, the various registers and the cache 6404 start data restoration. Then, execution of an instruction is resumed in the control unit 6407.

Such power gating can be performed in the whole processor or one or a plurality of logic circuits included in the processor. Furthermore, power supply can be stopped even for a short time. Consequently, power consumption can be reduced at a fine spatial or temporal granularity.

In performing power gating, data retained by the CPU core 6401 or the peripheral circuit 6422 is preferably saved in a short time. In that case, the power can be turned on or off in a short time, and an effect of saving power becomes significant.

In order that the data retained by the CPU core 6401 or the peripheral circuit 6422 be saved in a short time, the data is preferably saved in a flip-flop circuit itself (referred to as a flip-flop circuit capable of backup operation). Furthermore, the data is preferably saved in an SRAM circuit itself (referred to as an SRAM circuit capable of backup operation). The flip-flop circuit and SRAM circuit that are capable of backup operation preferably include transistors including an oxide semiconductor (preferably an oxide containing In, Ga, and Zn) in a channel formation region. Consequently, the transistor has a low off-state current; thus, the flip-flop circuit and SRAM circuit that are capable of backup operation can retain data for a long time without power supply. When the transistor has a high switching speed, the flip-flop circuit and SRAM circuit that are capable of backup operation can save and restore data in a short time in some cases.

An example of the flip-flop circuit capable of backup operation is described with reference to FIG. 35.

Figure 35:
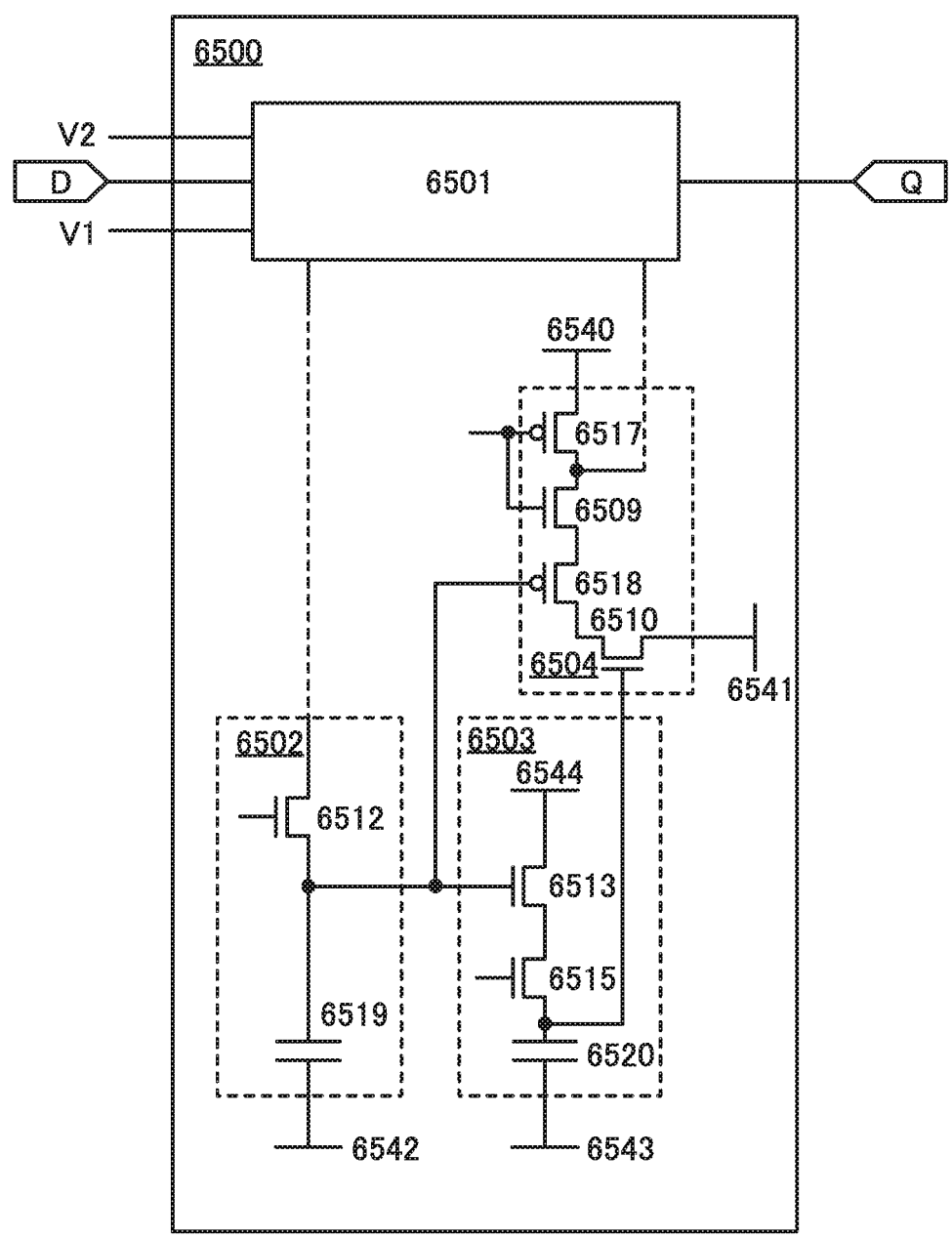
FIG. 35 is a circuit diagram of a semiconductor device.

A semiconductor device 6500 shown in FIG. 35 is an example of the flip-flop circuit capable of backup operation. The semiconductor device 6500 includes a first memory circuit 6501, a second memory circuit 6502, a third memory circuit 6503, and a read circuit 6504. As a power supply voltage, a potential difference between a potential V1 and a potential V2 is supplied to the semiconductor device 6500. One of the potential V1 and the potential V2 is at a high level, and the other is at a low level. An example of the structure of the semiconductor device 6500 when the potential V1 is at a low level and the potential V2 is at a high level is described below.

The first memory circuit 6501 has a function of retaining data when a signal D including the data is input in a period during which the power supply voltage is supplied to the semiconductor device 6500. Furthermore, the first memory circuit 6501 outputs a signal Q including the retained data in the period during which the power supply voltage is supplied to the semiconductor device 6500. On the other hand, the first memory circuit 6501 cannot retain data in a period during which the power supply voltage is not supplied to the semiconductor device 6500. That is, the first memory circuit 6501 can be referred to as a volatile memory circuit.

The second memory circuit 6502 has a function of reading the data retained in the first memory circuit 6501 to store (or save) it. The third memory circuit 6503 has a function of reading the data retained in the second memory circuit 6502 to store (or save) it. The read circuit 6504 has a function of reading the data retained in the second memory circuit 6502 or the third memory circuit 6503 to store (or restore) it in the first memory circuit 6501.

In particular, the third memory circuit 6503 has a function of reading the data retained in the second memory circuit 6502 to store (or save) it even in the period during which the power supply voltage is not supplied to the semiconductor device 6500.

As shown in FIG. 35, the second memory circuit 6502 includes a transistor 6512 and a capacitor 6519. The third memory circuit 6503 includes a transistor 6513, a transistor 6515, and a capacitor 6520. The read circuit 6504 includes a transistor 6510, a transistor 6518, a transistor 6509, and a transistor 6517.

The transistor 6512 has a function of charging and discharging the capacitor 6519 in accordance with data retained in the first memory circuit 6501. The transistor 6512 is desirably capable of charging and discharging the capacitor 6519 at a high speed in accordance with data retained in the first memory circuit 6501. Specifically, the transistor 6512 desirably contains crystalline silicon (preferably polycrystalline silicon, further preferably single crystal silicon) in a channel formation region.

The conduction state or the non-conduction state of the transistor 6513 is determined in accordance with the charge retained in the capacitor 6519. The transistor 6515 has a function of charging and discharging the capacitor 6520 in accordance with the potential of a wiring 6544 when the transistor 6513 is in a conduction state. It is desirable that the off-state current of the transistor 6515 be extremely low. Specifically, the transistor 6515 desirably contains an oxide semiconductor (preferably an oxide containing In, Ga, and Zn) in a channel formation region.

Specific connection relations between the elements are described. One of a source and a drain of the transistor 6512 is connected to the first memory circuit 6501. The other of the source and the drain of the transistor 6512 is connected to one electrode of the capacitor 6519, a gate of the transistor 6513, and a gate of the transistor 6518. The other electrode of the capacitor 6519 is connected to a wiring 6542. One of a source and a drain of the transistor 6513 is connected to the wiring 6544. The other of the source and the drain of the transistor 6513 is connected to one of a source and a drain of the transistor 6515. The other of the source and the drain of the transistor 6515 is connected to one electrode of the capacitor 6520 and a gate of the transistor 6510. The other electrode of the capacitor 6520 is connected to a wiring 6543. One of a source and a drain of the transistor 6510 is connected to a wiring 6541. The other of the source and the drain of the transistor 6510 is connected to one of a source and a drain of the transistor 6518. The other of the source and the drain of the transistor 6518 is connected to one of a source and a drain of the transistor 6509. The other of the source and the drain of the transistor 6509 is connected to one of a source and a drain of the transistor 6517 and the first memory circuit 6501. The other of the source and the drain of the transistor 6517 is connected to a wiring 6540. Although a gate of the transistor 6509 is connected to a gate of the transistor 6517 in FIG. 35, the gate of the transistor 6509 is not necessarily connected to the gate of the transistor 6517.

The transistor described in the above embodiment as an example can be used as the transistor 6515. Because of the low off-state current of the transistor 6515, the semiconductor device 6500 can retain data for a long time without power supply. The favorable switching characteristics of the transistor 6515 allow the semiconductor device 6500 to perform high-speed backup and recovery.

The structure described in this embodiment can be used in appropriate combination with any of the structures described in the other embodiments.

Embodiment 8

In this embodiment, examples of an electronic component and an electronic device that include the memory device of any of the above embodiments are described.

<Electronic Component>

First, examples of an electronic component including the memory device in any of the above embodiments are described with reference to FIGS. 36A and 36B.

Figure 36A:
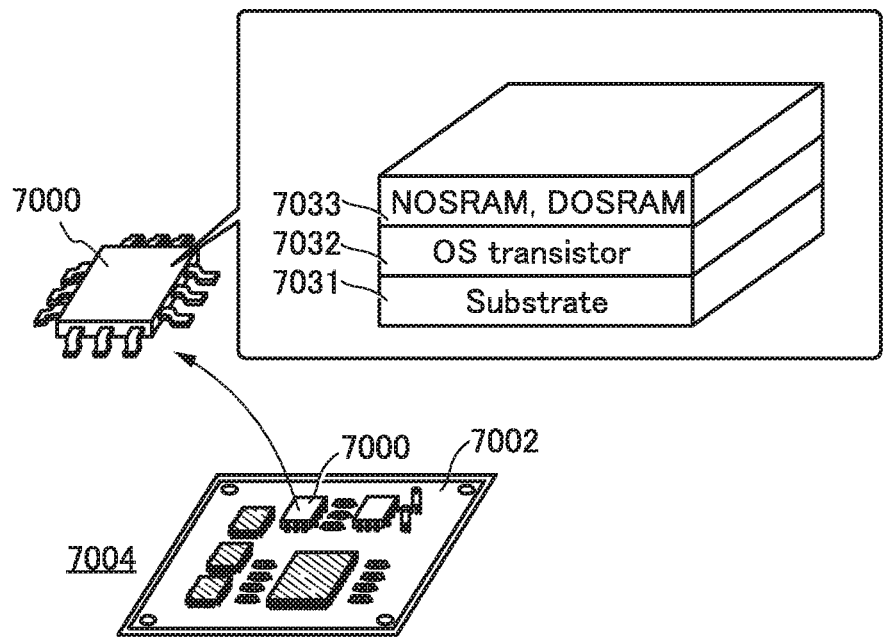
FIGS. 36A and 36B are schematic views illustrating examples of electronic components.

An electronic component 7000 illustrated in FIG. 36A is an IC chip including a lead and a circuit portion. The electronic component 7000 is mounted on a printed circuit board 7002, for example. A plurality of such IC chips are combined and electrically connected to each other on the printed circuit board 7002; thus, a substrate on which electronic components are mounted (a circuit board 7004) is formed.

The circuit portion of the electronic component 7000 is a stack including a substrate 7031, a layer 7032, and a layer 7033.

A material that can be used for the substrate described in any of the above embodiments may be used for the substrate 7031. In the case where a semiconductor substrate of silicon is used as the substrate 7031, an integrated circuit may be formed on the substrate 7031, and the layer 7032 including an OS transistor may be formed thereover.

The layer 7032 includes the OS transistor described in any of the above embodiments. For example, a control circuit such as a CPU can be provided in the layer 7032.

The layer 7033 includes a memory. As the memory, for example, a memory including an OS transistor (hereinafter, referred to as OS memory), such as NOSRAM (registered trademark) or DOSRAM (registered trademark), can be used. As the NOSRAM, the memory device described in any of the above embodiments can be used.

An OS memory can be stacked over other semiconductor elements, and thus the electronic component 7000 can be reduced in size. In addition, the OS memory can rewrite data with low power, which reduces the power consumption of the electronic component 7000.

The OS memory can be provided not in the layer 7033 but in the layer 7032. In that case, the manufacturing process of the IC chip can be shortened.

Besides the OS memory, a memory such as a resistive random access memory (ReRAM), a magnetoresistive random access memory (MRAM), a phase change RAM (PRAM), or a ferroelectric RAM (FeRAM) may be provided in the layer 7033.

Although a quad flat package (QFP) is used as the package of the electronic component 7000 in FIG. 36A, the package is not limited thereto.

Figure 36B:
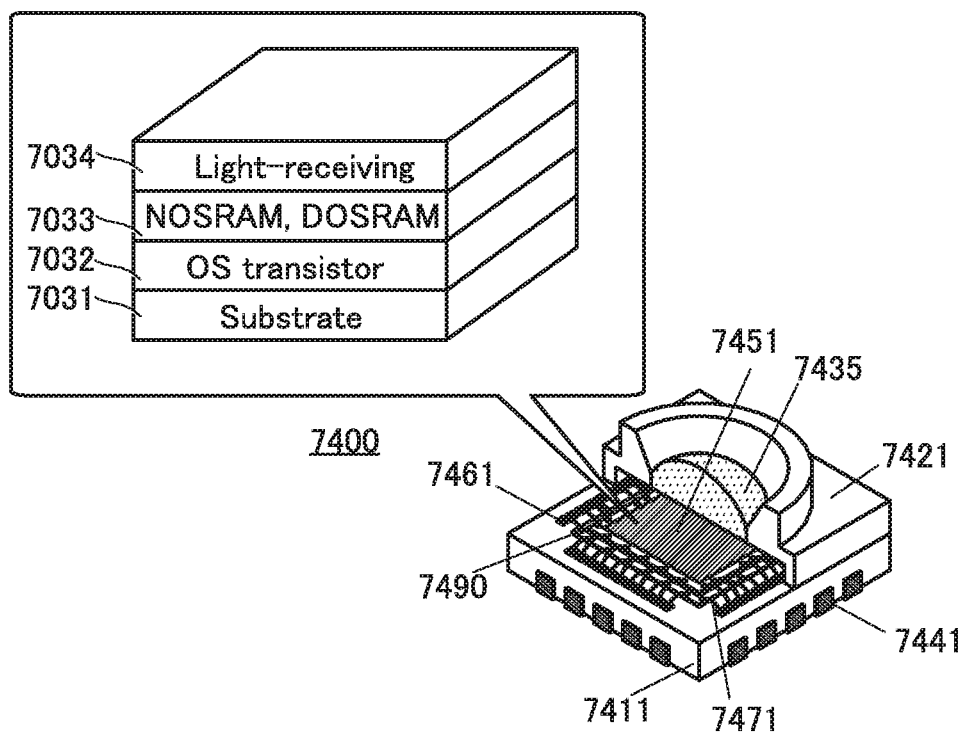

FIG. 36B is a schematic view of an electronic component 7400. The electronic component 7400 is a camera module including an image sensor chip 7451. The electronic component 7400 includes a package substrate 7411 to which the image sensor chip 7451 is fixed, a lens cover 7421, a lens 7435, and the like. Furthermore, an IC chip 7490 functioning as a driver circuit, a signal conversion circuit, and the like of an imaging device is provided between the package substrate 7411 and the image sensor chip 7451. Thus, a system in package (SiP) is formed. Lands 7441 are electrically connected to electrode pads 7461. The electrode pads 7461 are electrically connected to the image sensor chip 7451 or the IC chip 7490 through wires 7471. Parts of the lens cover 7421 and the lens 7435 are not illustrated in FIG. 36B to illustrate the inside of the electronic component 7400.

The circuit portion of the image sensor chip 7451 is a stack including the substrate 7031, the layer 7032, the layer 7033, and a layer 7034.

Refer to the description of the electronic component 7000 for the details of the substrate 7031, the layer 7032, and the layer 7033.

The layer 7034 includes a light-receiving element. As the light-receiving element, for example, a pn-junction photodiode including a selenium-based material in a photoelectric conversion layer can be used. A photoelectric conversion element including a selenium-based material has high external quantum efficiency for visible light; thus, a highly sensitive optical sensor can be obtained.

A selenium-based material can be used as a p-type semiconductor. As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor in the pn-junction photodiode is preferably formed using a material with a wide band gap and a visible-light-transmitting property. For example, zinc oxide, gallium oxide, indium oxide, tin oxide, or mixed oxide thereof can be used.

As the light-receiving element in the layer 7034, a pn-junction photodiode including a p-type silicon semiconductor and an n-type silicon semiconductor may be used.

Alternatively, a pin-junction photodiode in which an i-type silicon semiconductor layer is provided between a p-type silicon semiconductor and an n-type silicon semiconductor may be used.

The photodiode using silicon can be formed using single crystal silicon. In that case, the layer 7033 is preferably electrically connected to the layer 7034 through a bonding step. The photodiode using silicon can also be formed using a thin film of amorphous silicon, microcrystalline silicon, or polycrystalline silicon, for example.

Embodiment 9

In this embodiment, specific examples of electronic devices that can be used for the semiconductor device of one embodiment of the present invention are described with reference to FIGS. 37A to 37F.

More specifically, the semiconductor device of one embodiment of the present invention can be used for processors (e.g., a CPU and a GPU) and chips. FIGS. 37A to 37F illustrate specific examples of electronic devices including a processor (e.g., a CPU or a GPU) or a chip of one embodiment of the present invention.

<Electronic Device and System>

The GPU or the chip of one embodiment of the present invention can be mounted on a variety of electronic devices. Examples of electronic devices include electronic devices with relatively large screens, such as a television device, a desktop or laptop personal computer, a monitor of a computer or the like, digital signage, and a large game machine (e.g., a pachinko machine); cameras such as a digital camera and a digital video camera; a digital photo frame; a mobile phone; a portable game machine; a portable information terminal; and an audio reproducing device. When the GPU or the chip of one embodiment of the present invention is provided in an electronic device, the electronic device can include artificial intelligence.

The electronic device of one embodiment of the present invention may include an antenna. With the antenna receiving a signal, the electronic device can display an image, data, or the like on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium. FIGS. 37A to 37F illustrate examples of electronic devices.

[Mobile Phone]

FIG. 37A illustrates a mobile phone (smartphone), which is a type of information terminal. An information terminal 5500 includes a housing 5510 and a display portion 5511. As input interfaces, a touch panel and a button are provided in the display portion 5511 and the housing 5510, respectively.

With the use of the chip of one embodiment of the present invention, the information terminal 5500 can execute an application utilizing artificial intelligence. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal 1]

FIG. 37B illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that although FIGS. 37A and 37B illustrate a smartphone and a desktop information terminal as examples of electronic device, one embodiment of the present invention can also be applied to an information terminal other than a smartphone and a desktop information terminal. Examples of an information terminal other than a smartphone and a desktop information terminal include a personal digital assistant (PDA), a laptop information terminal, and a workstation.

[Household Appliance]

FIG. 37C illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu on the basis of, for example, food stored in the electric refrigerator-freezer 5800 and food expiration dates, a function of automatically adjusting the temperature to be appropriate for the food stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 37D illustrates a portable game machine 5200 as an example of a game machine. The portable game machine includes a housing 5201, a display portion 5202, a button 5203, and the like.

The portable game machine 5200 including the GPU or the chip of one embodiment of the present invention can have low power consumption. Furthermore, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be obtained.

In general, progress of a game, the actions and words of game characters, and expressions of a phenomenon in the game are programmed in the game; however, the use of artificial intelligence in the portable game machine 5200 enables expressions not limited by the game program. For example, questions posed by the player, progress of the game, time, and actions and words of game characters can be changed for various expressions.

The artificial intelligence can construct a virtual game player; thus, a game that needs a plurality of players can be played with the portable game machine 5200 by only one human game player, with the use of a virtual game player constructed by the artificial intelligence as an opponent.

Although the portable game machine is illustrated as an example of a game machine in FIG. 37D, the game machine including the GPU or the chip of one embodiment of the present invention is not limited thereto. Other examples of the game machine including the GPU or the chip of one embodiment of the present invention include a home stationary game machine, an arcade game machine installed in an entertainment facility (e.g., a game center and an amusement park), and a throwing machine for batting practice installed in sports facilities.

[Moving Vehicle]

The GPU or the chip of one embodiment of the present invention can be used in an automobile, which is a moving vehicle, and around a driver's seat in the automobile.

FIG. 37E1 illustrates an automobile 5700 as an example of a moving vehicle, and FIG. 37E2 illustrates an area around a windshield inside the automobile. FIG. 37E2 illustrates a display panel 5701, a display panel 5702, and a display panel 5703 that are attached to a dashboard and a display panel 5704 attached to a pillar.

The display panels 5701 to 5703 can provide various kinds of information by displaying a speedometer, a tachometer, a mileage, a fuel meter, a gearshift indicator, air-conditioning settings, and the like. Items displayed on the display panel, their layout, and the like can be changed as appropriate to suit the user's preferences, resulting in more sophisticated design. The display panels 5701 to 5703 can also be used as lighting devices.

The display panel 5704 can compensate for the view obstructed by the pillar (blind areas) by displaying an image taken by an imaging device (not illustrated) provided in the automobile 5700. That is, displaying an image taken by the imaging device provided on the exterior of the automobile 5700 eliminates blind areas and enhances safety. Moreover, displaying an image to compensate for the area that a driver cannot see makes it possible for the driver to confirm safety more easily and comfortably. The display panel 5704 can also be used as a lighting device.

Since the GPU or the chip of one embodiment of the present invention can be used as a component of artificial intelligence, the chip can be used for an automatic driving system of the automobile 5700, for example. The chip can also be used for a system for navigation, risk prediction, or the like. The display panels 5701 to 5704 may display information regarding navigation, risk prediction, and the like.

Although the automobile is described above as an example of a moving vehicle, a moving vehicle is not limited to the automobile. Examples of a moving vehicle include a train, a monorail train, a ship, and a flying object (a helicopter, an unmanned aircraft (a drone), an airplane, or a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

FIG. 37F schematically illustrates data transmission in a broadcasting system. Specifically, FIG. 37F illustrates a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although an ultra-high frequency (UHF) antenna is illustrated as the antenna 5650 in FIG. 37F, a BS/110° CS antenna, a CS antenna, or the like can also be used.

A radio wave 5675A and a radio wave 5675B are broadcast signals for terrestrial broadcasting, and a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 37F and may be satellite broadcasting using an artificial satellite, data broadcasting using an optical line, or the like.

The above-described broadcasting system may utilize artificial intelligence by including the chip of one embodiment of the present invention. When the broadcast data is transmitted from the broadcast station 5680 to the TV 5600 of each household, the broadcast data is compressed by an encoder. The antenna 5650 receives the compressed broadcast data, and then the compressed broadcast data is decompressed by a decoder in the receiving device in the TV 5600. With the use of the artificial intelligence, for example, a display pattern included in an image can be recognized in motion compensation prediction, which is one of the compressing methods of the encoder. In addition, in-frame prediction, for example, can also be performed utilizing artificial intelligence. Furthermore, for example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As an application of artificial intelligence in the TV 5600, a recording device including artificial intelligence may be provided in the TV 5600. With such a structure, the artificial intelligence in the recording device can learn the user's preference, so that TV programs that suit for the user's preference can be recorded automatically.

The electronic device and its functions, an application example of the artificial intelligence and its effects, and the like described in this embodiment can be combined as appropriate with the description of another electronic device.

The structures, the methods, and the like described in this embodiment can be combined as appropriate with any of the structures, the methods, and the like described in the other embodiments and examples.

Example 1

In this example, insulators of embodiments of the present invention were formed and analyzed by SIMS. Note that Samples 1A to 1C were formed in this example.

<Structures and Formation Methods of Samples>

Figure 38:
FIG. 38 is a schematic view of samples in Example.

Samples 1A to 1C of embodiments of the present invention are described below. FIG. 38 illustrates a structure of Samples 1A to 1C. Samples 1A to 1C each include a substrate 901, an insulator 902 over the substrate 901, and an insulator 903 over the insulator 902.

Next, formation methods of the samples are described.

First, a silicon substrate was prepared as the substrate 901. Then, a 100-nm-thick thermal oxide film was formed as the insulator 902 over the substrate 901.

Next, the insulator 903 was formed over the insulator 902. Here, Table 1 shows the kind of film and the formation method of the insulator 903 in each of Samples 1A to 1C.

TABLE 1

|  | Kind of film | Formation method |
| --- | --- | --- |
| Sample 1A | AlOx | Sputtering |
| Sample 1B | SiNx | Sputtering |
| Sample 1C | SiNx | PECVD |

Specifically, as the insulator 903 in Sample 1A, a 100-nm-thick aluminum oxide film was formed by a sputtering method. The aluminum oxide film was formed using an $Al_2O_3$ target under the conditions where argon (Ar) at a flow rate of 25 sccm and oxygen ($O_2$) at a flow rate of 25 sccm were used as deposition gases, the deposition pressure was 0.4 Pa, the deposition power was 2.5 kW (RF), the substrate temperature was 250° C., and the target-substrate distance was 60 mm.

As the insulator 903 in Sample 1B, a 100-nm-thick silicon nitride film was formed by a sputtering method. The silicon nitride film was formed using a Si target under the conditions where argon (Ar) at a flow rate of 5 sccm and nitrogen (N2) at a flow rate of 20 sccm were used as deposition gases, the deposition pressure was 0.2 Pa, the deposition power was 0.4 kW (RF), the substrate temperature was 350° C., and the target-substrate distance was 60 mm.

As the insulator 903 in Sample 1C, a 100-nm-thick silicon nitride film was formed by a CVD method. The silicon nitride film was formed under the conditions where silane ($SiH_4$) at a flow rate of 5 sccm and nitrogen ($N_2$) at a flow rate of 2500 sccm were used as deposition gases, the deposition pressure was 100 Pa, the deposition power was 45 W (13.56 MHz), the substrate temperature was 350° C., and the distance between electrodes was 20 nm.

Through the above steps, Samples 1A to 1C of this example were formed.

<SIMS Measurement Results of Samples>

Figure 39A:
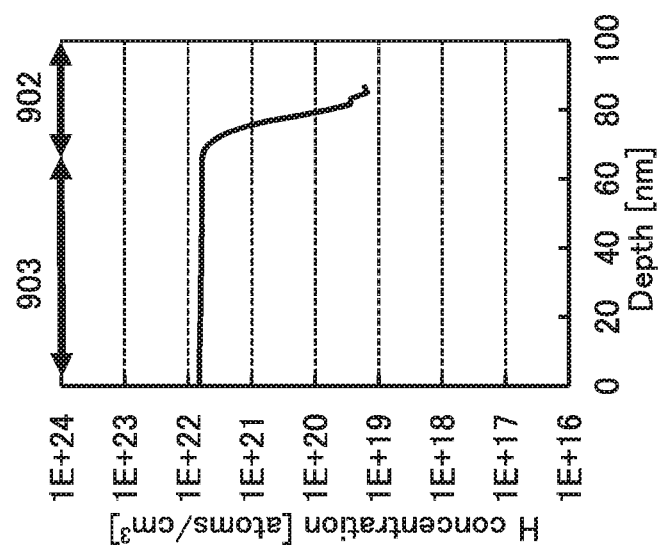
FIGS. 39A to 39C show SIMS analysis results of samples in Example.
Figure 39B:
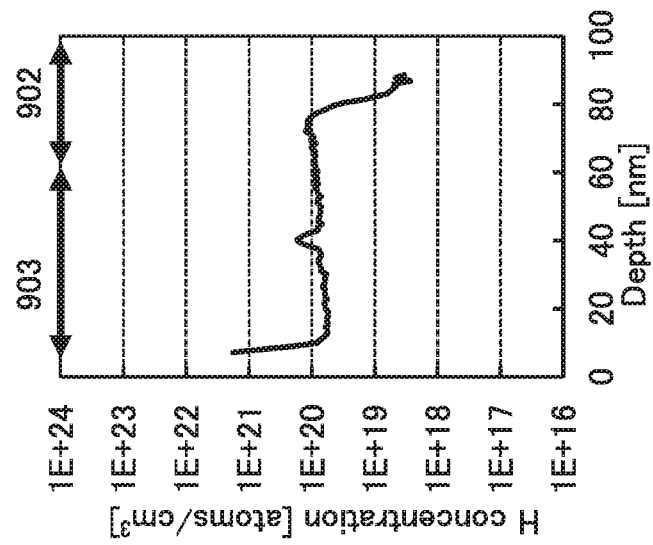
Figure 39C:
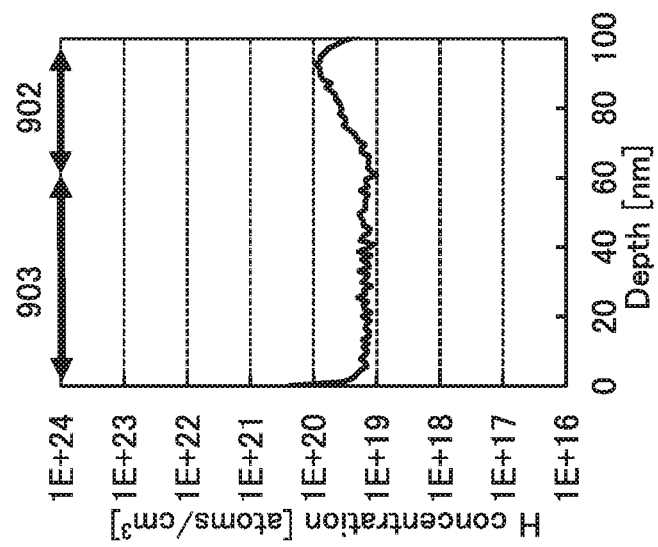

Next, FIGS. 39A to 39C show measurement results of hydrogen (H) concentrations obtained by SIMS analysis using the insulator 903 in each of Samples 1A to 1C as a quantification layer. The hydrogen concentrations were measured by secondary ion mass spectrometry (SIMS) with the use of a dynamic SIMS apparatus IMS-7f manufactured by CAMECA SAS, as an analysis apparatus.

FIG. 39A shows hydrogen (H) concentration profiles in the depth direction of the aluminum oxide film formed by a sputtering method in Sample 1A. FIG. 39B shows hydrogen (H) concentration profiles in the depth direction of the silicon nitride film formed by a sputtering method in Sample 1B. FIG. 39C shows hydrogen (H) concentration profiles in the depth direction of the silicon nitride film formed by a CVD method in Sample 1C.

The comparison between FIG. 39A and FIG. 39B reveals that the hydrogen concentration of the aluminum oxide film formed by a sputtering method is lower than that of the silicon nitride film formed by a sputtering method.

The comparison between FIG. 39B and FIG. 39C reveals that the hydrogen concentration of the silicon nitride film formed by a sputtering method is lower than that of the silicon nitride film formed by a CVD method. The silicon nitride film formed by a CVD method has a relatively high hydrogen concentration probably because of silane used as the deposition gas.

The above results indicate that the hydrogen concentration in the film can be reduced by setting the kind of film to be formed and the formation conditions as appropriate.

Thus, in the case where an oxide semiconductor is used, a film with a reduced hydrogen concentration is preferably used as a film adjacent to the oxide semiconductor. On the other hand, in the case where a film with a relatively high hydrogen concentration is used as a film that inhibits diffusion of impurities, a film that inhibits diffusion of hydrogen or the like is preferably provided between the oxide semiconductor and the film with a relatively high hydrogen concentration.

That is, the film adjacent to the oxide semiconductor preferably has a relatively low hydrogen concentration. The film with a relatively high hydrogen concentration is preferably distanced from the oxide semiconductor.

Specifically, when the oxide semiconductor is sealed with a silicon nitride film, an aluminum oxide film is preferably provided between the oxide semiconductor and the silicon nitride film.

A film formed by a CVD method generally has better coverage than a film formed by a sputtering method. Thus, in the case where the oxide semiconductor is sealed with a silicon nitride film formed by a CVD method, a silicon nitride film formed by a sputtering method is preferably provided between the oxide semiconductor and the silicon nitride film formed by a CVD method.

With the above structure, a semiconductor device including an oxide semiconductor with a reduced hydrogen concentration can be provided. Therefore, a highly reliable semiconductor device can be provided. According to one embodiment of the present invention, a semiconductor device with favorable electrical characteristics can be provided.

The structure described in this example can be combined as appropriate with any of the structures described in the other example and embodiments.

Example 2

In this example, a semiconductor device including the transistor 200 illustrated in FIGS. 1A to 1D, which is one embodiment of the present invention, was fabricated as each of Samples 2A and 2B, and a reliability test of the transistor 200 was conducted.

<Formation Methods of Samples>

Formation methods of Samples 2A and 2B are described below.

First, the transistor 200 was designed to have a channel length of 60 nm and a channel width of 60 nm. In Samples 2A and 2B, a plurality of transistors 200 were formed through the same process. The transistor density in Sample 2A was $2.0/\mu m^2$. The transistor density in Sample 2B was $2.9/\mu m^2$.

Note that an In—Ga—Zn oxide was deposited as each of the oxides 230a, 230b, and 230c by a sputtering method. As the oxide 230a, a 5-nm-thick In—Ga—Zn oxide was deposited using a target with an atomic ratio of In:Ga:Zn=1:3:4. As the oxide 230b, a 15-nm-thick In—Ga—Zn oxide was deposited using a target with an atomic ratio of In:Ga:Zn=4:2:4.1.

As the oxide 243, a 2-nm-thick In—Ga—Zn oxide was deposited by a sputtering method using a target with an atomic ratio of In:Ga:Zn=1:3:4.

As the oxide 230c, an In—Ga—Zn oxide was deposited by a sputtering method. As the oxide 230c, an 8-nm-thick In—Ga—Zn oxide was deposited using a target with an atomic ratio of In:Ga:Zn=4:2:4.1, and then, an 8-nm-thick In—Ga—Zn oxide was deposited using a target with an atomic ratio of In:Ga:Zn=1:3:4.

As the insulator 250, a 10-nm-thick silicon oxynitride (SiON) film was formed by a CVD method.

Through the above steps, Samples 2A and 2B were formed.

<Reliability of Transistor>

Next, in order to examine the reliability of the transistor, a gate bias temperature (GBT) stress test was performed on one transistor in each of Samples 2A and 2B. A GBT stress test is a kind of reliability test and can evaluate a change in transistor characteristics caused by long-term use.

First, the $I_d$-$V_g$ characteristics were measured as the electrical characteristics of Samples 2A and 2B. In the measurement of the $I_d$-$V_g$ characteristics, a change in a current between the conductor 240a functioning as a source electrode and the conductor 240b functioning as a drain electrode (hereinafter, also referred to as a drain current ($I_d$)) when a potential applied to the conductor 260 functioning as a first gate electrode of the transistor 200 (hereinafter, also referred to as a gate potential ($V_g$)) was changed from a first value to a second value was measured.

Here, a change in the drain current ($I_d$) between the conductors 240a and 240b when a potential between the conductors 240a and 240b (hereinafter, also referred to as a drain potential $V_d$) was set to +0.1 V or +1.2 V and a potential between the conductors 240a and 260 was changed from −3.3 V to +3.3 V was measured.

Note that in this measurement, the potential of the conductor 205 (hereinafter, also referred to as a back gate potential ($V_{bg}$)) that functions as a second gate electrode (back gate electrode) was set to 0.0 V.

In a GBT stress test, a substrate over which a transistor is formed is kept at a constant temperature. A source and a drain of the transistor are set at the same potential, and a first gate is supplied with a potential different from the source potential and the drain potential for a certain period. In this example, substrates over which Samples 2A and 2B were formed were kept at 150° C.; this is regarded as an accelerated test. The potentials of the source and the drain of the transistor were set to 0.0 V, and the potential of the first gate was set to +3.63 V.

In the GBT stress test, the $I_d$-$V_g$ characteristics were measured under the above conditions after a predetermined period of time. Note that the back gate potential was set to 0.00 V.

Figure 40A:
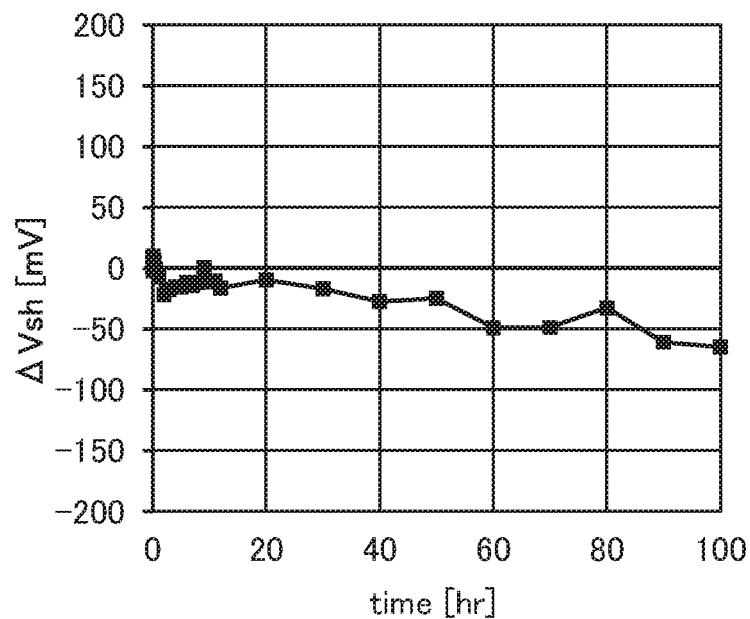
FIGS. 40A and 40B each show stress time dependence of $\Delta V_{sh}$ in Example.
Figure 40B:
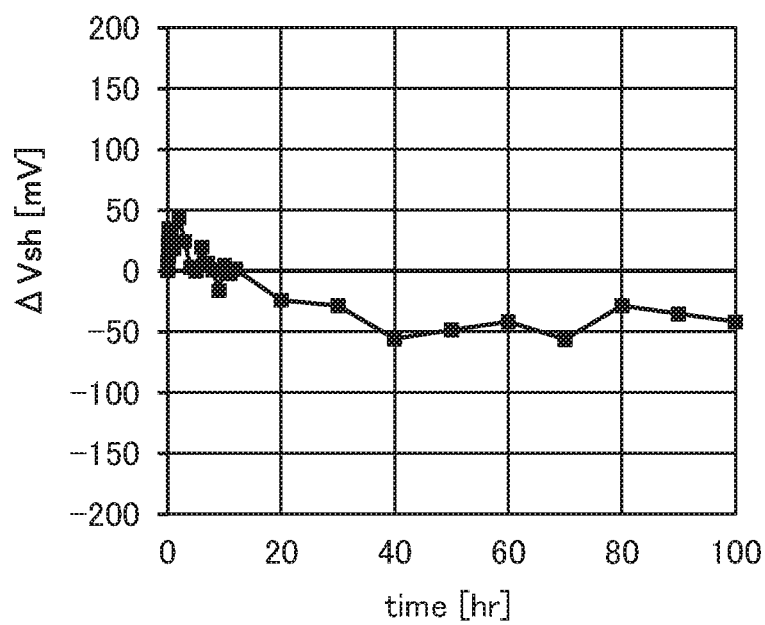

FIGS. 40A and 40B show the results of the GBT stress test in this example. FIG. 40A shows the test results of Sample 2A (the density of the transistors 200 was 2.0/μm²). FIG. 40B shows the test results of Sample 2B (the density of the transistors 200 was 2.9/μm²).

As an index of the amount of change in the electrical characteristics of a transistor, variation in the threshold voltage ($V_{sh}$) of the transistor (hereinafter, also referred to as $\Delta V_{sh}$) with time was used. Note that in the $I_d$-$V_g$ characteristics, $V_{sh}$ is defined as a value of $V_g$ when $I_d$=1.0×10⁻¹² [A] is satisfied. If $V_{sh}$ when the stress starts to be applied is +25 mV and $V_{sh}$ after the stress is applied for 100 seconds is −30 mV, for example, $\Delta V_{sh}$ after the stress is applied for 100 seconds is −55 mV.

As shown in FIGS. 40A and 40B, the amount of change in the threshold voltage |$\Delta V_{sh}$| of the transistors in Samples 2A and 2B was lower than or equal to 100 mV until 100 hours elapsed.

The above results show that the semiconductor device of one embodiment of the present invention is a semiconductor device including a transistor with high reliability.

At least part of this example can be implemented in combination with any of the embodiments described in this specification as appropriate.

This application is based on Japanese Patent Application Serial No. 2018-239693 filed with Japan Patent Office on Dec. 21, 2018, the entire contents of which are hereby incorporated by reference.

What is claimed is:

1. A semiconductor device comprising:
   a first insulator;
   a second insulator over the first insulator;
   a third insulator over the second insulator;
   a fourth insulator and a first conductor over the third insulator;
   a fifth insulator over the fourth insulator and the first conductor;
   a first oxide over the fifth insulator;
   a second conductor and a third conductor over the first oxide;
   a second oxide over the first oxide and between the second conductor and the third conductor;
   a sixth insulator over the second oxide;
   a fourth conductor over the sixth insulator;
   a seventh insulator comprising a region in contact with a top surface of the fifth insulator, a side surface of the first oxide, a side surface of the second conductor, a top surface of the second conductor, a side surface of the third conductor, and a top surface of the third conductor;
   an eighth insulator over the seventh insulator;
   a ninth insulator over the eighth insulator;
   a tenth insulator in contact with a top surface of the ninth insulator, a top surface of the second oxide, a top surface of the sixth insulator, and a top surface of the fourth conductor;
   an eleventh insulator over the tenth insulator; and
   a twelfth insulator over the eleventh insulator,
   wherein the eleventh insulator is in contact with a top surface of the second insulator, a side surface of the third insulator, a side surface of the fourth insulator, a side surface of the fifth insulator, a side surface of the seventh insulator, a side surface of the eighth insulator, a side surface of the ninth insulator, a side surface of the tenth insulator, and a top surface of the tenth insulator,
   wherein a hydrogen concentration of the second insulator is lower than a hydrogen concentration of the first insulator, and
   wherein a hydrogen concentration of the third insulator is lower than the hydrogen concentration of the second insulator.

2. The semiconductor device according to claim 1, further comprising:
   an opening formed in the seventh insulator, the eighth insulator, the ninth insulator, the tenth insulator, the eleventh insulator and the twelfth insulator;
   a sixteenth insulator in contact with at least a side surface of the tenth insulator, a side surface of the eleventh insulator, and a side surface of the twelfth insulator at a side surface of the opening;
   a seventeenth insulator in contact with a side surface of the sixteenth insulator; and
   a seventh conductor in contact with a side surface of the seventeenth insulator.

3. The semiconductor device according to claim 1, further comprising:
   a thirteenth insulator and a fourteenth insulator over the twelfth insulator;
   a fifth conductor over the thirteenth insulator;
   a sixth conductor over the fourteenth insulator; and
   a fifteenth insulator over the fifth conductor, the sixth conductor, and the twelfth insulator,
   wherein the fifteenth insulator is in contact with a side surface of the fifth conductor, a top surface of the fifth conductor, a side surface of the sixth conductor, and a top surface of the sixth conductor.

4. The semiconductor device according to claim 3, wherein each of the first insulator, the second insulator, the eighth insulator, the eleventh insulator, the thirteenth insulator, the fourteenth insulator and the fifteenth insulator comprises silicon and nitrogen.

5. The semiconductor device according to claim 3, wherein each of the third insulator, the seventh insulator and the tenth insulator comprises any one of aluminum, magnesium, and tantalum.

6. A semiconductor device comprising:
   a base insulating layer comprising:
      a first insulating film;
      a second insulating film over the first insulating film; and
      a third insulating film over the second insulating film;
   a first gate electrode and a fourth insulating film over the base insulating layer;
   a first gate insulating film over the first gate electrode and the fourth insulating film;
   a first oxide semiconductor film over the first gate insulating film;
   a source electrode and a drain electrode over the first oxide semiconductor film;
   a second oxide semiconductor film over the first oxide semiconductor film and between the source electrode and the drain electrode;
   a second gate insulating film over the second oxide semiconductor film;
   a second gate electrode over the second gate insulating film;
   a fifth insulating film in contact with a top surface of the first gate insulating film, a side surface of the first oxide semiconductor film, a side surface of the source electrode, a top surface of the source electrode, a side surface of the drain electrode, and a top surface of the drain electrode;
   a sixth insulating film over the fifth insulating film;
   a seventh insulating film over the sixth insulating film;

an eighth insulating film in contact with a top surface of the seventh insulating film, a top surface of the second oxide semiconductor film, a top surface of the second gate insulating film, and a top surface of the second gate electrode;
a ninth insulating film over the eighth insulating film; and
a tenth insulating film over the ninth insulating film,
wherein the ninth insulating film is in contact with a top surface of the second insulating film, a side surface of the third insulating film, a side surface of the first gate insulating film, a side surface of the fourth insulating film, a side surface of the fifth insulating film, a side surface of the sixth insulating film, a side surface of the seventh insulating film, a side surface of the eighth insulating film, and a top surface of the eighth insulating film,
wherein the second insulating film has a lower hydrogen concentration than the first insulating film, and
wherein the third insulating film has a lower hydrogen concentration than the second insulating film.

7. The semiconductor device according to claim 6, further comprising:
an opening formed in the fifth insulating film, the sixth insulating film, the seventh insulating film, the eighth insulating film, the ninth insulating film and the tenth insulating film;
an eleventh insulating film in contact with at least a side surface of the eighth insulating film, a side surface of the ninth insulating film, and a side surface of the tenth insulating film at a side surface of the opening;
a twelfth insulating film in contact with a side surface of the eleventh insulating film; and
a via in contact with a side surface of the twelfth insulating film.

8. A semiconductor device comprising:
a base insulating layer comprising:
a first insulating film;
a second insulating film over the first insulating film; and
a third insulating film over the second insulating film,
a first gate electrode over the base insulating layer;
a first oxide semiconductor film over the first gate electrode;
a source electrode and a drain electrode over the first oxide semiconductor film;
a second oxide semiconductor film over the first oxide semiconductor film;
a second gate electrode over the second oxide semiconductor film;
a fifth insulating film in contact with a side surface of the first oxide semiconductor film, a side surface of the source electrode, and a top surface of the source electrode;
an eighth insulating film in contact with a top surface of the second gate electrode;
a ninth insulating film in contact with a top surface of the second insulating film, a side surface of the third insulating film, a side surface of the fifth insulating film, a side surface of the eighth insulating film, and a top surface of the eighth insulating film; and
a via in contact with a top surface of one of the source electrode and the drain electrode through an opening penetrating the fifth insulating film, the eighth insulating film and the ninth insulating film,
wherein the second oxide semiconductor film is in contact with a side surface of the source electrode,
wherein the second insulating film has a lower hydrogen concentration than the first insulating film, and
wherein the third insulating film has a lower hydrogen concentration than the second insulating film.

9. The semiconductor device according to claim 8,
wherein the opening comprises the via, a first via-insulator in contact with the via, and a second via-insulator in contact with the first via-insulator,
wherein the first via-insulator comprises aluminum, and
wherein the second via-insulator comprises silicon.

* * * * *